(12) United States Patent
Takeyama et al.

(10) Patent No.: US 6,618,834 B2
(45) Date of Patent: Sep. 9, 2003

(54) CIRCUIT DESIGNING APPARATUS, CIRCUIT DESIGNING METHOD AND TIMING DISTRIBUTION APPARATUS

(75) Inventors: Hiroji Takeyama, Kawasaki (JP); Koichi Itaya, Kawasaki (JP); Miki Takagi, Kawasaki (JP); Takehiro Yamazaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/821,487

(22) Filed: Mar. 30, 2001

(65) Prior Publication Data

US 2002/0083398 A1 Jun. 27, 2002

(30) Foreign Application Priority Data

Nov. 9, 2000 (JP) .................................. 2000-342069

(51) Int. Cl.[7] .............................................. G06F 17/50
(52) U.S. Cl. .................................. 716/2; 716/7; 716/18
(58) Field of Search ......................................... 716/1–18

(56) References Cited

U.S. PATENT DOCUMENTS 5,933,619 A * 8/1999 Furuta et al. .................... 716/1
6,086,625 A * 7/2000 Shouen ............................ 716/1
6,226,780 B1 * 5/2001 Bahra et al. .................... 716/18

FOREIGN PATENT DOCUMENTS

| JP | 5-181929 | 7/1993 |
| JP | 9-212533 | 8/1997 |

* cited by examiner

Primary Examiner—Timothy P. Callahan
Assistant Examiner—Minh Nguyen
(74) Attorney, Agent, or Firm—Staas & Halsey LLP

(57) ABSTRACT

A circuit designing apparatus includes a circuit information database to store information regarding a circuit, an automatic designing processing section to read out the information regarding the circuit from the circuit information database and designing the circuit for each predetermined unit to be processed, and a design information database to store design information obtained by the automatic designing processing section and including peculiarizing information of circuit elements, change history information representative of a history of changes of the circuit and terminal load and driving capacity information of the circuit. The circuit designing apparatus allows a desired circuit to be automatically produced, regenerated or optimized.

25 Claims, 50 Drawing Sheets

PHYSICAL LAYOUT DIAGRAM
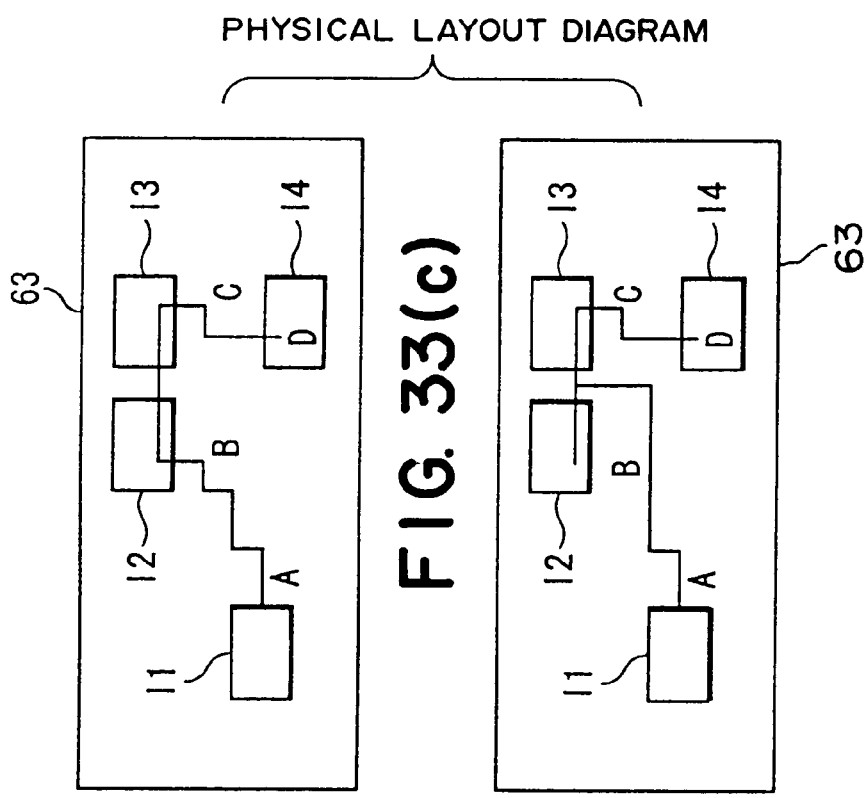
FIG. 33(b)
FIG. 33(c)
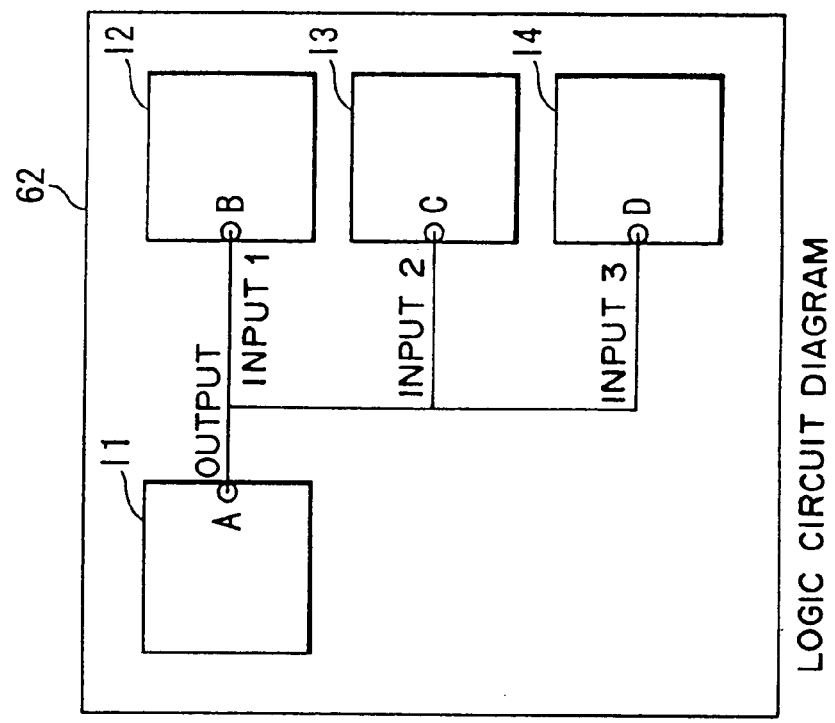
FIG. 33(a)
LOGIC CIRCUIT DIAGRAM PRIOR ART
FIG. 45(a)
CIRCUIT BEFORE PECULIARIZING
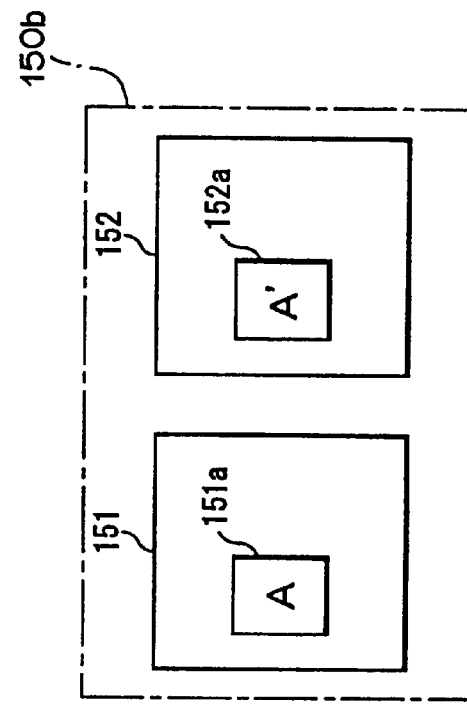
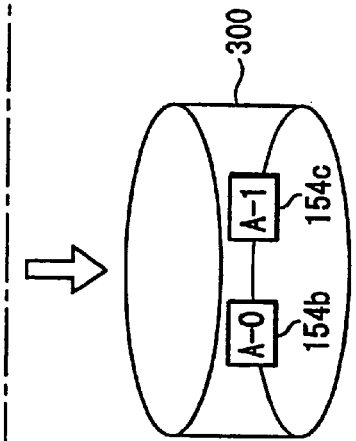
PRIOR ART
FIG. 45(b)
CIRCUIT AFTER PECULIARIZING
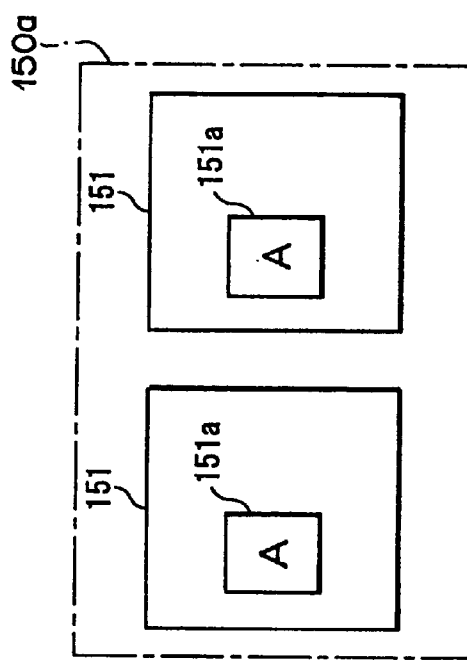
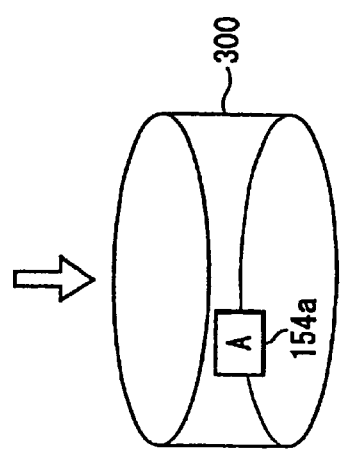

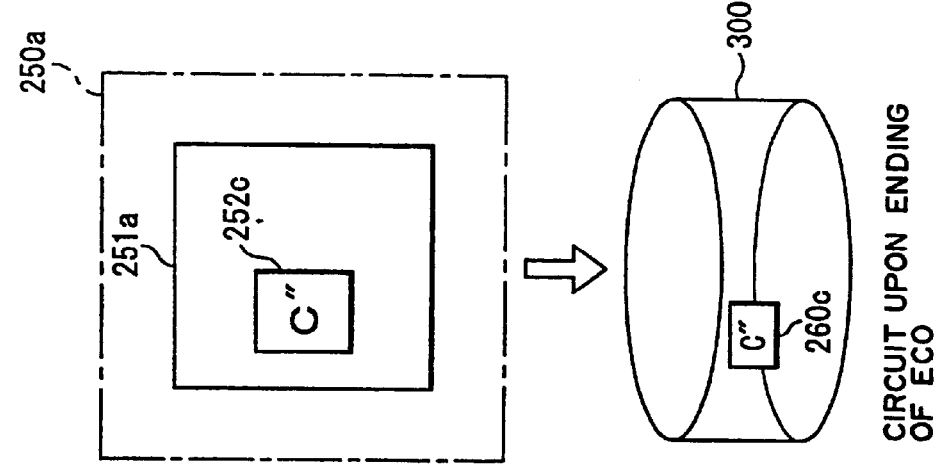
FIG. 46(c) PRIOR ART
FIG. 46(b) PRIOR ART
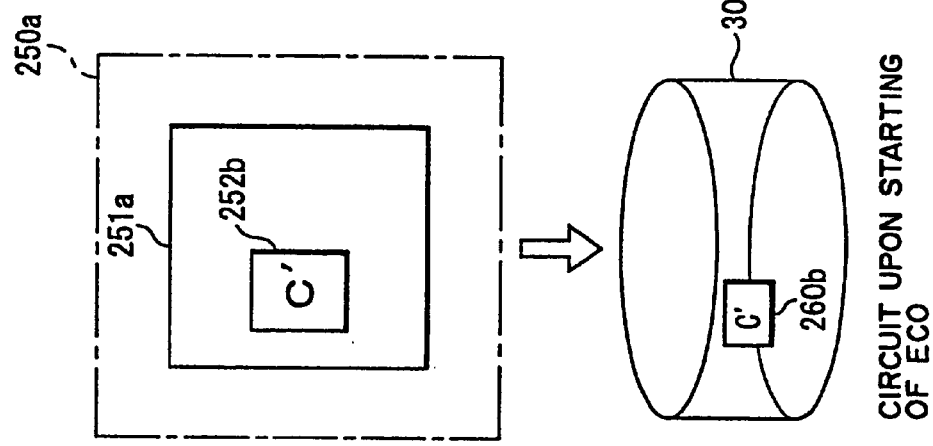
FIG. 46(a) PRIOR ART
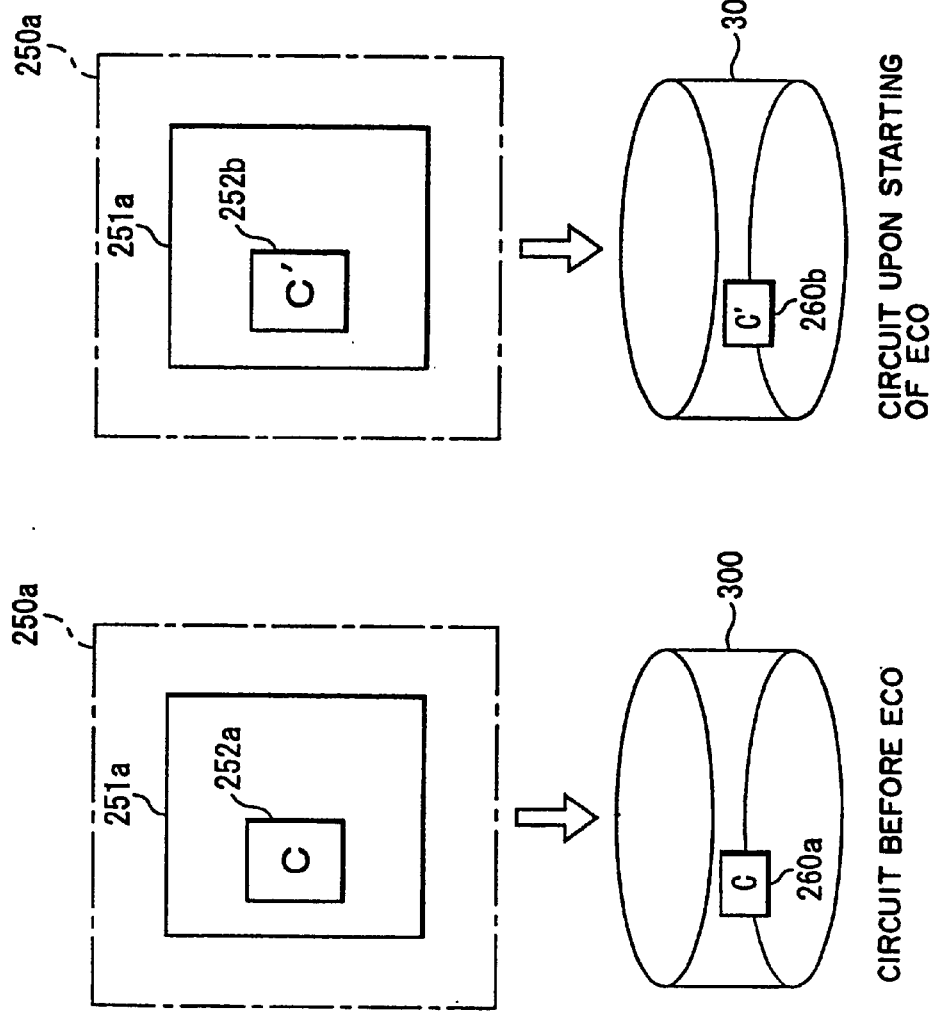

US 6,618,834 B2

CIRCUIT DESIGNING APPARATUS, CIRCUIT DESIGNING METHOD AND TIMING DISTRIBUTION APPARATUS

BACKGROUND OF THE INVENTION

1) Field of the Invention

This invention relates to a circuit designing apparatus, a circuit designing method and a timing distribution apparatus suitable for use for designing, for example, a large scale circuit.

2) Description of the Related Art

Generally, in order to design a circuit of a semiconductor chip (hereinafter referred to as semiconductor circuit) or an entire electronic apparatus such as a semiconductor device or a printed board or a component of an electronic apparatus or a subsystem (hereinafter referred to as system circuit), a designer (user) uses a technique called division design wherein the entire circuit is divided into two or more units and the individual units are designed independently of one another.

The unit signifies an element having a predetermined circuit function and is called circuit module or module. In the following description, in order to distinguish a unit before processed and a unit after processed, the unit before processed is referred to as unit to be processed or unit of a design object. Meanwhile, the unit after processed is referred to as processed unit.

A technique of designing a unit in a condition wherein it contains or includes another unit designed independently is called hierarchical design. The hierarchical design has a hierarchical characteristic in that the contained unit is hierarchically lower and the containing unit is hierarchically higher. Division circuit designed partially are finally aggregated into a single unit wherein the hierarchically highest layer is the entire circuit. In the following description, the term hierarchical design generally signifies division design.

FIG. 43 illustrates a concept of hierarchical design. Referring to FIG. 43, a semiconductor circuit (which may be hereinafter referred to as chip) 100 is a circuit of the hierarchically highest layer and contains a pair of circuit modules (a circuit module may be hereinafter referred to merely as module) 100x and 100y. The module 100x contains a pair of modules 101x and 102x, and the module 100y contains a pair of modules 101y and 102y. Further, the modules 101x and 101y contain modules 103x and 103y, respectively, and the modules 102x and 102y contain modules 104x and 104y, respectively. Thus, a designer can design the individual modules independently of one another, and this augments the design efficiency.

Since the circuit scale increases year by year, it is demanded for a circuit designing apparatus (which may be hereinafter referred to merely as designing apparatus) to have a capability of processing a greater amount of data.

On the other hand, to design an entire semiconductor circuit collectively without using hierarchical design is called collective design. The collective design is not applied to design of a circuit of a scale greater than a certain scale principally by reason of the hardware capacity of a designing apparatus, and the hierarchical design is used popularly.

In particular, a working memory is restricted in capacity and also in processing time. A designing apparatus uses a large working memory area for processing required due to change of a circuit and so forth. Processing for circuit change or the like is described with reference to FIGS. 44 to 46.

FIG. 44 is a block diagram of a semiconductor circuit designing apparatus. Referring to FIG. 44, the designing apparatus 500 shown is used to design a semiconductor circuit and includes an automatic design processing section 200 and a circuit information database 300. The circuit information database 300 stores information of circuit elements such as, for example, flip-flops and registers. The automatic design processing section 200 executes circuit designing and includes a hardware description language (HDL) conversion processing section 200a, a peculiarizing processing section 200b, a test circuit production processing section 200c, a load adjustment processing section 200d, and an HDL output processing section 200e.

The HDL conversion processing section 200a HDL-converts an HDL source code (which may be hereinafter referred to simply as source code) to obtain a unit to be processed and stores the unit into the circuit information database 300. The peculiarizing processing section 200b allocates a name of a different module produced as a result of circuit change by the designer so that it may not overlap with any other name and makes intrinsic.

The test circuit production processing section 200c produces a test circuit and produces information such as a hierarchical layer name, a name of an additional terminal or an additional gate, and a connection order between modules. The load adjustment processing section 200d adjusts the load to a module and produces information such as a hierarchical layer name, an input terminal load, and a driving capacity of an output terminal. The HDL output processing section 200e causes a result of the processes performed in this manner to be reflected on the source code.

Where a plurality of circuits having the same function are required in designing of a large scale circuit, a technique called plural reference is used. The plural reference is a technique wherein a module having a necessary function is designed as a unit to be processed and a higher hierarchical layer refers to the unit to be processed by a plurality of times. Consequently, the designer can omit repetitive arrangement of a module, can load information regarding the same module into a working memory and can prevent redundancy in repeated calculation. It is to be noted that, in contrast to the plural reference, a unit which is referred to only once is called a unit of single reference. Now, peculiarizing is described with reference to FIGS. 45(a) and 45(b).

FIGS. 45(a) and 45(b) are diagrammatic views illustrating a peculiarizing process. A chip 150a shown in FIG. 45(a) is a circuit before peculiarizing and includes two modules 151 each having a module 151a (represented by A). Information of the modules 151a is written as a data image 154a (represented by A) in the circuit information database 300.

Meanwhile, a chip 150b shown in FIG. 45(b) is a circuit after peculiarizing and includes a module 151 and another module 152. The module 152 is obtained by peculiarizing of the module 151 and has a module 152a (represented by A') duplicated from the contained module circuit. Information of the modules 151a and 152a is written as data images 154b (represented by A-0) and 154c (represented by A-1) in the circuit information database 300, respectively.

The chip 150a shown in FIG. 45(a) has a unit (for example, the module 151) plural-referred to within a certain period of a design step (which may be hereinafter referred to merely as step). The peculiarizing process signifies a process necessary for a designer to change a unit which is plural-referred to so that it may be placed into a state wherein it can be single-referred to as seen in FIG. 45(b) in the later process.

More particularly, the designer processes to duplicate a unit (module 151) by a number of times by which the unit has been referred to and change the names of the duplicates so as to change the module into units which are single-referred to. For example, in the example shown in FIG. 45(b), only one duplicate is produced. Upon such duplication, peculiar names A-0 and A-1 are allocated to the original module 151a and the duplicated module 152a, respectively, and consequently, the designer can distinguish the two modules from each other.

Further, in FIG. 44, the peculiarizing processing section 200b writes such changes in the individual steps into the circuit information database 300, thereby completing the peculiarizing process. Thereafter, the test circuit production processing section 200c and the load adjustment processing section 200d read out the contents changed by the peculiarizing process from the circuit information database 300, and produce a test circuit and adjust the load, respectively.

As a technique different from the hierarchical design and the collective design, ECO (Engineering Change Order) design is used frequently. The ECO design is a technique of changing only part of a unit to be processed while the other portion of the circuit remains not changed to re-design the unit. The hierarchical design can be applied to the ECO design.

The reason why the ECO design is used is that re-designing regarding only part of a semiconductor circuit decreases the processing time when compared with re-designing of the entire circuit.

FIGS. 46(a) to 46(c) are diagrammatic views illustrating the ECO design. A chip 250a shown in FIG. 46(a) is completed in design (which may be hereinafter referred to as ordinary design) once and is planned to be subject to the ECO design. A module 252a (represented by C) is a circuit element of a module 251a of the chip 250a. In other words, both of the module 251a and the module 252a have a test circuit and a clock circuit added thereto, and have been produced automatically by a designing apparatus. Further, the module 252a is written as a data image 260a (represented by C) in a circuit information database 300.

Meanwhile, the chip 250a shown in FIG. 46(b) is in a state before the ECO design is started. In the chip 250a shown in FIG. 46(b), the module 252a in the chip 250a shown in FIG. 46(a) has been changed without a test circuit added thereto. In other words, the module 252a is replaced by a module 252b (represented by C') changed from the module 252a, and an image of the module 252b is displayed. Further, the module 252b after changed is written as a data image 260b (represented by C') in the circuit information database 300.

Further, the chip 250a shown in FIG. 46(c) is in a state when the ECO design comes to an end. In the chip 250a, the module 252b is replaced by a module 252c (represented by C") obtained by changing the module 252b and adding a test circuit.

In this instance, the circuit of the module 252b includes a circuit same as the circuit of the module 252a before the addition of a test circuit and a circuit to which the change is added. When a test circuit is to be produced again for the module 252b, the designer designs so that the other portion than the changed portion may be the same as that of the circuit of the module 252a. Here, if the difference between the module 252a designed formerly and the module 252c designed using the ECO design is insignificant, then the designer may have to only design the portion to be changed also in layout design. Accordingly, the designer can shorten the time required for the design.

In the hierarchical design illustrated in FIGS. 44 to 46(c), the capacity of a database for a design scale in recent years is so great that it is difficult for a designing apparatus to load all data into a working memory. In order to prevent such shortage of the memory, when a designing apparatus for collective design is used, a designer produces circuit data as a black box in advance. Therefore, a complicated repetitive procedure is required.

Meanwhile, also where a designer uses a designing apparatus for division design, if the designing apparatus does not have a function of managing information regarding any portion which is not processed by the designing apparatus, the designer must correctly recognize any portion to be processed and must know information of any relating portion in addition to the portion to be processed. In addition, the designer must individually designate information other than information of the portion to be processed and must provide relating information to the designing apparatus for division design.

Here, if the design information is not referred to, then there is the possibility that, in the ECO design, a peculiar name different from the peculiar name in the ordinary design (refer to FIG. 8 which is hereinafter described) may be applied, and when peculiar names and design information are contrasted in a succeeding process, the name may be found to be incoincident.

Further, in conventional ECO design, a circuit is restored while an old circuit and a new circuit are compared with each other. Since the ECO design involves comparison between and differential analysis of circuits, complicated processing is required and this imposes a cumbersome operation upon the designer itself in designation of information and so forth.

Now, timing distribution in system design such as design of equipments as a system circuit or design of an apparatus is described with reference to FIGS. 47 to 49. In system design, timing distribution including PCB (Printed Circuit Board) design and LSI (Large Scale Integration) design is designed.

FIG. 47 is a schematic view illustrating timing distribution. Referring to FIG. 47, a pair of PCBs 140a and 140c are connected to the opposite ends of a PCB 140b through connector pins not shown. The PCBs 140a and 140c have LSIs 240 and 241 thereon, respectively. Here, the timing distribution signifies distribution of time required for transmission of a signal from the LSI 240 to the LSI 241, and the designer examines how long transmission time should be allocated between the PCBs 140a and 140c. The position at which an LSI is placed on a PCB is examined based on conditions called setup condition and hold condition. Here, the setup condition signifies a condition in which the propagation time of a signal remains within a predetermined time, and the hold condition is a condition for causing data and a clock for the data to coincide accurately with each other.

For example, if the LSI 240 on the PCB 140a is placed remotely from the LSI 241 on the PCB 140c, then the wiring line becomes long and causes signal delay. The signal delay is influenced for the worse by an excessively short wiring line as it comes far away from the hold condition. Accordingly, the delay time must be examined for both of a case wherein the LSI 240 and the LSI 241 are moved toward each other and another case wherein the LSI 240 and the LSI 241 are moved away from each other, and the specifications for distribution of the delay time are called timing specifications.

In FIG. 47, reference symbol a denotes a negative slack, and c denotes a positive slack. Thus, requesting information to request for distribution of a distribution value is transmitted from the negative slack a side to the positive slack c side.

In a conventional design flow for timing distribution, after an initial architecture of a system is examined, division of a PCB and an LSI is performed and timing specifications are set as constraint conditions. Then, designing and mounting (hereinafter referred to as implementing) of the inside of the LSI and so forth of a hierarchically lower layer are performed.

In the examination of such timing specifications, specifications called AC (Alternative Current) specification which prescribe a relationship between clocks and data are designed, and the inside of the LSI and so forth are implemented so as to satisfy the specifications. The result of the implementing, however, does not sometimes satisfy the timing specifications, and it is significant to discriminate limit values to the timing specifications.

FIG. 48 is a flow chart illustrating an outline of apparatus design. Referring to FIG. 48, apparatus specifications are examined first in step W1, and then architecture is designed in step W2. Then in step W3, circuit functions are allocated to PCBs or LSIs so that division design is performed.

If a PCB is selected in step W3, then PCB design is started in step W4. Thus, logic design, timing design, waveform analysis, mounting design and heat design are performed. Then, the PCB is implemented in step W5. On the other hand, if an LSI is selected in step W3, then LSI design is started in step W6. Thus, logical design, timing design, layout design, and power consumption analysis are performed. Then, the LSI is implemented in step W7.

FIG. 49 is a flow chart illustrating timing design. First, specifications of a system are determined in step W50, and then system architecture is examined in step W51, whereafter division of a PCB/LSI is examined in step W52.

In step W53, timing specifications of the PCB are examined, and the PCB is implemented in step W54. On the other hand, in step W55, timing specifications of the LSI are examined, and the LSI is implemented in step W56.

The steps of implementing the LSI and the PCB separately from each other use STA (Static Timing Analysis). The STA allows static timing verification without production of a simulation pattern.

It is to be noted that timing distribution is disclosed in the following known documents.

Japanese Patent Laid-Open (Kokai) HEI 5-181929 (hereinafter referred to as document 1) proposes a technique wherein, upon delay verification of hierarchical logic circuits, delay verification of a logic circuit of a higher hierarchical layer can be performed even if design or delay verification of another logic circuit of a lower hierarchical layer is not completed. The document 1 discloses a delay time verification system for hierarchical timing distribution of circuit blocks.

Japanese Patent Laid-Open (Kokai) HEI 9-212533 (hereinafter referred to as document 2) proposes a technique wherein, upon optimization of hierarchically designed hardware for each hierarchical layer, delay constraints to a critical path extending between different hierarchical layers are distributed appropriately for each hierarchical layer to optimize the delay efficiently. The document 2 discloses a method of optimizing distribution. It is to be noted that the critical portion signifies a portion which does not allow any delay and makes it impossible to allocate timings appropriately if delay occurs with the portion.

Delay distribution is performed efficiently using the techniques disclosed in the documents 1 and 2.

The conventional techniques, however, have a subject to be solved in that many items must be manually inputted by a designer, which results in a complicated designing procedure, an increased burden to the designer and a cause of occurrence of an error.

Besides, when a circuit whose design is completed once by a designer is to be changed, since the change adds or deletes an external terminal, incoincidence in terminal configuration sometimes occurs between higher and lower hierarchical layers. Accordingly, the conventional designing techniques have another subject to be solved in that, if such terminal configurations do not coincide with each other, mismatching occurs between the higher and lower hierarchical layers and is recognized as an error, which deteriorates the designing efficiency significantly.

Further, for timing distribution, the designer makes a trial many times with the value changed in architecture design examination. Accordingly, the designer cannot definitely know detailed timings until settled values of the object PCB or LSI are mapped from a library to the object circuit. Further, the designer allocates a predetermined delay value to the PCB or LSI once and examines the other necessary items.

Therefore, the conventional techniques have a further subject to be solved in that, in a step in which the designer cannot directly observe a circuit element such as a flip-flop, timing distribution of the entire system includes many unsettled portions and the timings of the entire system cannot be determined and therefore a change of a timing cannot be flexibly coped with.

In addition, circuit blocks each composed of LSIs, PCBs and so forth are not closely associated with each other. Further, in order to calculate an estimate of a latency (time necessary for processing) value or a delay value of a circuit block having a circuit element, the designer must actually perform implementing design. In contrast, in a critical portion (portion which does not allow delay), the association between architecture determination and an actual implementing step is weak. Therefore, the conventional techniques have a still further subject to be solved in that it is difficult to particularly examine an architecture and take over a floor plan between physical layers (for example, a floor plan from a PCB to an LSI) to another circuit block.

Further, deep sub-micron LSI design has proceeded, and the ratio at which the wiring line occupies has become more significant than the gate delay. Thus, the influence of the wiring line delay, particularly the delay at a global wiring line, is increasing.

Further, as a technique for laying a wiring line between pins arranged, a technique based on the Manhattan length is available, and a wiring line length is calculated simply and at a high speed using the technique. FIG. 50 is a diagrammatic view illustrating the Manhattan length. Referring to FIG. 50, a circuit module 170 shown includes a pair of circuit modules 151 and 150 which are connected to each other by a pair of paths L1 and L2. The two paths L1 and L2 correspond each to the Manhattan length and represent a right angle distance between the two points.

However, the techniques described are poor in accuracy at a place where wiring lines are located densely, and are low in processing speed in actual wiring. Particularly, such situations as described in (1-1) to (1-13) below occur.

(1-1) When the designer implements based on determined specifications, it is difficult for the designer to discriminate whether or not the specifications or the floor plan are good, and if timings distributed in accordance with the specifications suffer from some offset, then the design becomes impossible or a redundant circuit or circuits for adjusting the timings are required.

(1-2) Where a plurality of designers parallelly perform distributed design based on specifications of a design object, it is difficult for each designer to grasp, upon designing by itself, timing distribution of a higher layer or a lower layer, and consequently, timing distribution and verification of the entire system formed from PCBs or LSIs is difficult.

(1-3) When the designer implements, if the timing specifications are not satisfied, then the designer must negotiate for change of the specifications with another designer who is influenced by the change, and if the specifications cannot be changed, the higher architecture must be changed, which increases the design period significantly.

(1-4) Tolerances of used parts or circuit blocks defined in the timing library are different from each other. Accordingly, where a plurality of parts are designed in combination, a part of lower accuracy has an influence on a location at which another part of higher accuracy is used, and the designer cannot grasp the timing at the location accurately.

(1-5) Since the wiring line using the Manhattan length does not take an oblique wiring line on a PCB, a significant difference from a delay of an actual wiring line appears.

(1-6) Where wiring lines are located densely, a great error occurs between a wiring line delay value calculated based on the Manhattan length and a delay value of an actual wiring line, and a timing error is likely to occur.

(1-7) A logic designer cannot know it until a layout result comes out in what distance relationship wiring lines are located from transmission side pins to reception side pins in a netlist represented by a circuit diagram or a source code.

(1-8) Upon division examination of an LSI and a PCB, when it is examined whether a signal should be transmitted using a wiring line on the PCB or a module should be arranged in the inside of the LSI, a large number of man-hours are required for discrimination with the technology changed over between the PCB technology and the LSI technology. Further, upon designing through taking over from a floor plan of a PCB to a floor plan of an LSI, the designer must use a floor plan tool for exclusive use for an LSI to input the floor plan again, which requires a large number of man-hours.

(1-9) Upon examination of specifications, it is difficult for the designer to discriminate whether provisional wiring is used or actual wiring is used as wiring for each network.

(1-10) It is difficult to grasp the number of necessary wiring layers.

(1-11) Since an increased number of pins are required for an LSI, a great number of man-hours are required for distribution of timings for individual pins.

(1-12) In a design step of a PCB architecture, the designer cannot perform waveform analysis before completion of an LSI.

(1-13) In an architecture design step, the designer cannot examine whether or not a signal between blocks can be transmitted in one clock due to an influence of wiring line delay.

Further, although the advancing direction of the flow chart shown in FIG. 49 is one direction, the design step needs to be changed flexibly also from the fact that timing distribution is determined in an architecture design step.

SUMMARY OF THE INVENTION

It is an object of the present invention to provide a circuit designing apparatus wherein, in hierarchical design and ECO design for processing of a large scale circuit, information of units to be processed, terminal information, and change information of changes performed by the designing apparatus are stored and used to associate the units to be processed with each other to automatically produce, regenerate or optimize a desired circuit.

It is another object of the present invention to provide a circuit designing method and a timing distribution apparatus wherein, in timing distribution of LSIs or PCBs upon design of a system circuit, iterations in a downstream step are decreased to allow reduction of the designing period and augmentation in quality through timing distribution and timing verification performed with a floor plan taken into consideration in an upstream step and, when a circuit is changed by a designer, another designer can refer to contents of the change.

In order to attain the objects described above, according to an aspect of the present invention, there is provided a circuit designing apparatus, comprising a circuit information database for storing information regarding a circuit, a designing processing section for reading out the information regarding the circuit from the circuit information database and designing the circuit for each predetermined unit to be processed, and a design information database for storing design information, obtained by the designing processing section, including at least peculiarizing information of circuit elements, change history information representative of a history of changes of the circuit and terminal load and driving capacity information of the circuit.

With the circuit designing apparatus, the used amount of a working memory is optimized and the burden to a designer upon hierarchical design or ECO design can be reduced to a level equal to that upon collective design. Further, continuous processing by full automation can be achieved, and consequently, reduction in processing time and hence in design period can be achieved.

The designing processing section may include a peculiarizing processing section for reading out the peculiarizing information from the design information database and applying different names with each other to the individual units to be processed, a test circuit production processing section for reading out the change history information from the design information database and producing a test circuit of a higher hierarchical layer, and a load adjustment processing section for reading out the terminal load and driving capacity information from the design information database, applying the design information to terminals included in a circuit of the higher hierarchical layer and adjusting the load based on the design information.

The circuit designing apparatus is advantageous in that design information such as boundary information of hierarchical layers and terminal information is inputted automatically, and a processing object portion in the current processing is automatically discriminated from the processing history. The circuit designing apparatus is advantageous also in that design information included in a portion other than the processing object can be extracted automatically and utilized for the processing of the portion being currently designed.

According to another aspect of the present invention, there is provided a circuit designing method, comprising a processing production step of producing, by means of a designing processing section for reading out information regarding a circuit from a circuit information database which stores information regarding the circuit and designing the circuit for each predetermined unit to be processed, first unit information which relates to a processing result of a first unit obtained by processing the first unit, a design information collection step of collecting design information including at least peculiarizing information of circuit elements, the design information being produced in the processing production step, change history information representative of a history of changes of the circuit and terminal load and driving capacity information of the circuit, a design information writing step of writing the design information collected in the design information collection step for each unit to be processed into a design information database connected to the design processing section for storing the design information, a reference step of referring to the design information regarding the first unit in order to process a second unit based on the design information written in the design information writing step, a recognition step of recognizing a reference relationship regarding the design information relating to the first unit referred to in the reference step, a circuit information database reference step of referring to unit information regarding a position and a result of the processing stored in the circuit information database based on the reference relationship obtained in the reference step, and a circuit information database writing step of updating the circuit data obtained after a design processing.

With the circuit designing method, reading out of information regarding a lower hierarchical layer from the circuit information database is unnecessary. Therefore, the capacity of the working memory and so forth can be saved significantly.

According to a further aspect of the present invention, there is provided a timing distribution apparatus for use for hierarchical design, comprising plurality of timing distribution production sections individually provided corresponding to a plurality of design hierarchical layers for receiving block information regarding a function of a circuit from a plurality of timing information databases having netlist information regarding a wiring line scheme and outputting timing distribution values obtained by distributing a delay value produced by a delay element of the circuit, and an inter-hierarchical layer association manager for dynamically changing connections between the plurality of timing distribution production sections and transmitting and receiving modification information regarding the timing distribution values to and from the plurality of timing distribution production sections.

With the timing distribution apparatus, when the timing specifications are changed, a range of the influence of the change can be referred to immediately, and consequently, a reference mistake upon such change of the specifications is eliminated. Further, the combination of provisional wiring and actual wiring can achieve both of augmentation of an execution speed of floor planning and augmentation of an accuracy. Furthermore, a hierarchical entity can be used and a distributed design environment can be constructed. Further, in top-down design, only a necessary portion can be particularized, and it can be examined whether or not timing specifications divided by trial and examination by one design team. Consequently, problems upon implementing can be estimated and otherwise possible iterations can be reduced.

The circuit designing apparatus may be constructed such that the timing distribution production sections is formed as agents individually provided corresponding to the plurality of design hierarchical layers and having a hierarchical layer entity having design information and program data for processing the design information, and the inter-hierarchical layer association manager is formed as a manager connected to the timing distribution production sections as the agents for transmitting and receiving information regarding the timing distribution values individually to and from the plurality of design hierarchical layers.

With the timing distribution apparatus, when a timing-driven layout process which uses logic design and physical layout in combination is performed with an object-oriented hierarchical entity, timings between logic layers and a physical layer can be determined definitely and can be associated with each other readily.

In the timing distribution apparatus, the plurality of design hierarchical layers can communicate with each other through the inter-hierarchical layer association manager.

Any one of the peculiarizing processing section, test circuit production processing section and load adjustment processing section may perform hierarchical design wherein the circuit is designed in a state wherein one of the units to be processed hierarchically contains another unit designed independently. This makes it possible to design a large scale circuit for each part.

The peculiarizing processing section may includes a peculiar name application rule setting section and a peculiar name production section. With the circuit designing apparatus, a new name is produced based on an original peculiar name before a circuit change by a designer and a set value set by the designer, and even if a plurality of new names are produced by reference to the peculiar name by a plural number of times, the names can be discriminated definitely from one another and the designer can group the names readily and particularly for each unit to be processed. Further, otherwise possible overlapping between the names of units processed and the name of a unit being currently processed.

The circuit designing apparatus may be constructed such that the peculiarizing processing section further includes a plural-reference analysis section for searching for a location at which a plurality of same circuit units are used and discriminating a hierarchical layer, a cell and a black box regarding a type of the circuit units at the location, and the peculiar name production section produces a peculiar name for each of the plural-reference units and single-reference units discriminated by the plural-reference analysis section. The peculiarizing processing section may further include a circuit data duplication section for allocating peculiar names produced by the peculiar name production section to the plural-reference units and the single-reference units to duplicate the circuit data. With the circuit designing apparatus, the peculiarizing processing can be performed efficiently, and fine design can be achieved.

Any of the peculiarizing processing section, test circuit production processing section and load adjustment processing section may include a processing object discrimination section for discriminating, when the higher hierarchical layer is to be processed, whether or not the unit to be processed is an object of processing based on the design information written in the design information database, and a processing data acquisition section for acquiring circuit data of the unit to be processed from the circuit information database based on a discrimination by the processing object discrimination section of whether or not the unit to be processed is an object processed. This makes it possible to save the working memory.

Any of the peculiarizing processing section, test circuit production processing section and load adjustment processing section may include a processing object discrimination section for discriminating based on the design information written in the design information database whether or not the unit to be processed is an object of the processing. This makes it possible to easily obtain information regarding a portion to be processed.

The processing object discrimination section may discriminate, based on first unit information which relates to a processing result of a first unit obtained by processing the first unit of the design information, whether or not a unit included in a second unit to be processed next has been processed already. This makes it possible to readily discriminate a location of an object to be processed.

The test circuit production processing section may include a hierarchical layer matching restoration section for eliminating terminal mismatching between a terminal added for receiving a test signal input in a lower hierarchical layer and a terminal in a layer referred to by a higher hierarchical layer. With the circuit designing apparatus, the operability of the designer in ECO design is augmented significantly.

Any of the peculiarizing processing section, test circuit production processing section and load adjustment processing section may perform engineering change order (ECO) design. This makes it possible to use the same operation procedure repetitively in design of a circuit.

The circuit designing apparatus may be constructed such that any of the peculiarizing processing section, test circuit production processing section and load adjustment processing section includes a design information read-in section for reading in normal design information produced upon normal design, and a processing object discrimination section for discriminating circuit data to be processed using the normal design information and engineering change order design object unit information given in the form of a parameter, and designs a circuit which is common to a circuit designed normally using the normal design information except a changed portion. With the circuit designing apparatus, continuous processing by full automation can be achieved, and consequently, reduction in processing time and hence in design period can be achieved.

The peculiarizing processing section may include a processing object discrimination section for discriminating based on the design information written in the design information database whether or not the unit to be processed is an object of processing, and a peculiar name production section for producing, when the processing object discrimination section discriminates that the unit to be processed is an object of processing, a peculiar name so as to establish a reference relationship same as the reference relationship stored in the design information database, but producing, when the processing object discrimination section discriminates that the unit to be processed is not an object of processing, a peculiar name different from the peculiar names allocated already. With the circuit designing apparatus, when the upper hierarchical layer refers to the design information, the unit to be processed can be duplicated by a number of times equal to the number of times of such reference, and a peculiar name which does not overlap with any other peculiar name can be applied to each of the units to be processed after the addition.

The test circuit production processing section may include a circuit analysis section for using the normal design information produced upon normal design with regard to an engineering change order design object unit and the test circuit rule, based on the design information database, to extract identification data for identification of a portion with regard to which a test circuit (same as that upon the normal design) can be produced and another portion with regard to which a new test circuit should be produced. This optimizes the used amount of the working memory.

The hierarchical layer matching restoration section may use the normal design information regarding normal design and the terminal information of the engineering chain order design object unit and the higher hierarchical layer from within the design information to restore the hierarchical layer matching. This makes it possible to design a large scale circuit for each part.

The test circuit production processing section may further include a test circuit production section for producing a test circuit which is the same in regard to a portion of the engineering change order design object unit with regard to which a test circuit same as that upon the normal design can be produced based on the identification data extracted by the circuit analysis section, but producing a test circuit conforming to the test circuit rule with regard to another portion of the engineering change order design object unit with regard to which a new test circuit should be produced. This significantly augments the design efficiency in ECO design.

The design information read-in section may make the hierarchical layer names before the peculiarizing and the hierarchical layer names after the peculiarizing correspond to each other so as to allow the circuit data after the peculiarizing to be referred to with the hierarchical layer names before the peculiarizing. With the circuit designing apparatus, information of whether or not peculiarizing processing has been performed and hierarchical layer names before and after such peculiarizing processing are obtained.

The load adjustment processing section may include a load analysis section for analyzing a terminal capacity which can be driven by a logic element to extract an undrivable terminal or terminals, and a circuit adjustment section for adjusting the driving capacity of the undrivable terminal or terminals extracted by the load analysis section. This makes it possible to adjust each terminal of the circuit so as to have an appropriate capacity.

The circuit information database may include a circuit information writing section for writing circuit information for each processed unit into the circuit information database in at least one of hierarchical design and engineering change order design, and a reference section connected to the circuit information writing section for referring to the circuit information written for each unit to be processed. This augments the design efficiency.

The design information database may include a plurality of storage sections for individually storing the circuit elements into individual files. With the circuit designing apparatus, the design information is reflected on circuit design, and the working efficiency in terms of the design period and so forth is augmented.

According to a still further aspect of the present invention, there is provided a circuit designing method, comprising a first processing step of processing a fourth unit which contains a third unit by means of a designing processing section for reading out information regarding a circuit from a circuit information database which stores information regarding the circuit and designing the circuit for each predetermined unit to be processed, a third unit information collection step of collecting third unit information regarding a processing result of the third unit being produced in the first processing step, a design information writing step of writing the third unit information collected in the third unit information collection step into a design information database connected to the design processing section for storing the design information, and a discrimination step of discriminating, based on the third unit information written in the design information writing step, whether or not a third processed unit obtained by changing the third unit contains a fourth processed unit obtained by changing the fourth unit and discriminating whether or not the third processed unit is equivalent to the third unit.

With the circuit designing method, continuous processing by full automation can be achieved, and consequently, reduction in processing time and hence in design period can be achieved. Further, hierarchical design can be realized readily, and besides, hierarchical design of a large scale circuit can be performed very efficiently.

According to a yet further aspect of the present invention, there is provided a computer-readable recording medium on which a program is recorded, the program causing a computer to function so as to read out information regarding a circuit from a circuit information database in which the information regarding the circuit is stored and design the circuit for each predetermined unit to be processed and then store design information obtained by the design and including at least peculiarizing information of a circuit element, change history information representative of a history of changes of the circuit and terminal load and driving capacity information of the circuit. With the program of the recording medium, an environment in which a large scale circuit is designed can be constructed simply and conveniently.

According to a yet further aspect of the present invention, there is provided a computer-readable recording medium on which a program is recorded, the program causing a computer to function so as to execute a processing production step of producing, by means of a designing processing section, first unit information which relates to a processing result of a first unit obtained by processing the first unit, a design information collection step of collecting design information including at least peculiarizing information of circuit elements being produced in the processing production step, change history information representative of a history of changes of the circuit and terminal load and driving capacity information of the circuit, a design information writing step of writing the design information collected in the design information collection step for each unit to be processed into a design information database connected to the design processing section for storing the design information, a reference step of referring to the design information regarding the first unit in order to process a second unit based on the design information written in the design information writing step, a recognition step of recognizing a reference relationship regarding the design information relating to the first unit referred to by the reference step, a circuit information database reference step of referring to unit information regarding a position and a result of the processing stored in the circuit information database based on the reference relationship obtained in the reference step, and a circuit information database writing step of updating the circuit data obtained in the design processing. With the program of the recording medium, for example, when the first unit is contained in the second unit, it is automatically recognized whether or not the first unit has been processed already.

According to a yet further aspect of the present invention, there is provided a computer-readable recording medium on which a program is recorded, the program causing a computer to function so as to execute a first processing step of reading out information regarding a circuit from a circuit information database which stores information regarding the circuit and processing a fourth unit which contains a third unit by means of a designing processing section for designing the circuit for each predetermined unit to be processed, a third unit information collection step of collecting third unit information regarding a processing result of the third unit being produced in the first processing step, a design information writing step of writing the third unit information collected in the third unit information collection step into a design information database connected to the design processing section for storing the design information, and a discrimination step of discriminating, based on the third unit information written in the design information writing step, whether or not a third processed unit obtained by changing the third unit contains a fourth processed unit obtained by changing the fourth unit and discriminating whether or not the third processed unit is equivalent to the third unit. With the program of the recording medium, continuous processing by full automation can be achieved, and consequently, reduction in processing time and hence in design period can be achieved.

Each of the timing distribution production sections may include a logic/constraint information storage section for storing delay element information, a floor planning section connected to the logic/constraint information storage section for distributing timings based on a floor plan to perform provisional wiring line, a timing information storage section for storing the netlist information, and a distribution manager for outputting the delay value based on the netlist information. This makes flexible design change possible.

The floor planning section may include an arrangement processing section for presenting a portion with regard to which a distribution value as attribute information can be improved and modified based on a slack from the constraint information and storing arrangement information originating from the delay element information, an actual wiring and provisional wiring execution section for performing association with actual wiring and provisional wiring, and outputting wiring information, a wiring information storage section for storing the wiring information, a physical technology information storage section for storing physical technology information including delay values per unit length corresponding to wiring line layers and load capacities per unit length, and a conversion section for converting the wiring information into a delay value based on the delay length and the load capacity and outputting the delay value. With the timing distribution apparatus, a delay value can be calculated readily from a wiring line length.

The actual wiring and provisional wiring execution section may perform wiring using both of actual wiring which requires long calculation time and provisional wiring which requires short calculation time and extract the timing distribution values. With the timing distribution apparatus, the designer can examine timing specifications through provisional wiring and perform actual wiring with the timing distribution changed based on a result of the examination.

The actual wiring and provisional wiring execution section may include a Manhattan length provisional wiring section for performing Manhattan length provisional wiring for both of a PCB and an LSI, an oblique Manhattan length provisional wiring section for performing provisional wiring using oblique wiring wherein a wiring line is located obliquely, and an actual wiring association section for performing wiring for the printed circuit board and the large scale integrated circuit. This augments the efficiency of the wiring operation.

The actual wiring and provisional wiring execution section may perform the provisional wiring based on the Manhattan length provisional wiring, the oblique Manhattan length provisional wiring and the actual wiring. This augments the accuracy also where the wiring line congestion degree is high.

The actual wiring and provisional wiring execution section may read out the delay values and the load capacities of a selected hierarchical layer from the physical technology information storage section, vary the delay time per unit wiring line length and distribute the delay time. This augments the efficiency of the wiring.

The actual wiring and provisional wiring execution section may perform actual wiring based on a margin calculated with regard to the timing distribution value obtained by the provisional wiring and a wiring line congestion degree representative of the density of the wiring lines. With the timing distribution apparatus, since provisional wiring or actual wiring is switchably used automatically in response to the wiring line congestion degree, the trade-off can be utilized effectively, and the time and labor of the designer can be reduced.

The actual wiring and provisional wiring execution section may output information for analysis regarding information which is insufficient in the actual wiring so as to allow cooperation with another designing apparatus which uses another computer which can perform only the actual wiring. With the timing distribution apparatus, information which is insufficient upon actual wiring is conveyed to the designer, and the designer can produce information necessary for analysis based on the information and transmit the information to a layout CAD apparatus for exclusive use for actual wiring so that the layout CAD apparatus may perform actual wiring.

The actual wiring and provisional wiring execution section may perform the provisional wiring and the actual wiring based on a region in which wiring is inhibited and the wiring line congestion degree. With the timing distribution apparatus, provisional wiring lines and detailed actual wiring lines which rely upon circuit blocks of an object of design can be located in a mixed state, and distribution values of timings can be extracted.

The actual wiring and provisional wiring execution section may discriminate based on a clock frequency used as a constraint condition whether or not arrival within time within which arrival is essentially required is possible and issue, if the arrival is impossible, an instruction to insert at least one of a buffer and a flip-flop into the netlist information between a plurality of circuit blocks. With the timing distribution apparatus, since a buffer or the like is inserted only when arrival at a virtual pin is impossible, the constraint condition can be satisfied efficiently.

The actual wiring and provisional wiring execution section may arrange terminals included in circuit blocks based on the constraint information. This makes arrangement simple and easy.

The inter-hierarchical layer association manager may extract a circuit block whose timing information data is insufficient and inputs the extracted circuit block to the timing information database, and notify a designer of the circuit block whose timing information data is insufficient. This augments the design efficiency of the designer.

The timing distribution apparatus may be constructed such that the floor planning section can change a wiring line width in a circuit block while the actual wiring or the provisional wiring is proceeding. This makes designing of a circuit flexible.

The timing distribution apparatus may be constructed such that the inter-hierarchical layer association manager can change the combination of the plurality of distribution managers. With the timing distribution apparatus, the combination of distribution manages can be changed freely and dynamically in response to a design object.

Each of the timing distribution production sections may further include a waveform analysis information production section for producing information for waveform analysis of a PCB from I/O buffer information of a hierarchical layer of an LSI. This makes it possible to analyze a waveform simply and readily.

Each of the timing distribution production sections may output the timing distribution value based on another timing specification set in advance and the timing distributed by the floor planning section. This makes it possible for the designer to refer to a distribution report on which the distribution value is described.

The timing distribution apparatus may be constructed such that the floor planning section can change a scale or a shape of the circuit blocks while the actual wiring or the provisional wiring is proceeding. This makes flexible arrangement design possible.

Each of the timing distribution production sections may read in timing distribution values back annotated from logical design or layout examination using the source code. This makes it possible for the designer to perform a simulation readily.

Each of the timing distribution production sections may further include an annotator for writing information arising from the timing distribution values into the source code. This makes the user interface between the designer and the circuit designing apparatus closer.

The annotator may write netlist information regarding a wiring scheme into the source code. With the timing distribution apparatus, a distributed value is back annotated into the source code, and a delay value is automatically set or changed.

The physical technology information storage section may store the wiring line length and the delay value per unit length and load capacity per unit length in a mutually associated relationship. With the timing distribution apparatus, a delay value is calculated from a wiring line length.

The inter-hierarchical layer association manager may receive a timing distribution specification changing request transmitted from one of the plurality of timing information databases, extract any of the other timing information databases on which the timing distribution specification change may possibly have an influence, and inquire the pertaining timing information database for whether or not change of the timing distribution values is permissible. With the timing distribution apparatus, a change of timing specifications can be conveyed readily.

The inter-hierarchical layer association manager may output, when a response representing that change of the timing distribution values is permissible is received from the pertaining timing information database, to the one timing information database a notification that change of the timing distribution values is permissible. Also this allows the timing specifications to be changed rapidly.

The inter-hierarchical layer association manager may update, when the timing distribution values are changed, a higher hierarchical layer entity than the hierarchical layer in which the timing distribution values are changed. Also this allows the timing specifications to be changed rapidly.

The distribution manager may includes a distribution editor connected to the logic/constraint information storage section for distributing timings, a database reference registration section connected to the distribution editor, the logic/constraint information storage section and the timing information storage section for outputting the netlist information, a self hierarchical layer TDB outputting and other hierarchical layer TDB reflection section for inputting and outputting timing distribution information of a hierarchical layer to which the distribution manager belongs and timing distribution information of the other hierarchical layer or layers, and an arbitration control section for performing arbitration. With the timing distribution apparatus, a distribution value is reflected efficiently.

The distribution manager calculates a skew based on one or those of wiring line paths of netlist information regarding a wiring scheme which are other than a common wiring line path or paths. With the timing distribution apparatus, calculation with a dispersion of a common portion removed can be performed automatically.

The distribution manager may apply a name representative of a wiring line scheme as a sub signal name to each of the wiring line paths. This eliminates the necessity for re-layout and allows the designer to know the number of wiring line layers, and besides decreases the man-hour for distribution.

The distribution manager may apply a sub signal name in an associated relationship with a fan-out number. With the timing distribution apparatus, since an attribute is provided to each of pins and wiring lines, the man-hour decreases as well.

The distribution manager may display a gradation of a wired portion corresponding to the value of the constraint information in color on an operation screen. This makes it possible to eliminate a dispersion of a common portion.

The distribution manager may display the timing distribution values and a range in value within which the timing can be distributed on a figure which shows the circuit blocks. With the timing distribution apparatus, the designer can design a circuit of a high degree of reliability.

According to a yet further aspect of the present invention, there is provided a computer-readable recording medium on which a program is recorded, the program causing a computer to function as a plurality of timing distribution production sections and an inter-hierarchical layer association manager. Thus, for example, boundary information of terminals and design information of the terminals and so forth are automatically inputted, and a portion other than a processing object in current processing is automatically discriminated from history information. Further, design information of the portion other than the processing object is automatically extracted and used for processing of a portion being currently designed. Further, since a wiring scheme for a critical portion can be designated before layout, wiring having a high degree of reliability after actual layout can be achieved. Since an existing PCB layout CAD apparatus or an existing LSI layout CAD apparatus can be used for detailed examination and implementing can be performed immediately, design can be proceeded without changing an existing design flow. In addition, since waveform analysis of a PCB can be performed based on information for waveform analysis before completion of an LSI, parallel designing of the LSI and the PCB is facilitated.

Further, since re-utilization of floor plan information which does not rely upon the technology can be achieved, existing layout resources can be utilized efficiently. Further, timing design for a combination of a PCB and an LSI which are components of a high speed system which is considered to become significant more and more in the future can be anticipated. Further, in architecture design, a portion which is critical and has significant timing specifications upon implementing can be grasped in advance through distributed examination, which allows significant reduction of the period of development and high reliability design.

The above and other objects, features and advantages of the present invention will become apparent from the following description and the appended claims, taken in conjunction with the accompanying drawings in which like parts or elements denoted by like reference symbols.

BRIEF DESCRIPTION OF THE DRAWINGS

FIGS. 33($a$) to 33($c$) are diagrammatic views illustrating netlist representations according to the second embodiment of the present invention;

FIGS. 45($a$) and 45($b$) are diagrammatic views illustrating a peculiarizing process;

FIGS. 46($a$) to 46($c$) are diagrammatic views illustrating ECO design;

DESCRIPTION OF THE PREFERRED EMBODIMENTS

A. First Embodiment of the Invention

Figure 1:
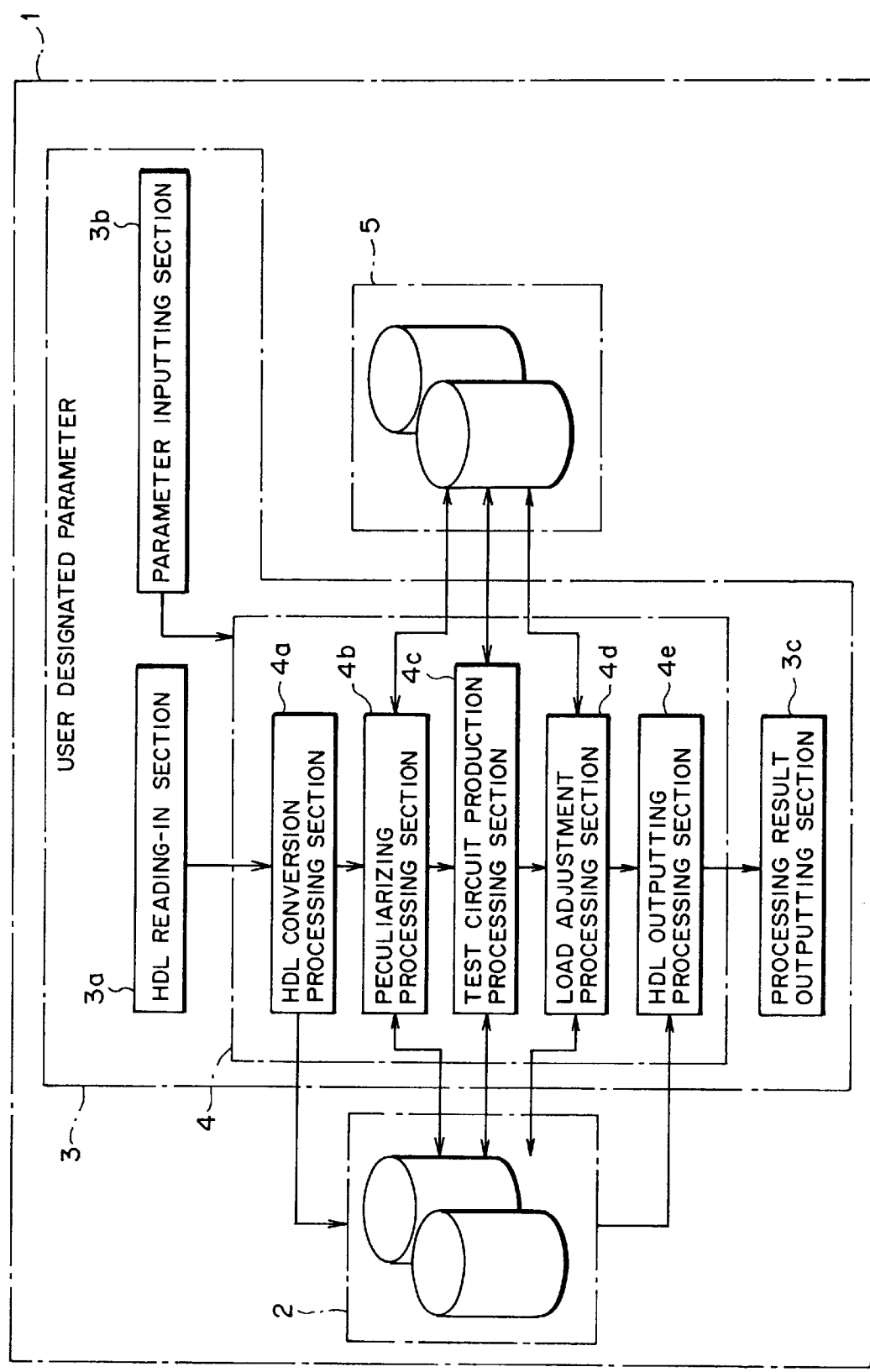
FIG. 1 is a block diagram of a circuit designing apparatus according to a first embodiment of the present invention.

FIG. 1 is a block diagram showing a circuit designing apparatus according to a first embodiment of the present invention. Referring to FIG. 1, the circuit designing apparatus 1 (which may be hereinafter referred to merely as designing apparatus 1) shown is used to design a semiconductor circuit and includes a circuit information database 2, an automatic designing processing section 3, and a design information database 5.

The circuit information database 2 stores information regarding a circuit. The automatic designing processing section 3 reads out information regarding the circuit from the circuit information database 2 and processes the circuit for each predetermined unit to be processed. The design information database 5 stores peculiarizing information (making intrinsic information) of circuit elements obtained by the automatic designing processing section 3, change history information representative of a history of changes of the circuit and terminal load and driving capacity information of the circuit.

The automatic designing processing section 3 reads out the information regarding the circuit from the automatic designing processing section 3, processes the circuit for each unit to be processed and writes resulting design information and so forth into the design information database 5. Further, the automatic designing processing section 3 reads out desired design information from the design information database 5 in accordance with contents of a process.

The circuit information database 2 stores circuit information for each unit (processed unit) processed in hierarchical design or ECO design so that another circuit module can refer to the circuit information for each unit to be processed.

Further, a source code described in a hardware describing language is written in the circuit information database 2 in such a classified form that they can be processed readily by a computer program. The hierarchical layer which corresponds, for example, to the Entity of the VHDL source code or a module of the Verilog HDL source code has various kinds of information. In particular, each hierarchical layer has a hierarchical layer name, a hierarchical layer terminal, a netlist, logic gates contained therein, component information of a lower hierarchical layer and so forth, names and connection information of such components and so forth.

The design information database 5 stores changes applied to the circuit and influences of the changes on the other hierarchical layers as information. Further, the design information database 5 stores a program for producing a test circuit and a program for optimizing a circuit, and a circuit is produced and updated by the program. The design information database 5 includes a plurality of storage sections (not shown) capable of storing circuit components into individual files. Accordingly, design information is reflected on circuit design, and this augments the working efficient in terms of the design period and so forth.

Further, the design information database 5 stores information specified in the following paragraphs (2-1) to (2-4) in a classified form.

(2-1) Peculiarizing Information (Making Intrinsic Information)

An instance name, a name before peculiarizing, a name after peculiarizing and a name of a unit of an object of the peculiarizing process. The instance name is a peculiar name which a cell included in the inside of a unit of an object of the peculiarizing process has. The peculiarizing process (hierarchical peculiarizing process) signifies to duplicate, when a higher hierarchical layer refers to a unit having a predetermined function by a plural number of times in hierarchical design, the unit of the object of the reference by a number of times equal to the number of times of reference and apply peculiar names to the duplicates thereby to obtain single-reference units which are referred to only once.

(2-2) Test Circuit Information

A hierarchical layer name, a name and a function of an additional terminal, a name and a function of a logic gate to be added, and a connection order of a connection relationship (scan chain).

(2-3) Hierarchical Layer Load Information

A hierarchical layer name, a size, a name and a load of an input terminal, and a name and a driving capacity as well as a fan-out number of an output terminal.

(2-4) Layer Information

Hierarchical layer names held in the circuit information database 2, and a high-low relationship among the layers.

Since the various kinds of information are held in a classified form in this manner, the designer can design a circuit efficiently.

The automatic designing processing section 3 includes an HDL reading-in section 3a, a parameter inputting section 3b, a processing result outputting section 3c, and a calculation processing section 4. The HDL reading-in section 3a reads in the source code written in the HDL language and inputs the read-in data to the calculation processing section 4.

The parameter inputting section 3b inputs a user designated parameter (which may be hereinafter referred to merely as parameter) designated by the user to the calculation processing section 4. The parameter relates to a flow of processing and relates, for example, to information of from which layer processing should be started in hierarchical design, information of which one of a plurality of pieces of test circuit information read in by a test circuit rule inputting section 3d (refer to FIG. 3 which is hereinafter described) should be selected, and so forth.

The processing result outputting section 3c outputs processing contents automatically designed by the calculation processing section 4 in a fixed format so that the designer can confirm the processing contents or utilize the processing contents for succeeding design. The functions of the automatic designing processing section 3 described are implemented, though not shown, by a CPU (Central Processing Unit), a ROM (Read Only Memory), a RAM (Random Access Memory) and other necessary elements.

Further, due to the functions of the automatic designing processing section 3, only if the designer inputs a parameter to the parameter inputting section 3b, then the processes described above are executed automatically. Consequently, the designer can proceed with its design without inputting separate parameters in the individual processes.

The calculation processing section 4 performs calculation processing for a circuit and includes an HDL conversion processing section 4a, a peculiarizing processing section 4b, a test circuit production processing section 4c, a load adjustment processing section 4d and an HDL outputting processing section 4e.

The HDL conversion processing section 4a receives a source code and a parameter as inputs thereto, converts the source code based on contents designated with the parameter, and outputs data obtained by the conversion to the circuit information database 2.

Figure 5:
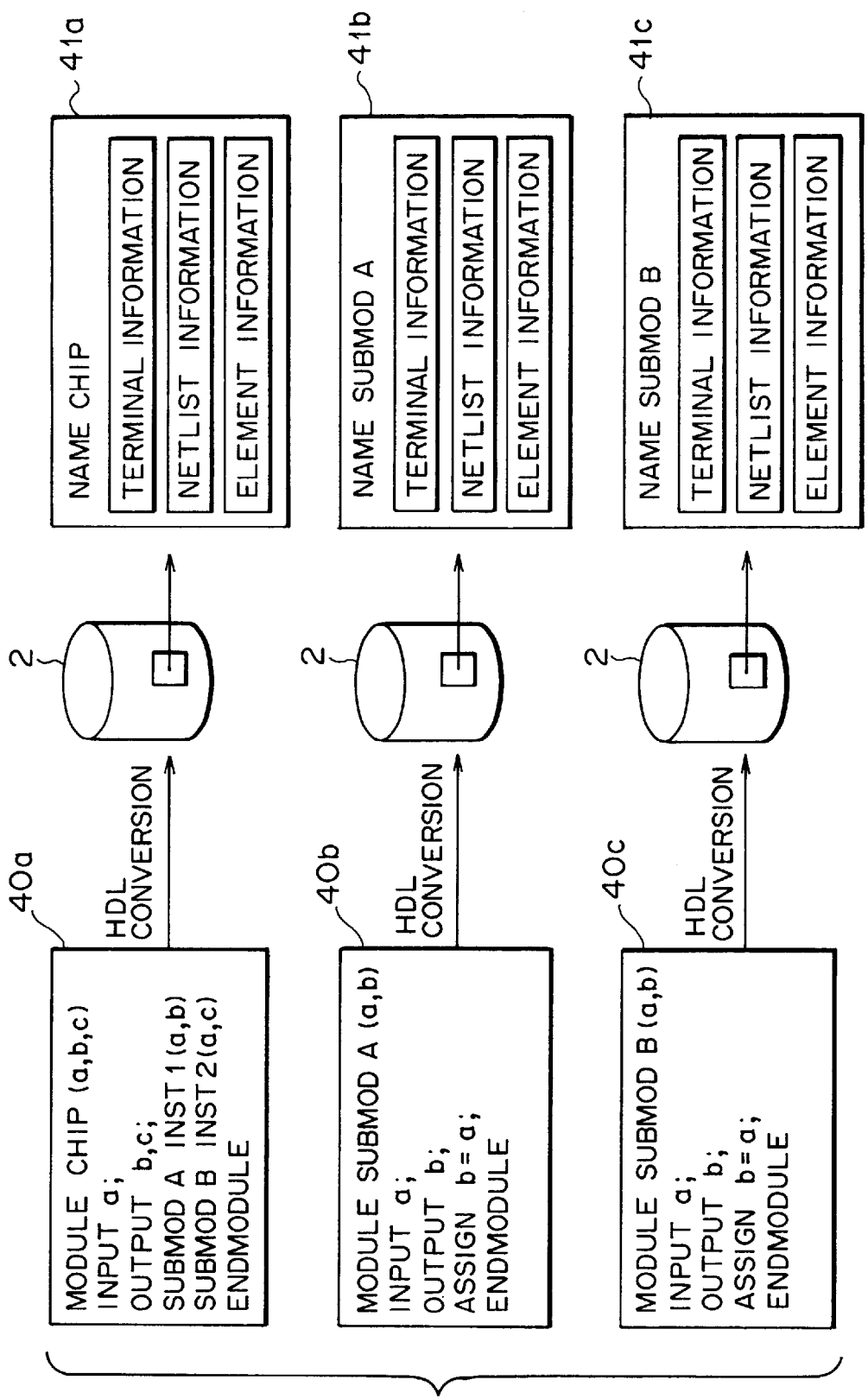
FIG. 5 is a diagrammatic view illustrating a concept of HDL conversion according to the first embodiment of the present invention.

FIG. 5 is a diagrammatic view illustrating a concept of HDL conversion according to the first embodiment of the present invention. Referring to FIG. 5, HDL source codes 40a (CHIP), 40b (submodA) and 40c (submodB) shown are individually converted by the HDL conversion processing section 4a (refer to FIG. 1) and written into the circuit information database 2.

Further, data images 41a, 41b and 41c shown in FIG. 5 are conceptive representations of data stored in the circuit information database 2. In particular, each of the data images 41a, 41b and 41c is stored in a form classified, for example, in three kinds of information including terminal load-driving capacity information (referred to for short as terminal information), netlist information and element information. It is to be noted that the HDL conversion may be performed collectively at a time or performed divisionally by a plurality of times.

Referring back to FIG. 1, the peculiarizing processing section 4b reads out peculiarizing information from the design information database 5 and applies different peculiar names to individual units to be processed. Further, the peculiarizing processing section 4b reads out the parameter and the circuit information database 2 obtained by the conversion of the processing described above and duplicates the plural-reference unit data or changes the peculiar names.

The test circuit production processing section 4c can read out change history information from the design information database 5 and produce a test circuit of a hierarchically higher layer. The load adjustment processing section 4d reads out terminal load-driving capacity information from the design information database 5, applies design information to individual terminals included in a circuit of a hierarchically higher layer and adjusts the loads based on the design information.

The HDL outputting processing section 4e reads out the parameter inputted from the parameter inputting section 3b and the circuit information database 2 and writes necessary data into the source code (HDL source code). The peculiarizing processing section 4b, test circuit production processing section 4c and load adjustment processing section 4d are connected to the circuit information database 2 and the design information database 5 so that they can read out and write data from and into the circuit information database 2 and the design information database 5.

Each of the peculiarizing processing section 4b, test circuit production processing section 4c and load adjustment processing section 4d can perform hierarchical design and ECO design. In the hierarchical design, a circuit is designed in a state wherein one of units to be processed hierarchically contains the other independently designed units. The hierarchical design allows a large scale circuit to be designed for each part.

In the ECO design, some of units to be processed are changed while the other portions of the circuit are not changed to re-design a circuit.

Due to the hierarchical design and the ECO design, design of a circuit on the circuit designing apparatus 1 can use the same operation procedure.

Now, the peculiarizing processing section 4b is described in more detail with reference to FIG. 2 and the test circuit production processing section 4c and the load adjustment processing section 4d are described in more detail with reference to FIGS. 3 and 4, respectively.

Figure 2:
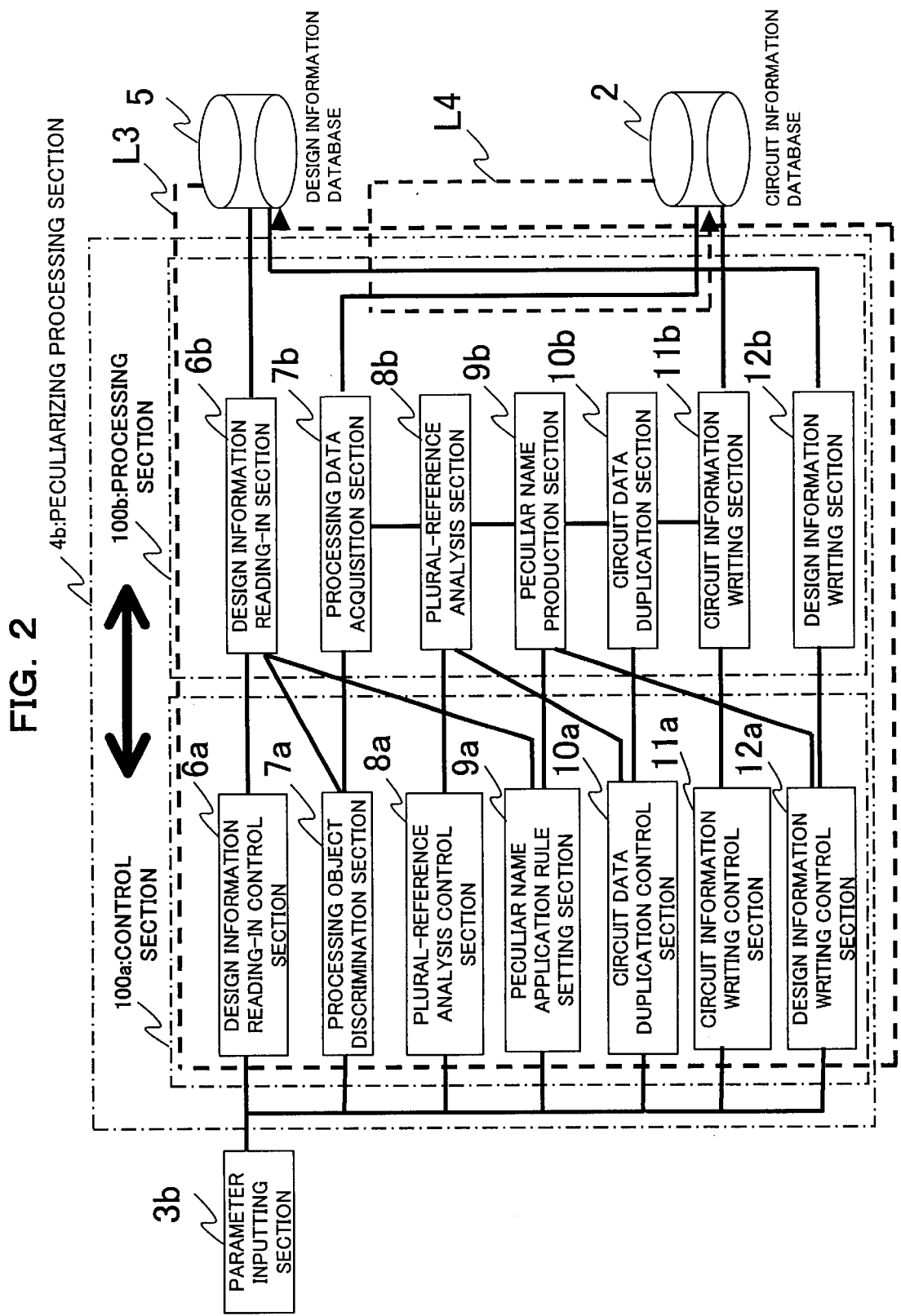
FIG. 2 is a block diagram of a peculiarizing process section according to the first embodiment of the present invention.

FIG. 2 is a block diagram of the peculiarizing processing section 4b according to the first embodiment of the present invention. Referring to FIG. 2, the peculiarizing processing section 4b shown performs application of peculiar names to and duplication of data of plural-reference units in the circuit information database 2 to allow single-reference to the plural-reference units. Further, the peculiarizing processing section 4b has additional functions for allowing the hierarchical design and the ECO design to be performed and includes a processing section 100b for processing a circuit and a control section 100a for controlling the processing section 100b. The control section 100a and the processing section 100b are implemented, for example, by software.

It is to be noted that each thick line between blocks in FIG. 2 indicates that the blocks are connected to each other. However, those blocks which are not connected to each other in FIG. 2 may otherwise be connected to each other.

The processing section 100b includes a design information reading-in section 6b, a processing data acquisition section 7b, a plural-reference analysis section 8b, a peculiar name production section 9b, a circuit data duplication section 10b, a circuit information writing section 11b, and a design information writing section 12b.

The design information reading-in section 6b reads in design information written in the design information database 5 and can refer to circuit data after peculiarizing with the name of a hierarchical layer before peculiarizing through correspondence between the name of the hierarchical layer before peculiarizing and the name of the hierarchical layer after peculiarizing. Accordingly, the peculiarizing processing section 4b can obtain information of whether or not circuit data have been subject to peculiarizing processing and the names of hierarchical layers before and after such peculiarizing processing and can use the thus obtained information to discriminate whether or not the circuit data does not require processing or for prevention of production of the same peculiar name, which augments the design efficiency.

In addition, the peculiarizing processing section 4b uses, upon ECO design, ordinary design information (design information of the design completed once before the ECO design) to design a circuit which is the same as the normally designed circuit except a changed portion or portions. The design information reading-in section 6b reads in first unit information relating to a processing result of a first unit A obtained by processing the first unit A (a position and so forth of the first unit A obtained by processing the first unit A) from the design information database 5. The design information reading-in section 6b is connected to a memory (not shown) for temporarily storing data.

The processing data acquisition section 7b acquires circuit data of a unit to be processed from the circuit information database 2 based on the discrimination by a processing object discrimination section 7a (which is hereinafter described) of whether or not the circuit data is an object of processing.

Thus, when the peculiarizing processing section 4b processes the hierarchically higher layer, a result of processing of the hierarchically lower layer is written into the design information database 5 by the design information writing section 12b. Then, the information stored in the design information database 5 is read in through the design information reading-in section 6b, and it is recognized by the processing object discrimination section 7a whether or not the data of the lower layer written in the design information database 5 has been processed. Then, based on a result of the recognition, it is discriminated whether or not the data is an object of processing.

The plural-reference analysis section 8b searches the circuit for a location where a plurality of the same circuit units are used, and discriminates a hierarchical layer, a cell and a black box of the type of the circuit units at the location. The peculiarizing processing can be performed efficiency and fine design can be performed by the plural-reference analysis section 8b.

The peculiar name production section 9b produces, when it is discriminated by the processing object discrimination section 7a that the data is an object of processing, a peculiar name so that a reference relationship, which is same as the reference relationship stored in the design information database 5, may be established. However, if it is discriminated by the processing object discrimination section 7a that the data is not an object of processing, then the peculiar name production section 9b produces a peculiar name different from peculiar names allocated already.

In other words, the peculiar name production section 9b generates a name in order to apply a peculiar name to a circuit unit which has been discriminated as a processing object by the processing object discrimination section 7a and discriminated as an object of plural-reference by the plural-reference analysis section 8b.

On the other hand, when the hierarchical design is used to design each part, the peculiar name production section 9b applies a peculiar name in accordance with a naming rule (peculiar name application rule) set also for a single-reference unit so that overlapping of names may not occur between circuits of different design units.

Further, in ECO design, since the peculiar name production section 9b must allocate a peculiar name same as a peculiar name applied in normal design to a circuit unit having the same reference relationship, it produces a peculiar name for the ECO processing object circuit using the information of the reference relationships and the information of the peculiar names stored in the design information database 5.

Furthermore, the peculiar name production section 9b produces a peculiar name for each of plural-reference units and single-reference units discriminated by the plural-reference analysis section 8b.

In addition, except when an existing peculiar name in the design information database 5 is used in ECO design, the peculiar name production section 9b produces a peculiar name different from peculiar names applied to units processed already for a unit to be processed based on the naming rule set by a peculiar name application rule setting section 9a which is hereinafter described.

Consequently, when it is discriminated by the processing object discrimination section 7a that design information regarding a unit to be processed is written already, a peculiar name is produced so that the same reference relationship may be maintained, but if it is discriminated conversely that design information regarding a unit to be processed is not written as yet, then a peculiar name different from peculiar names allocated already is produced.

The peculiarizing processing mentioned above is hereinafter described with reference to FIG. 6.

The circuit data duplication section 10b allocates peculiar names produced by the peculiar name production section 9b to a plural-reference unit and single-reference units to duplicate circuit data. The circuit data may be such as, for example, data of a circuit module 45 (refer to FIG. 6). The circuit information writing section 11b thus writes the circuit information into a database on the storage apparatus.

The design information writing section 12b is connected to the design information database 5 and writes design information of a processed hierarchical layer into the design information database 5. Consequently, information of the peculiarizing processing is stored and therefore can be used for discrimination of a portion which need not be processed upon processing of the hierarchically higher layer or for application of the same peculiar name in ECO design.

Further, the design information writing section 12b collects first unit information regarding a result of processing for the first unit A and writes the first unit information into the design information database 5.

The control section 100a shown in FIG. 2 includes a design information reading-in control section 6a, a processing object discrimination section 7a, a plural-reference analysis control section 8a, a peculiar name application rule setting section 9a, a circuit data duplication control section 10a, a circuit information writing control section 10a, and a design information writing control section 12a.

The design information reading-in control section 6a analyzes a parameter obtained from the parameter inputting section 3b to discriminate whether or not peculiarizing information should be acquired from the design information database 5, and instructs the design information reading-in section 6b to input the peculiarizing information.

The processing object discrimination section 7a discriminates based on the design information written in the design information database 5 whether or not the unit to be processed is an object of processing. The processing object discrimination section 7a can acquire information stored in the design information database 5 through the design information reading-in section 6b.

Thus, the processing object discrimination section 7a discriminates whether or not the design information (peculiarizing information) regarding the unit being currently processed is written in the design information database 5. If the processing object discrimination section 7a recognizes that the hierarchically lower layer has been processed already, then it stops acquisition of the processed circuit data. Accordingly, the working memory can be saved as much.

Further, the processing object discrimination section 7a discriminates, based on first unit information regarding a processing result of a first unit A obtained by processing the first unit A of the design information, whether or not the first unit A included in a second unit B to be processed next has processed already.

Consequently, the processing object discrimination section 7a can discriminate a location of an object to be processed readily based on the parameter inputted by the designer from the parameter inputting section 3b and the peculiarizing information obtained from the design information reading-in section 6b.

Furthermore, the processing object discrimination section 7a controls the processing data acquisition section 7b so that the processing data acquisition section 7b acquires processing data from the circuit information database 2. Accordingly, information regarding a portion to be processed can be obtained readily.

Thus, where the peculiarizing processing section 4b performs division design based on a hierarchical structure of a circuit, when it processes a hierarchically higher layer, the design information reading-in section 6b first reads in the information of whether or not the hierarchically lower layer written in the design information database 5 has been processed, and then the processing object discrimination section 7a discriminates, based on the information of whether or not the hierarchically lower layer has been processed, whether or not the hierarchically lower layer is an object of processing.

The plural-reference analysis control section 8a controls the plural-reference analysis section 8b. The peculiar name application rule setting section 9a sets a naming rule for applying a peculiar name to each of units to be processed based on a parameter regarding the name of a circuit element based on the design information database 5. Then, the peculiar name application rule setting section 9a analyzes the naming rule included in the parameter and existing peculiar names included in the peculiarizing information.

Consequently, the peculiar name production section 9b can produce a peculiar name which complies with the naming rule and does not overlap with any other peculiar name.

The circuit data duplication control section 10a applies a peculiar name to each of a plural-reference unit plural-referred to and single-reference units single-referred to based on the naming rule and duplicates data. More particularly, the circuit data duplication control section 10a controls a duplication process of circuit data so that each of plural-reference unit duplicates may individually be single-referred to.

The circuit information writing control section 11a controls the circuit information writing section 11b thereby to control the processing of writing applied peculiar names and duplicated data into the circuit information database 2.

The design information writing control section 12a controls the design information writing section 12b to write unit names of units before particularizing handled in peculiarizing processing, unit names of the units after the peculiarizing processing, information for specifying the positions of the units in the entire circuit and other necessary information into the design information database 5.

In FIG. 2, information necessary for control is inputted from the design information database 5 to the control section 100a along a route (a broken line) denoted by L3. Meanwhile, data of a circuit (object of design) are sent from the design information database 5 along another route (a broken line) denoted by L4 to the processing section 100b, by which they are processed.

Transmission of control data and circuit data along the separate routes in this manner allows efficient designing.

Now, processing of the peculiarizing processing section 4b is described with reference to FIG. 6. The peculiarizing processing section 4b uses two different methods so that overlapping of peculiar names may not occur.

Figure 6:
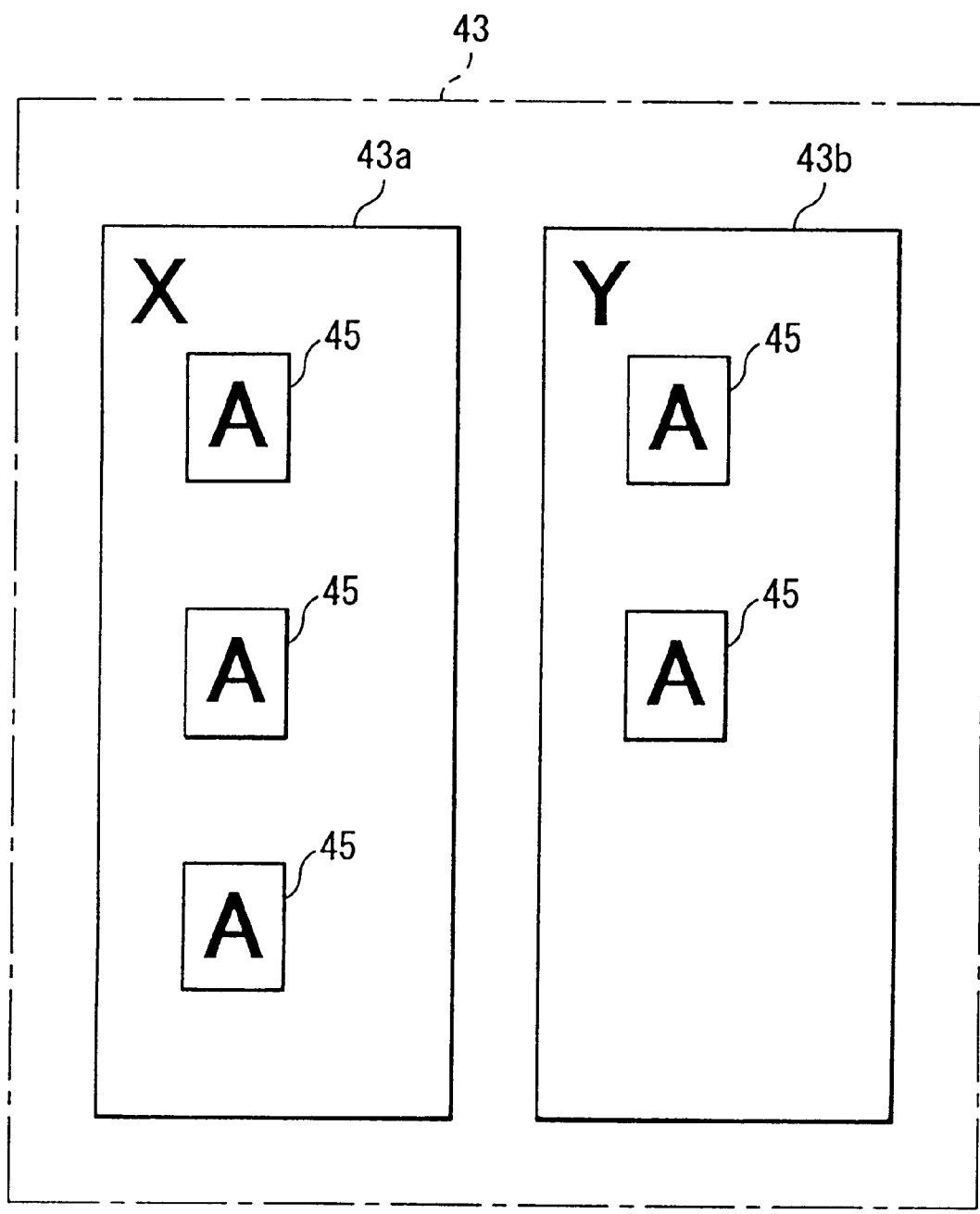
FIG. 6 is a diagrammatic view illustrating a peculiarizing process according to the first embodiment of the present invention.

FIG. 6 is a diagrammatic view illustrating a peculiarizing process according to the first embodiment of the present invention. Referring to FIG. 6, a circuit module 43 shown contains modules 43a and 43b (each of which may be hereinafter referred to simply as module 43a or 43b), each of which contains circuit modules 45. Here, each of the circuit modules 45 is a flip-flop or a latch circuit as an example and has a name A applied thereto. Each of the modules 43a and 43b is a register or a counter and has a name of X or Y.

According to the first method, the designer changes the setting of the naming rule for each unit to be processed using a parameter and generates a name based on the thus set naming rule. Thus, the peculiarizing processing section 4b names the three circuit modules 45 included in the module 43a in FIG. 6 as, for example, A-X-0, A-X-1 and A-X-2 and names the two circuit modules 45 included in the module 43b as A-Y-0 and A-Y-1. In particular, the peculiarizing processing section 4b analyses the parameter, duplicates a unit (a circuit module 45) plural-referred to by a number of times of such referring (three times or two times) and generates names for the unit (module) duplicates so that the unit names may not overlap with the name of the unit being currently processed.

According to the second method, the designer generates a name other than names stored in the design information database 5. In particular, in order to apply a name for the module 43b where the three circuit modules 45 included in the module 43a are named as A-0, A-1 and A-2, the peculiarizing processing section 4b refers to the design information database 5 to name the two circuit modules 45 included in the module 43b as A-3 and A-4 without using the names A-0, A-1 and A-2 so that the names may not overlap with names stored in the design information database 5.

In this manner, in hierarchical design, the peculiar name application rule setting section 9a (refer to FIG. 2) first sets a naming rule for units to be processed based on a parameter designated by the designer, and then the peculiar name production section 9b generates peculiar names for the units to be processed based on the naming rule so that the names may be different from peculiar names applied to units processed already.

According to the methods described above, a new name is produced based on an original peculiar name and a naming rule designated by the designer. Therefore, even if a plurality of names are produced newly by the peculiarizing processing, the names can be discriminated clearly, and the designer can divide the names into groups (grouping) readily and besides for each unit to be processed. Further, otherwise possible overlapping between names of processed unit and a unit being currently processed.

Accordingly, when a name is to be produced newly, the design information database 5 is referred to, and a name which does not overlap with peculiar name information loaded in the design information database 5 and the working memory (not shown) is produced based on a set naming rule.

Consequently, even if peculiarizing processing is performed for each part of a circuit in hierarchical design, a name is applied taking all names produced for the entire circuit into consideration. Therefore, no overlapping of names occurs.

In this manner, upon processing of a hierarchically higher layer, the peculiarizing processing section 4b can acquire information of the hierarchically lower layer contained in the hierarchically higher layer from the design information database 5 in which a processing result and so forth when the hierarchically lower layer is designed as a unit to be processed are stored instead of acquiring information from the circuit information database 2.

Now, two different circuit designing methods of the present invention are described.

According to the first circuit designing method of the present invention, the peculiarizing processing section 4b first reads out information regarding a circuit from the circuit information database 2 in which information regarding the circuit is stored, and the automatic designing processing section 3 which can design the circuit for each predetermined unit to be processed produces first unit information regarding a processing result of a first unit A obtained by processing the first unit A (process production step).

Then, the peculiarizing processing section 4b collects design information including peculiarizing information of circuit elements being produced in the process production step, change history information representative of a history of changes of the circuit and terminal load-driving capacity information of the circuit (design information collection step).

Further, the peculiarizing processing section 4b writes the design information collected in the design information collection step for each unit to be processed into the design information database 5 connected to the automatic designing processing section 3 and having the design information stored therein (design information write step).

Further, where another unit is to be processed later, the peculiarizing processing section 4b refers to design information regarding the first unit A in order to process a second unit B based on the design information written in the design information write step (reference step).

Then, the peculiarizing processing section 4b recognizes a reference relationship of the design information regarding the first unit A referred to in the reference step (recognition step). Accordingly, the information in the design information database 5 is used to check whether or not the second unit B contains the first unit A processed already.

Thereafter, the peculiarizing processing section 4b refers to the unit information regarding the position and the processing result stored in the circuit information database 2 based on the reference relationship obtained in the reference step (circuit information database reference step). Then, the peculiarizing processing section 4b updates the circuit data obtained by the design processing (circuit information database writing step).

In this manner, where the second unit B is contained in the first unit A, it is automatically recognized whether or not the first unit A is processed already.

Further, the design information writing section 12b collects first unit information regarding the position of the first unit A and the processing result and writes the first unit information into the design information database 5. The first unit information written in the design information database 5 is read into the design information reading-in section 6b. Then, the processing object discrimination section 7a discriminates based on the first unit information whether or not the second unit B contains the first unit A. Further, if it is discriminated that the second unit B contains the first unit A, then the processing object discrimination section 7a discriminates whether or not the first unit A is a processed unit.

Accordingly, since the peculiarizing processing section 4b automatically discriminates a processed unit, reading out of data of the hierarchically lower layer from the circuit information database 2 is unnecessary. Consequently, the capacity of the working memory used for the peculiarizing processing and so forth can be saved significantly.

Meanwhile, according to the second circuit designing method of the present invention, the peculiarizing processing section 4b reads out information regarding a circuit from the circuit information database 2 in which the information regarding the circuit is stored, and the automatic designing processing section 3 which can design the circuit for each predetermined unit to be processed processes a fourth unit which contains a third unit C (first processing step).

Then, the peculiarizing processing section 4b collects third unit information regarding a result of the processing of the third unit C being processed in the first processing step (third unit information collection step).

Further, the peculiarizing processing section 4b writes the third unit information collected in the third unit information collection step into the design information database 5 connected to the automatic designing processing section 3 for storing design information (design information writing step).

Then, the peculiarizing processing section 4b discriminates based on the third unit information written in the design information writing step whether or not a third processed unit obtained by changing the third unit C contains a fourth processed unit obtained by changing the fourth unit and discriminates whether or not the third processed unit is equivalent to the third unit C (discrimination step).

Use of the two different circuit designing methods of the present invention in this manner allows fully automated continuous processing and thus allows reduction of the processing time and reduction of the design period.

A designer or a person who takes charge of system construction (hereinafter referred to as designer or the like) constructs the present circuit designing apparatus 1 using a personal computer or a work station (hereinafter referred to generally as computer). In particular, the designer or the like produces a software program and stores the software program onto a hard disk of the computer. The program can cause the computer to execute the processing described hereinabove.

The program according to the present invention causes the computer to function such that it reads out information regarding a circuit from the circuit information database 2 in which the information regarding the circuit is stored and designs the circuit for each predetermined unit to be processed and besides stores design information including peculiarizing information of circuit elements obtained by the design, change history information representative of a history of changes of the circuit and terminal load-driving capacity information into the design information database 5.

In other words, the functions of the automatic designing processing section 3 are implemented by the program read and executed by the CPU of the computer.

It is to be noted that, as a method of installing the program according to the present invention onto the hard disk, a recording medium such as a CD-ROM (Compact Disc-Read Only Memory), a CD-R (CD-Recordable), a CD-RW (CD-Rewritable) or a floppy disk is used in accordance with a reading apparatus of the computer.

In this manner, the designer or the like can simply and conveniently construct an environment in which a large scale circuit is designed.

Further, the program according to the present invention causes the computer to function so that the following steps may be executed. In particular, the program according to the present invention causes the computer to function such that the automatic designing processing section 3, which can read out information regarding a circuit from the circuit information database 2 in which the information regarding the circuit is stored and design the circuit for each predetermined unit to be processed, first produces first unit information regarding a processing result of a first unit A obtained by processing the first unit A (process production step) and then collects design information including peculiarizing information of circuit elements being produced, change history information representative of a history of changes of the circuit and terminal load-driving capacity information of the circuit (design information collection step).

Then, the program causes the computer to function such that the automatic designing processing section 3 writes the collected design information for each unit to be processed into the design information database 5 connected to the automatic designing processing section 3 for storing the design information (design information write step) and refers to design information regarding the first unit A in order to process a second unit B based on the written design information (reference step).

Further, the program causes the computer to function such that the automatic designing processing section 3 recognizes a reference relationship of the design information regarding the first unit A referred to (recognition step), refers to the unit information regarding the position and the processing result stored in the circuit information database 2 based on the obtained reference relationship (circuit information database reference step) and updates the circuit data obtained by the design processing (circuit information database writing step).

In this manner, continuous processing can be achieved by full automation, and consequently, reduction of the processing time and hence reduction of the design period can be achieved.

Further, the program according to the present invention causes the computer to function so that the following steps may be executed. In particular, the program according to the present invention causes the computer to function such that the automatic designing processing section 3, which can read out information regarding a circuit from the circuit information database 2 in which the information regarding the circuit is stored and design the circuit for each predetermined unit to be processed, processes a fourth unit D which contains a third unit C (first processing step), collects third unit information regarding a result of the processing of the third unit C being processed (third unit information collection step), and writes the collected third unit information into a design information database 5 connected to the automatic designing processing section 3 for storing design information (design information writing step).

Then, the program causes the computer to function such that the automatic designing processing section 3 discriminates based on the written third unit information whether or not a third processed unit obtained by changing the third unit C contains a fourth processed unit obtained by changing the fourth unit and discriminates whether or not the third processed unit is equivalent to the third unit C (discrimination step).

In this manner, continuous processing can be achieved by full automation, and consequently, reduction of the processing time and hence reduction of the design period can be achieved.

Now, a peculiarizing process in ECO design is described.

Figure 7A:
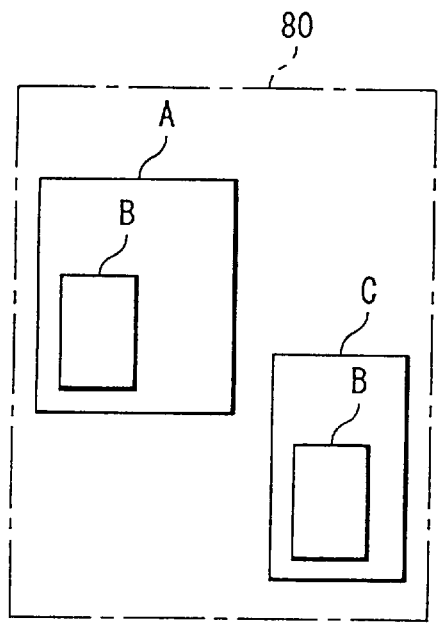
FIGS. 7(a) to 7(d) are diagrammatic views illustrating a peculiarizing process in ECO design according to the first embodiment of the present invention.
Figure 7B:
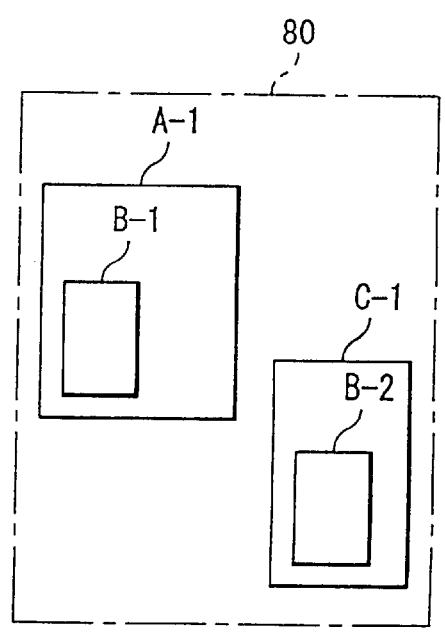

FIGS. 7(a) to 7(d) and 8 are diagrammatic views illustrating a peculiarizing process in ECO design according to the first embodiment of the present invention. A chip 80 shown in FIG. 7(a) contains modules A and C each of which contains a module B. If peculiarizing is executed in normal design, then such peculiar module names as seen, for example, in FIG. 7(a) are applied to the modules. Then, the name A-1 is written into the change history for the module A, and the name C-1 is written into the change history for the module C as seen in FIG. 7(b). Similarly, the name B-1 is written into the change history for the module B in the module A, and the name B-2 is written into the change history for the module B in the module C.

Figure 7C:
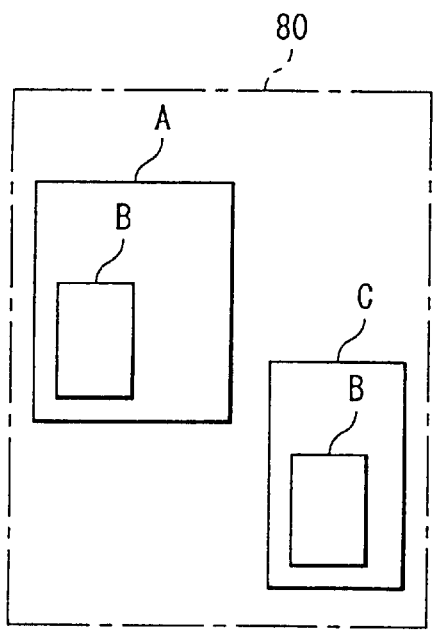
Figure 7D:
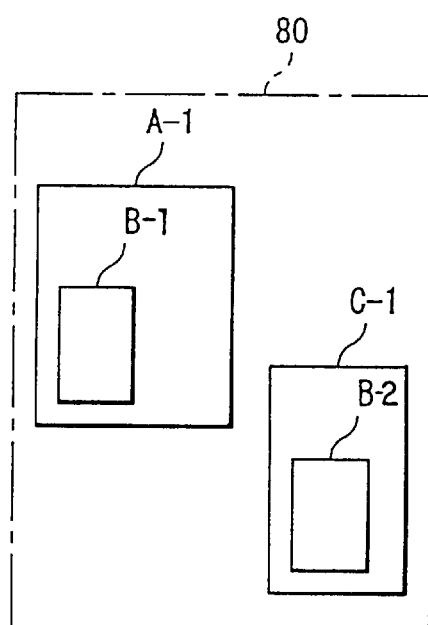

FIG. 7(c) shows a circuit upon starting of ECO design when the logic of one of the modules of the circuit of the chip 80, for example, the logic of the module B, is changed. In this instance, it is discriminated whether or not information of the unit being currently processed is stored in the design information database 5, and if such information is stored, then a name is produced so that a reference relationship same as the reference relationship written in the design information database 5 may be established as seen in FIG. 7(d). On the other hand, if such information as mentioned above is not stored in the design information database 5, though not shown, a name is produced so that it may not overlap with the names of the other units written in the design information database 5.

Figure 8:
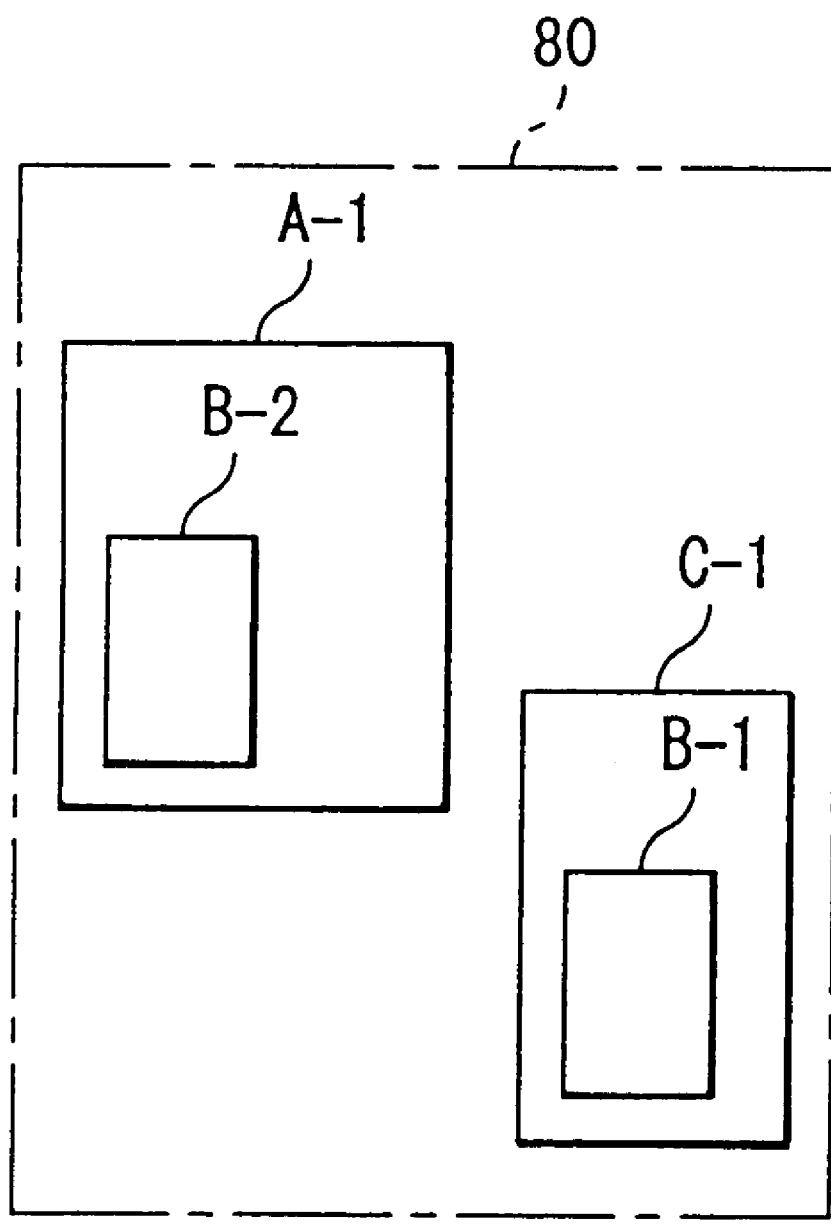
FIG. 8 is a diagrammatic view illustrating circuit change in the ECO design according to the first embodiment of the present invention.

It is to be noted that, if the design information is not referred to, then there is the possibility that, in ECO design, a peculiar name different from that upon normal design may be applied as seen in FIG. 8, and this causes confusion of names upon contrast between peculiar names and design information in succeeding processing.

Accordingly, in ECO design, an old circuit can be restored equivalently except those portions with which circuit change has been performed. In other words, since the same names as those upon designing of the old circuit are allocated as the hierarchical layer names after peculiarizing, ECO processing can be continued from the circuit after peculiarizing.

Further, when peculiarizing information data are inputted from the design information database 5 produced upon designing of the old circuit, the peculiarizing processing section 4b can use the peculiarizing information to automatically apply, to any hierarchical layer which has the same instance name and is not peculiarized as yet, the same peculiar name as that of the old circuit.

The hierarchical layers of the new and old circuits can be made coincide with each other in this manner.

Since the peculiarizing processing section 4b reads in peculiarizing information obtained upon normal design as design information in this manner, in the ECO design, even if the entire chip 80 shown in FIG. 7(c) is not re-processed using the circuit before peculiarizing, it can be re-processed using circuit information in a design completion condition of the chip 80 shown in FIG. 7(b) and circuit information of any module (for example, the module B) which has been changed. At this time, even if the design information when the normal design is completed indicates "all modules peculiarized", in the ECO design process, any module which becomes an object of the ECO design by designation of a parameter is re-processed compulsorily.

The test circuit production processing section 4c and the load adjustment processing section 4d shown in FIG. 1 are described in more detail below with reference to FIGS. 3 and 4, respectively.

Figure 3:
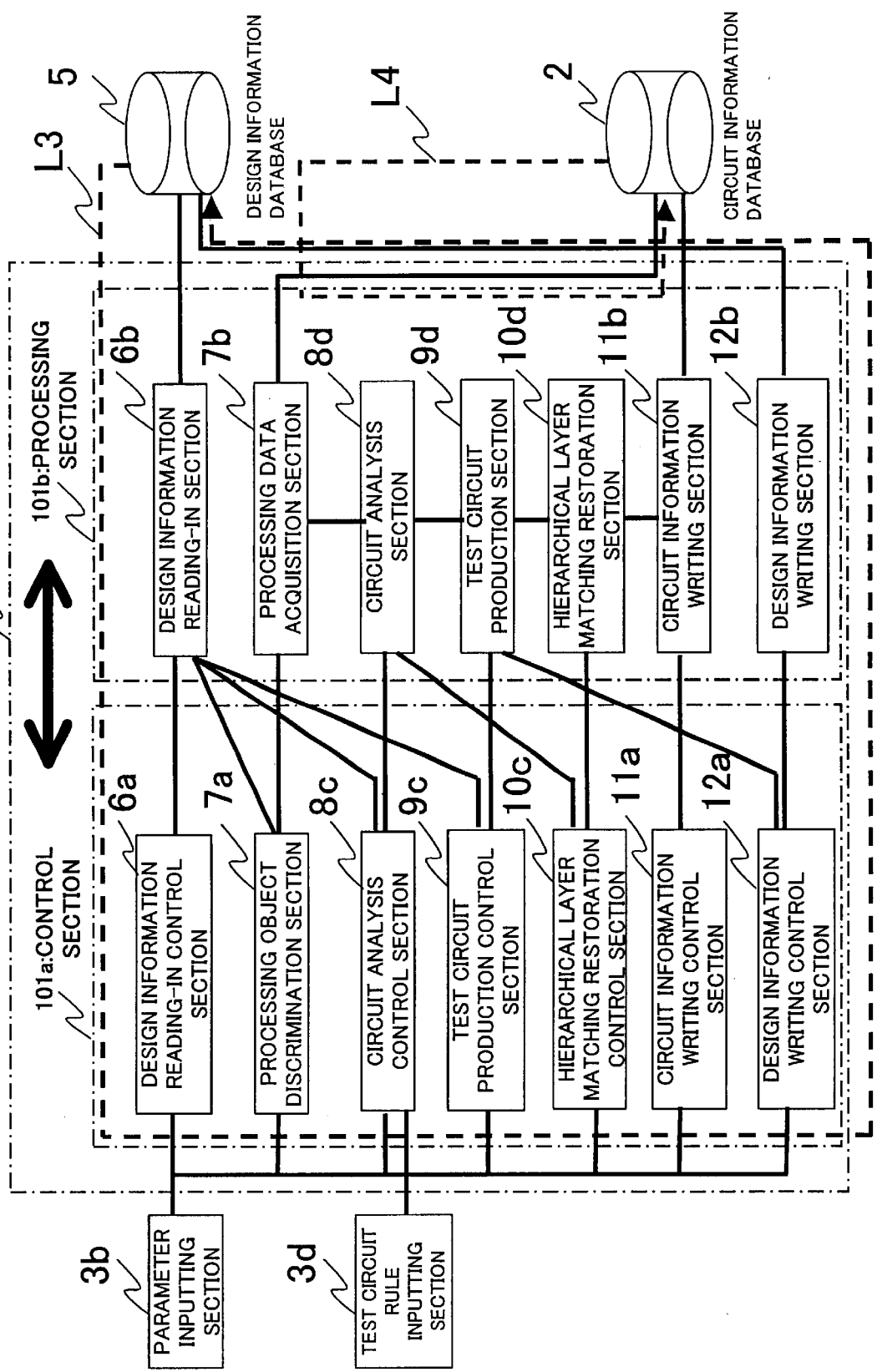
FIG. 3 is a block diagram of a test circuit production processing section according to the first embodiment of the present invention.

FIG. 3 is a block diagram of the test circuit production processing section 4c in the first embodiment of the present invention. Referring to FIG. 3, the test circuit production processing section 4c shown has additional functions for achieving hierarchical design and ECO design and includes a processing section 101b for processing a circuit and a control section 101a for controlling the processing section 101b. A test circuit rule inputting section 3d is provided on the input side of the control section 101a. It is to be noted that each thick line between blocks in FIG. 3 indicates that the blocks are connected to each other similarly as in FIG. 2.

The test circuit rule inputting section 3d inputs test circuit information regarding how to produce a test circuit to the test circuit production processing section 4c. The test circuit information is detailed information regarding, for example, a technique called scanning (to fetch a signal from a circuit or set such a signal), another technique called BIST (Built-in Self-test: to embed a circuit for automatic lasting) or the like. The designer can select a desired file from among a plurality of files in which necessary test circuit information is written so that, when the designing apparatus 1 is started up, the selected file may be read in automatically.

The processing section 101b is different from the processing section 100b of the peculiarizing processing section 4b and includes a circuit analysis section 8d, a test circuit production section 9d and a hierarchical layer matching restoration section 10d.

The circuit analysis section 8d uses normal design information produced upon normal design and a test circuit rule for a unit of an object of ECO design to extract identification data for identification of a portion for which a test circuit same as that upon normal design can be produced and another portion for which a new test circuit should be produced based on the design information database 5. This optimizes the used amount of the working memory.

The test circuit production section 9d produces, based on the identification data extracted by the circuit analysis section 8d, a same test circuit regarding a portion of the ECO design object unit for which a test circuit same as that upon normal design can be produced, but produces a test circuit for another portion of the ECO design object unit, for which a new test circuit should be produced, in accordance with the test circuit rule. This significantly augments the design efficiency of a test circuit upon ECO design.

The hierarchical layer matching restoration section 10d eliminates terminal mismatching between a terminal added as a test signal inputting terminal to the hierarchically lower layer and a terminal of the layer to which the hierarchically upper layer has referred based on design information stored in the design information database 5. This significantly augments the operability for the designer in ECO design.

Further, the hierarchical layer matching restoration section 10d restores, upon ECO design, the hierarchical layer matching between normal design information upon normal design and terminal information of the ECO design object unit and the hierarchically higher layer from within the design information.

The control section 101a is different from the control section 100a of the peculiarizing processing section 4b and includes a circuit analysis control section 8c, a test circuit production control section 9c and a hierarchical layer matching restoration control section 10c. The circuit analysis control section 8c controls the circuit analysis section 8d while the test circuit production control section 9c controls the test circuit production section 9d, and the hierarchical layer matching restoration control section 10c controls the hierarchical layer matching restoration section 10d.

The control section 101a and the processing section 101b are implemented, for example, by software.

Similarly as in the peculiarizing processing section 4b (refer to FIG. 2), information necessary for control is inputted from the design information database 5 to the control section 101a along a route denoted by L3. Data of a design object are inputted from the design information database 5 along another route denoted by L4 to the processing section 101b, by which they are processed.

Since control data and circuit data are transmitted along two separate routes in this manner, efficient designing can be achieved.

Now, hierarchical design of the test circuit processing section 4c is described with reference to FIGS. 9(a) and 9(b), and then ECO design is described with reference to FIGS. 10(a) to 10(d).

Figure 9A:
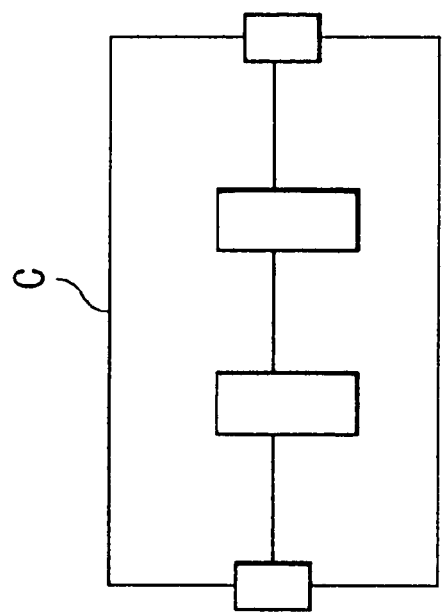
FIGS. 9(a) and 9(b) are diagrammatic views illustrating a test circuit production process in hierarchical design according to the first embodiment of the present invention.
Figure 9B:
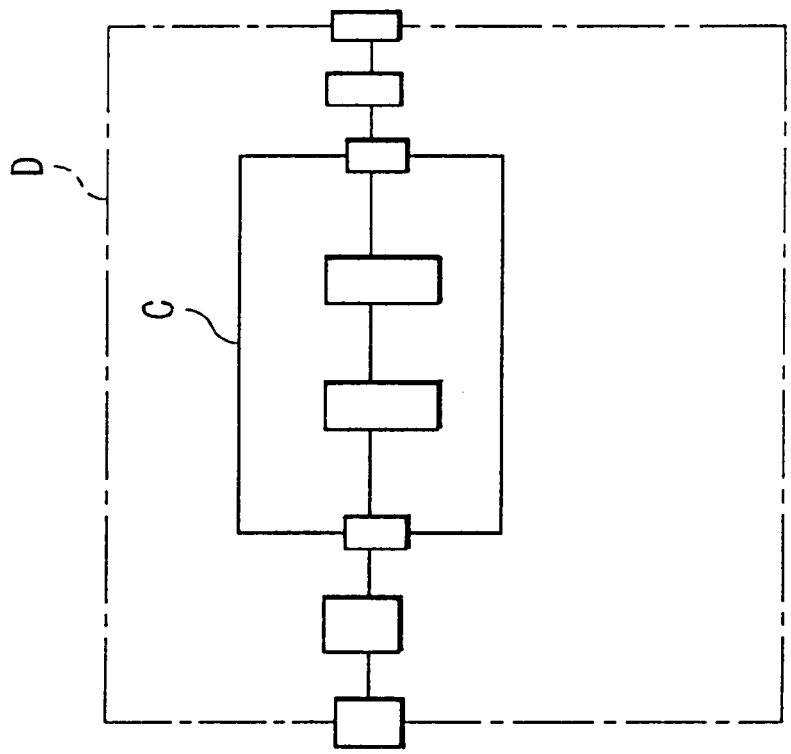

FIGS. 9(a) and 9(b) are diagrammatic views illustrating a test circuit production process in hierarchical design according to the first embodiment of the present invention. A circuit module C (module C) shown in FIG. 9(a) contains two circuit modules (two rectangles in the inside of the circuit module C in FIG. 9(a)). Meanwhile, a circuit module D shown in FIG. 9(b) contains a module C and several other circuit modules.

The test circuit production processing section 4c reads out terminal names from the circuit information database 2 in order to connect the module C and the other modules shown in FIG. 9(b). More particularly, the processing object discrimination section 7a (refer to FIG. 3) discriminates whether or not the third unit C is written in the design information database 5. Then, if it is discriminated that the third unit C is written in the design information database 5, then the design information regarding the third unit C stored in the design information database 5 is read out, and necessary design information is acquired by the processing data acquisition section 7b. Then, a test circuit is produced by the test circuit production section 9d based on the design information received through the circuit analysis section 8d.

In other words, when, in hierarchical design, the third unit C is processed and the fourth unit D which contains the third unit C is to be processed next, even if the third unit C is referred to by the fourth unit D, it is automatically discriminated whether or not information is stored in the design information database 5. Then, if the information is stored, then the circuit of the fourth unit D is changed with the information.

Figure 10A:
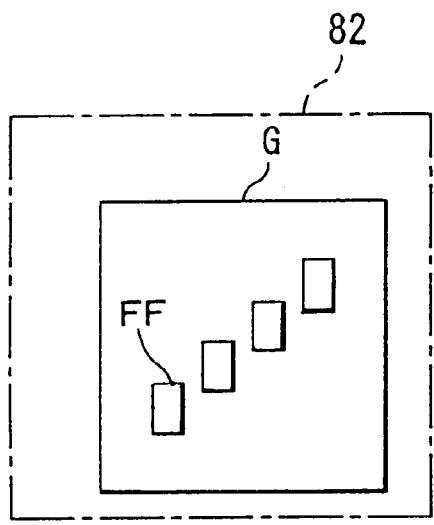
FIGS. 10(a) to 10(d) are diagrammatic views illustrating a test circuit production process in the ECO design according to the first embodiment of the present invention.
Figure 10B:
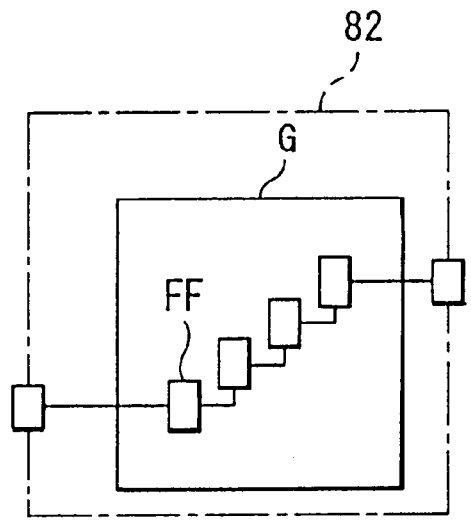

FIGS. 10(a) to 10(d) are diagrammatic views illustrating a test circuit production process upon ECO design according to the first embodiment of the present invention where a scan chain for a test is involved. A chip 82 shown in FIG. 10(a) contains a circuit module G (module G) which in turn contains a plurality of flip-flops (FFs). Meanwhile, a circuit shown in FIG. 10(b) is a scan completion circuit wherein the plurality of flip-flops in the module G are connected to each other. Terminal information of the circuit is provided, and the module G and terminals of the circuit are connected to each other.

In the test circuit production process, the test circuit of the old circuit must be restored except a portion of the circuit which has been changed by ECO processing. Therefore, the test circuit production processing section 4c reads in the design information database 5 produced upon designing of the old circuit and restores a test circuit equivalent to that of the old circuit by addition of the same terminal, addition of the same logic circuit, connection of the same scan chain for a test and so forth. Then, for the location where the circuit change has been performed, a new test circuit is produced.

Figure 10C:
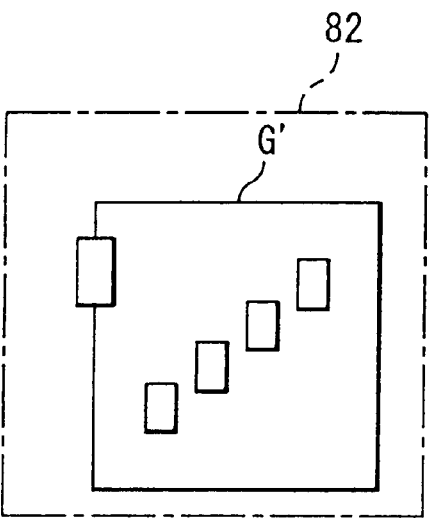

For example, the circuit shown in FIG. 10(c) is produced by the designer changing the module G and forms a module G'. The module G' does not include a scan complete circuit similarly to the module G of FIG. 10(a).

Figure 10D:
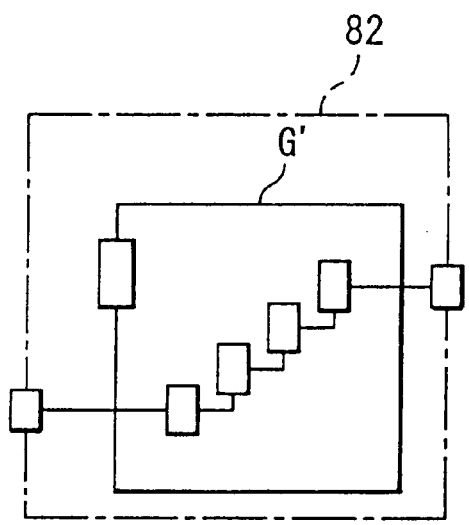

The module G' shown in FIG. 10(d) is a restored test circuit. The test circuit production processing section 4c reads out the history information from the design information database 5, recognizes the connections between the flip-flops and the test terminal names and produces a scan chain for a test equivalent to that of the old circuit.

In this manner, in the test circuit production processing, information of an added terminal or terminals, information of an added logic gate or gates and connection information of the test circuit are written as design information.

Further, in a process of a hierarchically higher layer, each circuit module acquires test circuit information of the hierarchically lower layer from the design information database 5 so that a test circuit of the hierarchically higher layer is produced in this manner.

Furthermore, in ECO design, there is no necessity of comparing the old circuit and the new circuit with each other in this manner, and since comparison between and differential analysis of the circuits are unnecessary, complicated processing is unnecessary. Further, since information inputting of the designer is unnecessary, the design efficiency is augmented significantly.

In this manner, the design information when the old circuit is designed can be used to automatically restore the old circuit equivalently except the changed portion or portions of the new circuit.

Referring back to FIG. 3, when the test circuit production processing section 4c shown processes a hierarchically higher layer, it acquires information of a hierarchically lower layer contained in the higher layer not from the circuit information database 2 but from the design information database 5 similarly to the peculiarizing processing section 4b. More particularly, the test circuit production processing section 4c acquires a processing result and so forth when the hierarchically lower layer is designed as a unit to be processed, and automatically discriminates a processed portion or portions.

In this manner, the circuit information database 2 for a hierarchically lower layer is unnecessary, and the capacity of the working memory used for the test circuit production process can be saved significantly.

Subsequently, the load adjustment processing section 4d is described with reference to FIG. 4.

Figure 4:
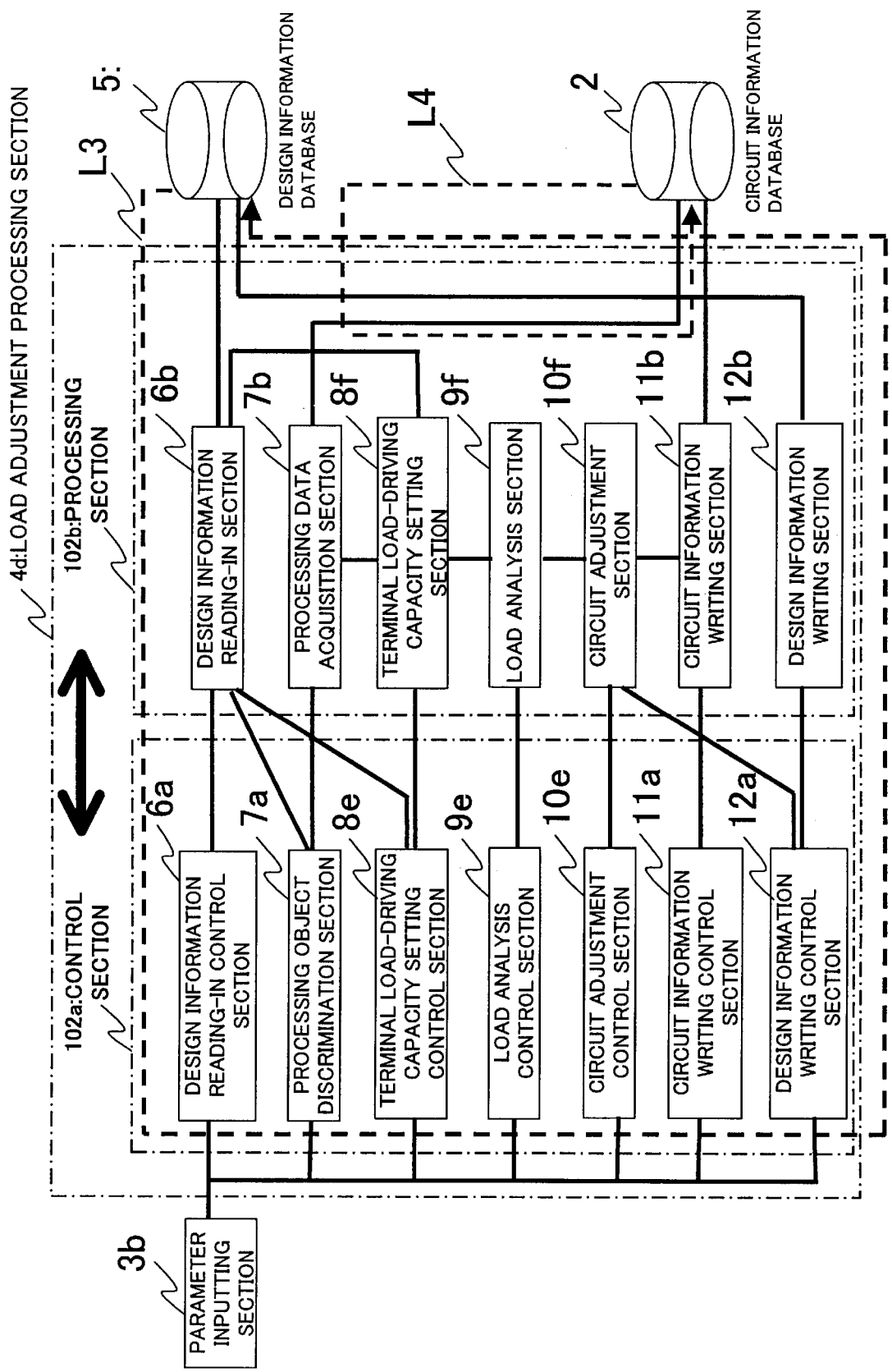
FIG. 4 is a block diagram of a load adjustment process section according to the first embodiment of the present invention.

FIG. 4 is a block diagram of the load adjustment processing section 4d according to the first embodiment of the present invention. The load adjustment processing section 4d shown in FIG. 4 includes a processing section 102b for processing a circuit and a control section 102a for controlling the processing section 102b. The load adjustment processing section 4d is connected to the circuit information database 2 and the design information database 5.

The processing section 102b is different from the processing section 100b of the peculiarizing processing section 4b in that it includes a terminal load-driving capacity setting section 8f, a load analysis section 9f and a circuit adjustment section 10f. The control section 102a is different from the control section 100a of the peculiarizing processing section 4b in that it includes a load terminal-driving capacity setting control section 8e, a load analysis control section 9e and a circuit adjustment control section 10e.

The terminal load-driving capacity setting section 8f provides load information and driving capacity information obtained by the load adjustment process of a hierarchically lower layer regarding each of hierarchically lower layer terminals referred to from the circuit of the hierarchically higher layer. The terminal load-driving capacity setting section 8f sets a deemed load capacity value of each hierarchical layer terminal stored in the design information database 5.

The load analysis section 9f analyzes a terminal capacity which can be driven by each logic gate (logic element) to extract undrivable terminals. Particularly, the load analysis section 9f evaluates the driving capacities of the logic gates and the total load capacity calculated from load capacities and wiring line capacities of logic gates to be driven and hierarchical layer terminals of the processed hierarchical layer to extract undrivable portions. The load capacities and the driving capacities of the hierarchical layer terminals of the processed hierarchical layer are used by the terminal load-driving capacity setting section 8f making use of the information stored in the design information database 5.

More specifically, when the driven side is a logic gate, the load capacity value of it is acquired from a technology library (not shown). Meanwhile, the load capacity of a wiring line to be driven is calculated based on the wiring line length and the number of branches. Further, where the driving side is a logic gate, the driving capacity value of it is acquired from the technology library.

The circuit adjustment section 10f adjusts an undrivable terminal extracted by the load analysis section 9f. More particularly, the circuit adjustment section 10f adjusts such that it replaces a logic gate from which an error has been extracted by the load analysis section 9f with another logic gate having a higher driving capacity or it inserts a buffer into a portion of a circuit which has a comparatively great number of fan-outs to distribute the load. By the adjustment, each terminal of the circuit is adjusted so as to have an appropriate capacity.

The load terminal-driving capacity setting control section 8e, load analysis control section 9e and circuit adjustment control section 10e control the terminal load-driving capacity setting section 8f, load analysis section 9f and circuit adjustment section 10f, respectively.

Similarly as in the peculiarizing processing section 4b (refer to FIG. 2), information necessary for control is inputted from the design information database 5 to the control section 102a along a route denoted by L3, and data of a design object are supplied from the design information database 5 along another route denoted by L4 to the processing section 102b, by which they are processed.

Consequently, design information adjusted for each of divisional units in load adjustment and including a load and a driving capacity determined from specifications of logic gates in the inside of a hierarchical layer and set to each terminal of the hierarchically highest layer of the unit is produced. Then, upon execution of load adjustment in a hierarchically higher layer, information of the load and the driving capacity is acquired from the design information database 5 to perform necessary processing.

Now, a load adjustment process is described with reference to FIGS. 11(a) to 11(d).

FIGS. 11(a) to 11(d) are diagrammatic views illustrating a load adjustment process in hierarchical design according to the first embodiment of the present invention. The load adjustment process is performed principally by the circuit adjustment section 10f. A chip 83 shown in FIG. 11(a) contains modules A, B, C and D, and a logic gate (which may be hereinafter referred to simply as gate) LG may be present between the modules A and B.

Figure 11A:
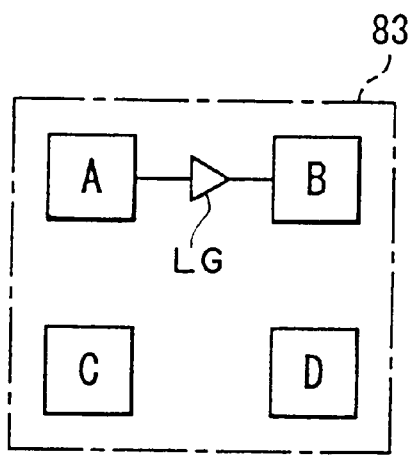
FIGS. 11(a) to 11(d) are diagrammatic views illustrating a load adjustment process in the hierarchical design according to the first embodiment of the present invention.
Figure 11B:
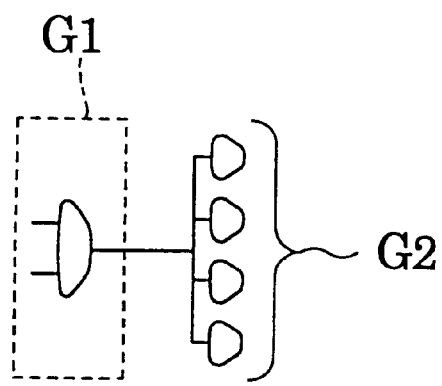
Figure 11C:
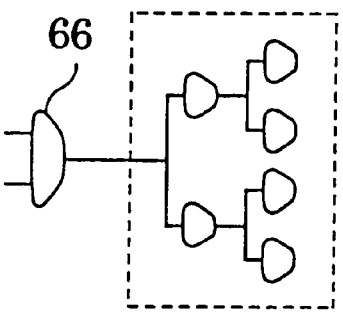

First, load adjustment of the module A and so forth is performed. The module A contains a circuit formed from logic gates as seen in FIG. 11(b). The gate G1 shown in FIG. 11(b) drives four logic gates of a gate group G2 and therefore may possibly be insufficient in driving capacity, resulting in failure in driving. Here, in order to make such driving possible, either the gate G1 is replaced by another logic gate of the same logic but having a higher driving capacity or a buffer 66 is inserted as seen in FIG. 11(c) so that the number of logic gates to be driven by each logic gate is reduced. One of such methods is used to process the load adjustment of the individual modules A to D.

If the load adjustment of the module A is processed, then it is possible for an input terminal of one of module terminals (also called hierarchical terminals) to representatively have a load capacity value for logic gates driven from the input terminal and for an output terminal of one of the module terminals to representatively have a driving capacity for logic gates from which signals are transmitted to the output terminal.

Figure 11D:
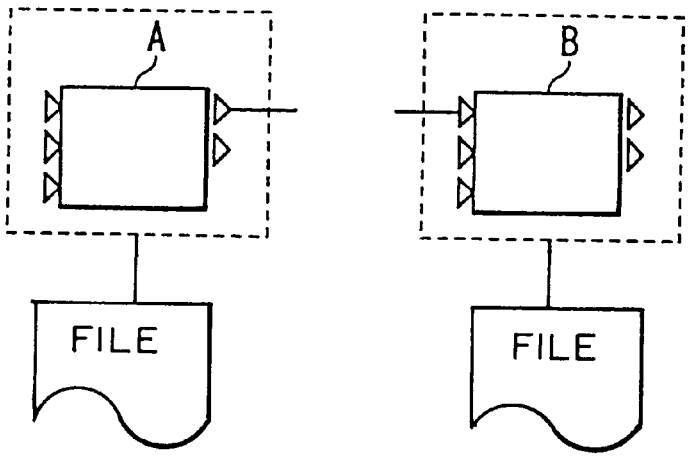

Thus, terminal load-driving capacity information of each of the modules A to D is written as a file into the design information database 5 as seen in FIG. 11(d).

Consequently, in hierarchical design, after load adjustment of the modules A to D is completed once, load adjustment of the chip level is executed, and information regarding the driving capacities and the loads of the modules A to D is utilized.

Further, the load adjustment processing section 4d shown in FIG. 4 accesses, when a hierarchically higher layer is to be processed, the design information database 5 in place of the circuit information database 2 to acquire processing results and so forth obtained when a hierarchically lower layer contained in the hierarchically higher layer is designed as a unit to be processed, and automatically discriminates a processed portion of the higher layer, similarly to the peculiarizing processing section 4b and the test circuit production processing section 4c.

Consequently, the circuit information database 2 regarding the hierarchically lower layer is not necessary, and the capacity of the working memory in circuit calculation can be saved significantly.

Subsequently, flows of circuit data in the circuit designing apparatus having the construction described above are described with reference to FIG. 12, and hierarchical design is described with reference to FIGS. 13 and 14, whereafter ECO design is described in detail with reference to FIGS. 15 and 16.

Figure 12:
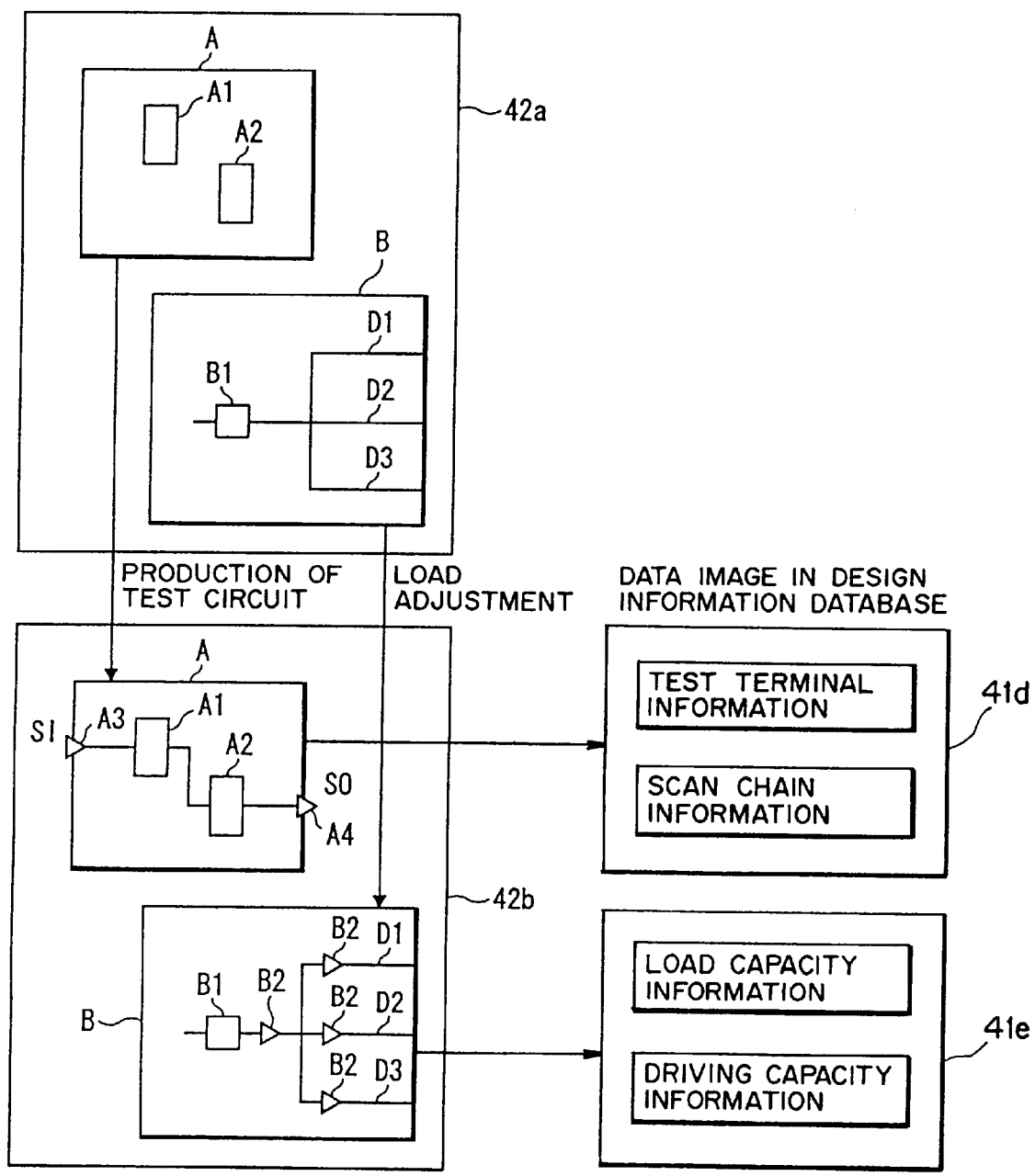
FIG. 12 is a diagrammatic view illustrating flows of circuit data according to the first embodiment of the present invention.

FIG. 12 is a diagrammatic view illustrating flows of circuit data according to the first embodiment of the present invention. Referring to FIG. 12, a circuit module image 42a (hereinafter referred to simply as module 42a) shown is a data image stored in the circuit information database 2 and contains sub modules A and B (denoted by A and B, respectively). The sub module A contains circuit elements A1 and A2, and the sub module B contains a circuit element B1 and wiring lines D1, D2 and D3.

Another circuit module image 42b (hereinafter referred to as module 42b) is a data image after processed by the automatic designing processing section 3. In the sub module A of the module 42a, a wiring line is located between the circuit elements A1 and A2 and test terminals A3 and A4 (denoted by SI and SO, respectively) are provided by a test circuit production process. In the sub module B of the module 42a, the circuit element B2 is provided for the wiring lines D1 to D3.

Data images 41d and 41e are stored in the design information database 5, and information of test terminals and information of a scan chain generated by the test circuit production process are stored as circuit production information of the sub module A of the module 42b. Further, information generated by a load adjustment process is stored as load capacity information and driving capacity information of the sub module B.

Thus, in order to process the module 42a at a time, even where the working memory is insufficient in capacity, processing of the sub module A, processing of sub module B and processing of the module 42a in which the design information database 5 is utilized are performed successively. Consequently, the module 42a can be processed with the working memory of a comparatively small capacity.

Figure 13:
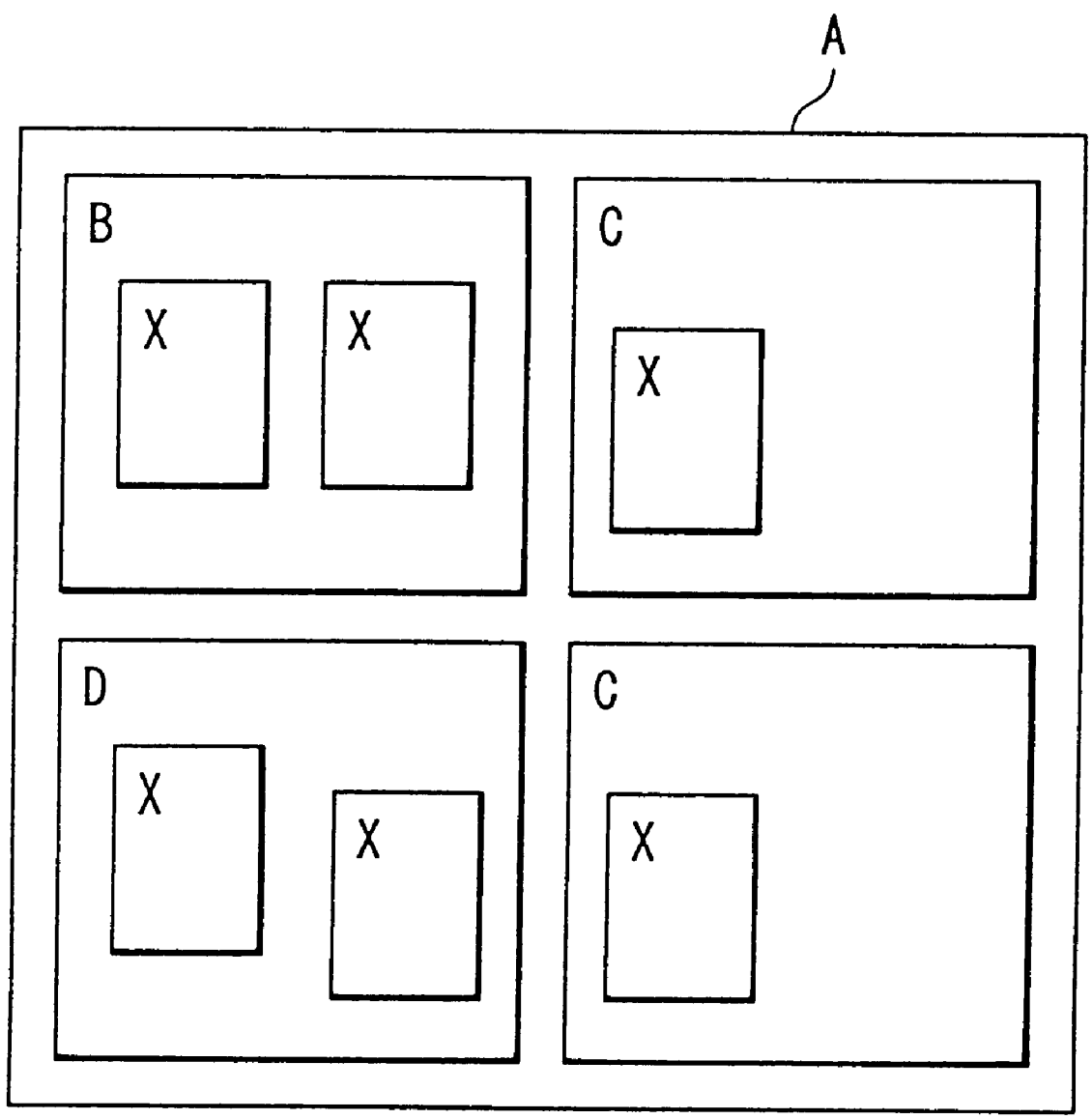
FIG. 13 is a diagrammatic view showing a data image of a semiconductor circuit according to the first embodiment of the present invention.

FIG. 13 is a diagrammatic view showing a data image of a semiconductor circuit A according to the first embodiment of the present invention. Referring to FIG. 13, the semiconductor circuit A shown is a chip (which may be hereinafter referred to as chip A) in a predetermined hierarchical layer and contains circuit modules B and D (hereinafter referred to simply as modules B and D) and two circuit modules C (hereinafter referred to simply as modules C). Each of the modules B, C and D contains a sub module or sub modules X.

Regarding the semiconductor circuit A, an HDL conversion process, a peculiarizing process, a test circuit production process, and a load adjustment process are executed for the modules B, C, D, X, A in this order.

It is to be noted that, in the following description, the term module is used also to signify a unit (a unit to be processed or a processed unit).

Figure 14:
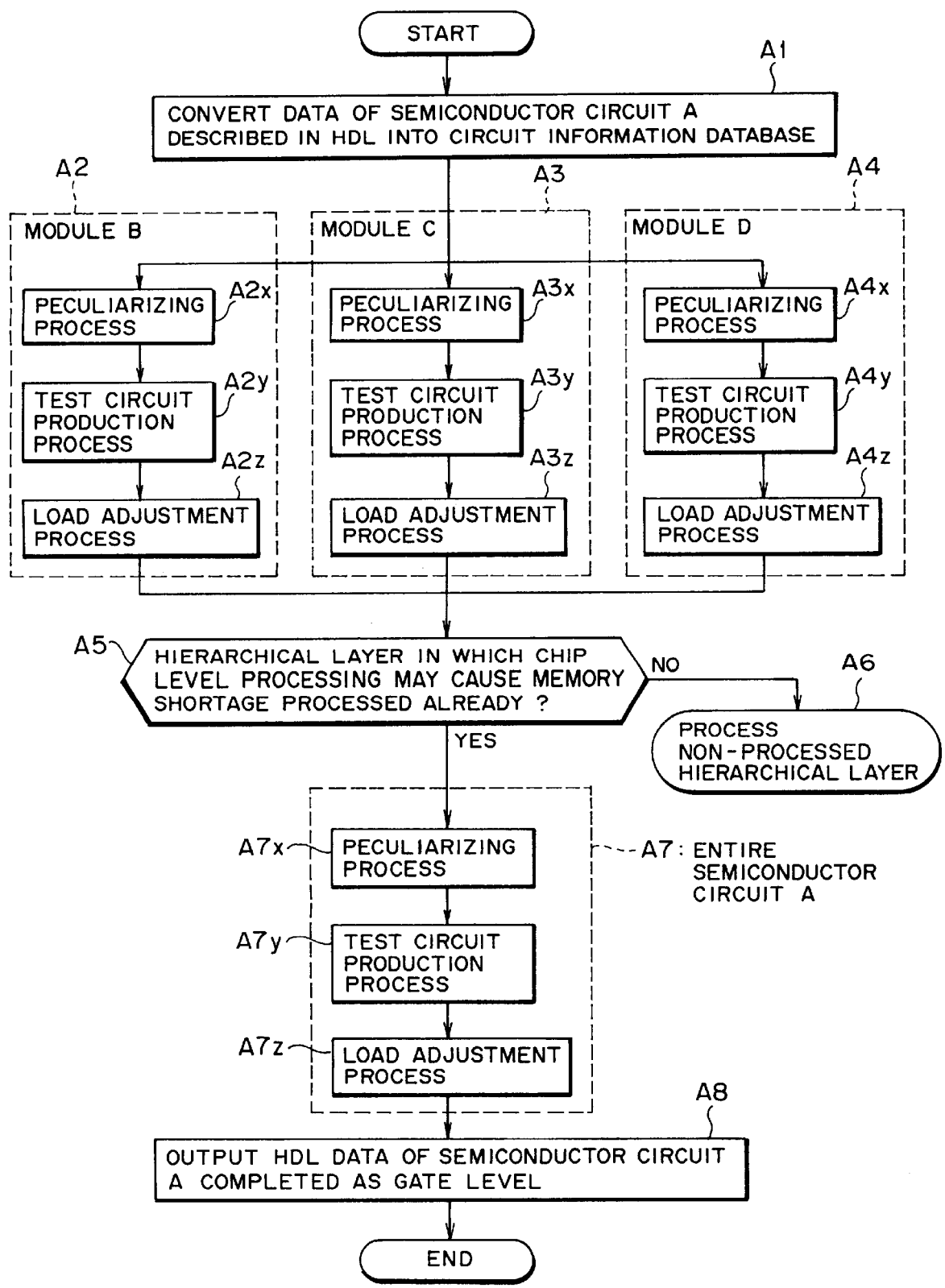
FIG. 14 is a flow chart illustrating the hierarchical design according to the first embodiment of the present invention.

FIG. 14 is a flow chart illustrating hierarchical design according to the first embodiment of the present invention. Referring to FIG. 14, first in step A1, data of the semiconductor circuit (chip) A described in the HDL are converted into the circuit information database 2. As a result of the HDL conversion, the modules B, C and D are stored into the circuit information database 2.

Then, processing of the module B and the modules which belong to the module B is performed in step A2. In particular, a peculiarizing process is performed (step A2x), and a test circuit production process is performed (step A2y), whereafter a load adjustment process is performed (step A2z). Information changed through the processes is stored into the design information database 5.

Then, processing of the modules C and the modules which belong to the modules C is performed in step A3. In particular, a peculiarizing process is performed (step A3x), and a test circuit production process is performed (step A3y), whereafter a load adjustment process is performed (step A3z). Information changed through the processes is stored into the design information database 5.

Then, processing of the module D and the modules which belong to the module D is performed in step A4. In particular, a peculiarizing process is performed (step A4x), and a test circuit production process is performed (step A4y), whereafter a load adjustment process is performed (step A4z). Information changed through the processes is stored into the design information database 5.

Then in step A5, it is discriminated whether or not a hierarchical layer which may possibly suffer from shortage of the capacity of the working memory as a result of a chip level process has been processed already. If such a hierarchical layer has not been processed as yet, then the processing follows the N route, and the hierarchical layer which has not been processed as yet is processed in step A6. However, if the hierarchical layer has been processed already, then the processing follows the Y route.

When the chip A is to be processed in step A7, since information of the modules B, C and D contained in the chip A is already stored in the design information database 5, the information of the chip A is read in from the circuit information database 2 and necessary information is acquired from the design information database 5, and the circuit is changed. Further, the entity regarding the module or modules processed already is not referred to.

First, a portion of the chip A which is not processed as yet is subject to a peculiarizing process (step A7x), a test circuit production process (step A7y) and a load adjustment process (step A7z). In the test circuit production process and the load adjustment process, the information of the modules B, C and D stored in the design information database 5 is referred to, to change the circuit of the chip A. Here, the circuit information of the entity is not referred to. Then, in step A8, data (HDL data and so forth) of the gate level of the chip A completed as a gate level are outputted, whereafter the processing advances to a physical design step.

In this manner, when the information of the chip A is read in from the circuit information database 2, only necessary information is acquired from the design information database 5 and design is performed without acquiring information regarding a circuit for which no change is necessary.

In this manner, also where a module processed in this manner is plural-referred to, the circuit of a module in a hierarchically higher layer can be changed using the information stored in the design information database 5.

Now, an ECO process is described.

Figure 15:
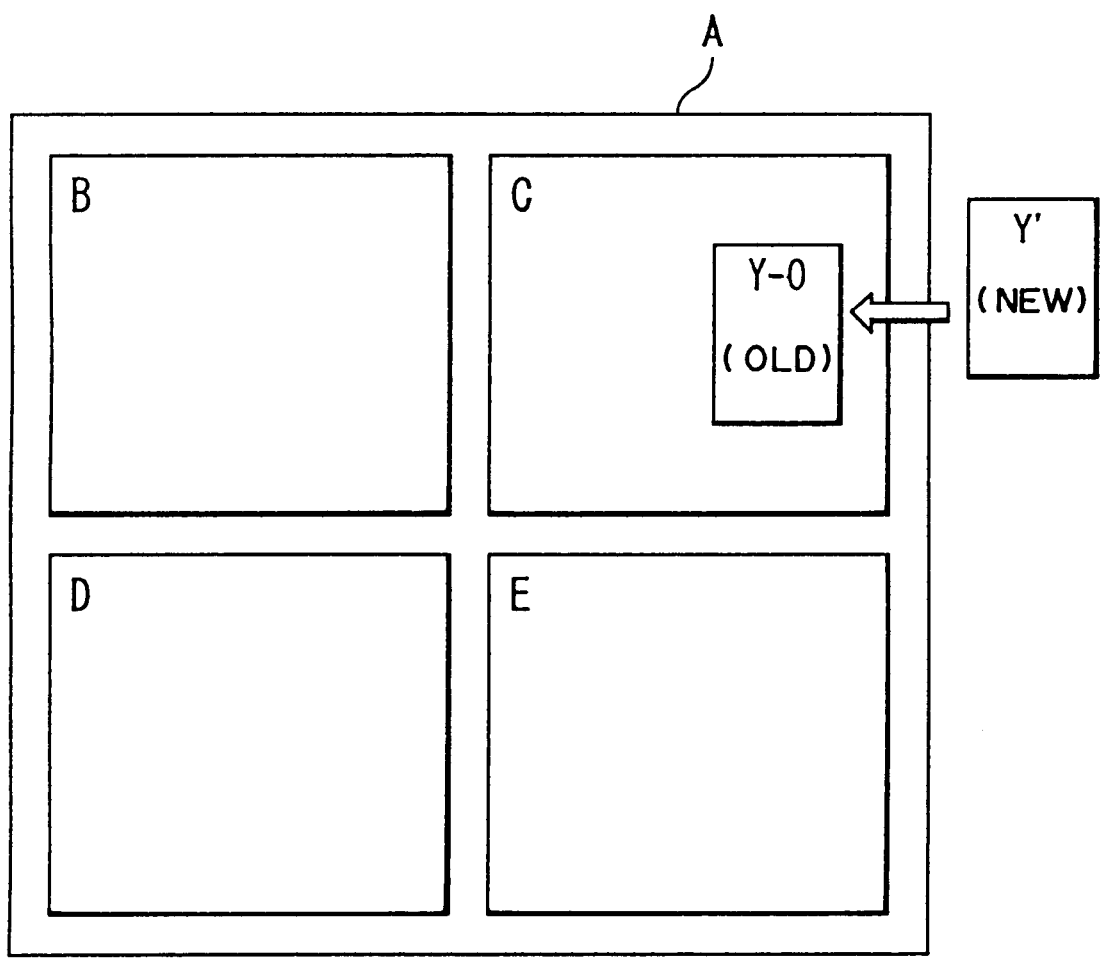
FIG. 15 is a diagrammatic view showing a data image of another semiconductor circuit according to the first embodiment of the present invention.

FIG. 15 is a diagrammatic view showing a data image of another semiconductor circuit (chip) A according to the first embodiment of the present invention. Referring to FIG. 15, the chip A shown contains circuit modules B, C, D and E (hereinafter referred to simply as modules B, C, D and E). A sub module Y-0 whose design has been completed by the designer is contained in the module C. The sub module Y-0 is replaced with another sub module having the name Y' by design change of the designer. It is to be noted that the names A, B, C and D appearing in FIG. 15 are different from those which appear in FIGS. 13 and 14.

It is a premise that the entire chip A of an object of design has been designed already using the designing apparatus 1.

It is assumed that the designer holds not only the circuit information database 2 which includes circuit information of the module of an object of ECO process but also the design information database 5 completed upon completion of the design of the chip A.

When the logic of the circuit is not to be changed, the designer does not change the circuit whose design has been completed using the designing apparatus 1, but changes the circuit prior to such change. This circuit was produced based on specifications by the designer itself. Then, the changed information is re-inputted to the circuit information database 2 through HDL conversion.

Then, the designer inputs a name of the changed module as a parameter to the designing apparatus 1. The designing apparatus 1 reads out hierarchical layer information in the design information database 5 based on the name, and selectively reads out only necessary circuit information from within the circuit information database 2 and loads the circuit information into the working memory.

If the module of an object of the ECO design is a plural-referred module and besides need be peculiarized, the designing apparatus 1 refers to the peculiarizing information of the design information database 5. Then, if the module referred to has been present upon preceding peculiarizing, then the same name is applied again.

On the other hand, if the module referred to has not been present upon peculiarizing of the design information database 5 and has been added newly, then the designing apparatus 1 applies a name which does not overlap with the names of the other modules within the range of the information stored in the design information database 5 being currently referred to.

However, when the designer adds a terminal which was not present upon preceding processing or conversely removes a terminal and currently proceeding design is not the ECO design, the designing apparatus 1 determines that an error has occurred as violation of the HDL description. On the other hand, when ECO design is proceeding, the designing apparatus 1 refers to the design information database 5 to acknowledge the temporary mismatching.

Further, the designing apparatus 1 refers to the design information database 5 to restore a circuit same as a circuit added upon preceding processing as far as possible even if it is included in the module of an object of the ECO design. In this instance, a corresponding relationship between the information in the design information database 5 and the circuit of the module of an ECO design object is discriminated based on coincidence between the instance names or the like, and they are processed so as to be included in an additional circuit of a construction same as that upon preceding processing.

Figure 16B:
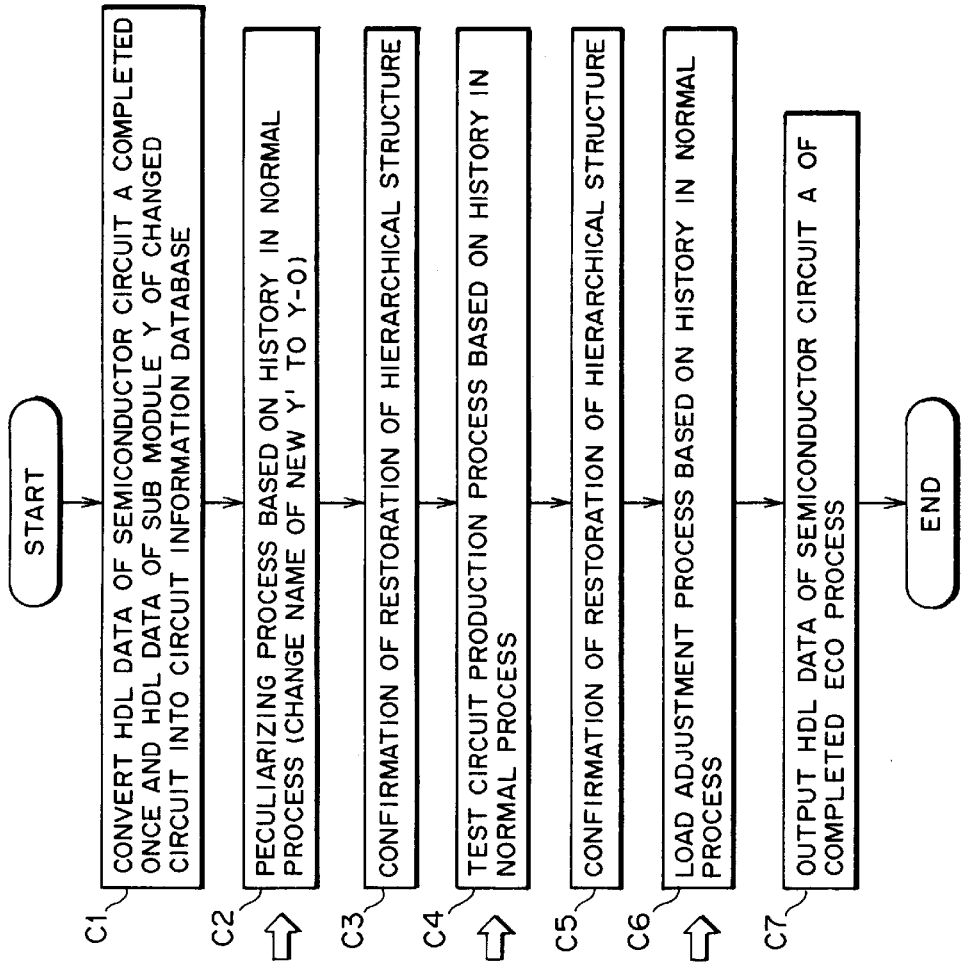
FIGS. 16(a) and 16(b) are flow charts illustrating an ECO process according to the first embodiment of the present invention.
Figure 16A:
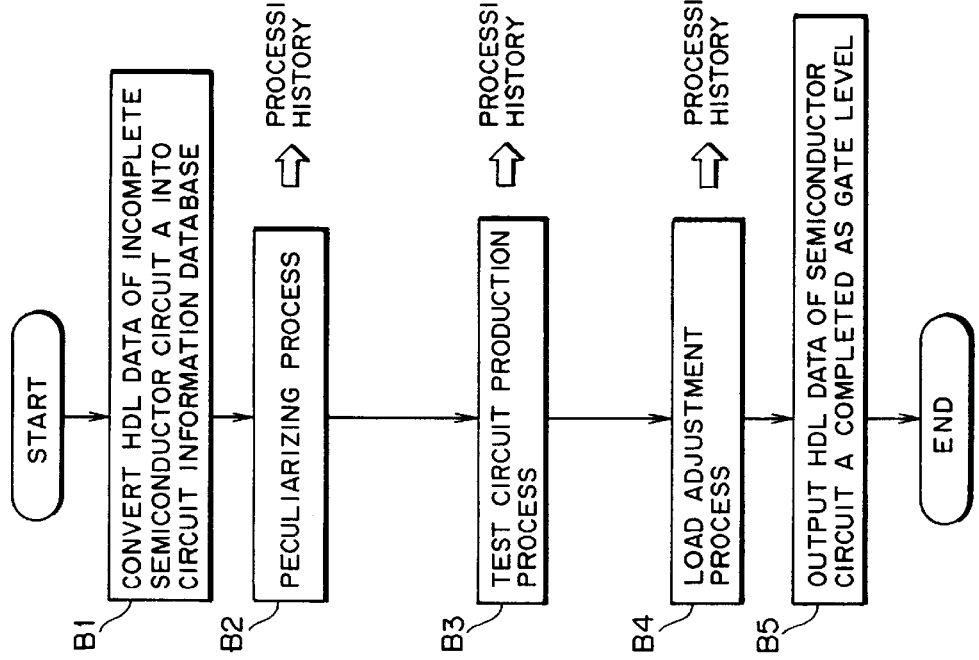

An ECO process is described with reference to FIGS. 16(a) and 16(b). FIGS. 16(a) and 16(b) are flow charts illustrating an ECO process according to the first embodiment of the present invention, and more particularly, FIG. 16(a) illustrates a normal process and FIG. 16(b) illustrates the ECO process of the present invention.

Referring first to FIG. 16(a), HDL data of a semiconductor circuit A which is not completed as yet are converted into the circuit information database 2 (step B1) and then successively undergo a peculiarizing process (stepB2), a test circuit production process (step B3) and a load adjustment process (step B4). Then, HDL data of the semiconductor circuit A completed as gate level data through the processes are outputted (step B5).

Referring now to FIG. 16(b), the HDL data of the semiconductor circuit A completed once and HDL data of the module Y whose circuit has been changed are individually converted into the circuit information database 2 in step C1. Then in step C2, a peculiarizing process is performed based on the history upon the normal process to obtain a new sub-module Y', and the name Y' is changed to another name Y-0. Further, restoration of the hierarchical structure is confirmed in step C3, and a test circuit production process is performed based on the history upon the normal process in step C4. Then, restoration of the connection relationship is confirmed in step C5, and a load adjustment process is performed based on the history upon the normal process in step C6, whereafter HDL data of the semiconductor circuit A whose ECO process has been completed are outputted in step C7.

In this manner, in hierarchical design or ECO design of a large scale semiconductor circuit, the designing apparatus 1 of the present invention does not refer to the circuit information database 2 in regard to any component of the circuit but refers to the design information database 5 extracted automatically upon processing of each hierarchical layer or upon preceding processing to automatically recognize a relationship between individual modules and performs necessary processing based on the recognized relationship. Therefore, the used amount of the working memory can be optimized and the burden to the designer can be reduced to a level similar to that upon collective design.

Further, since all steps are automated in this manner, a plurality of processes can be executed continuously, which reduces the processing time and hence reduces the design period and besides augments the design efficiency in the peculiarizing process, test circuit production process and load adjustment process.

Thus, for example, boundary information of terminals and design information of the terminals and so forth are automatically inputted, and a portion other than a processing object in current processing is automatically discriminated from history information. Further, design information of the portion other than the processing object is automatically extracted and used for processing of a portion being currently designed.

Accordingly, hierarchical design can be realized readily in this manner, and hierarchical design of a large scale circuit can be performed very efficiently.

B. Second Embodiment of the Invention

The second embodiment of the present invention is a timing distribution apparatus for circuit design. In the circuit design, timing distribution including PCB design and LSI design is designed.

Figure 17:
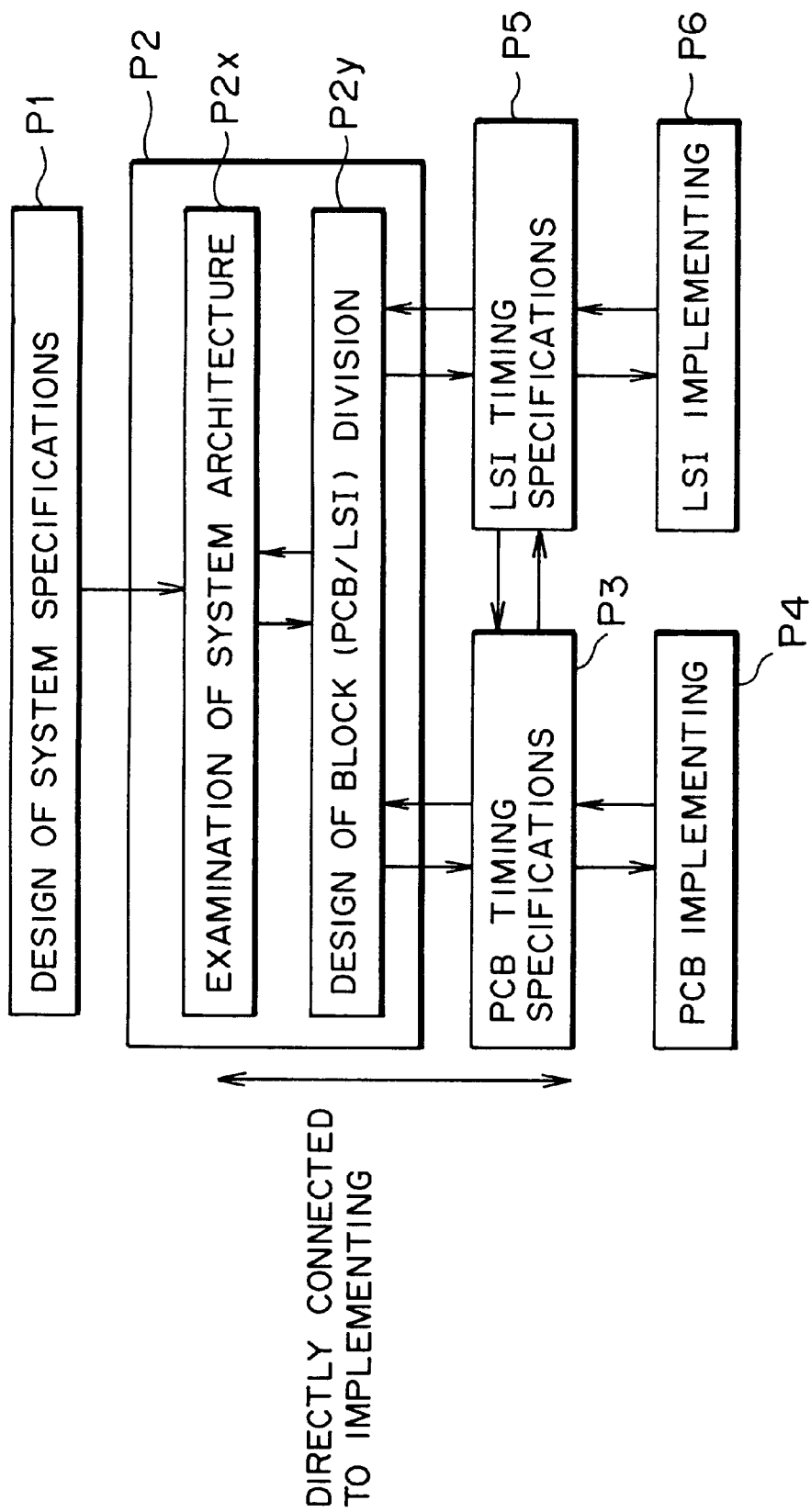
FIG. 17 is a flow diagram illustrating a process of circuit design according to a second embodiment of the present invention.

FIG. 17 is a diagrammatic view illustrating different steps of circuit design according to the second embodiment of the present invention. Referring to FIG. 17, system specifications are designed first in step P1, and then in step P2, a system architecture is examined (step P2x) and block division of a PCB and an LSI is designed (step P2y). Then timing specifications of the PCB are designed in step P3, and then the PCB is implemented in step P4. On the other hand, for the LSI, timing specifications are designed in step P5, and then the LSI is implemented in step P6.

The design of timing specifications of the PCB and the design of timing specifications of the LSI can be proceeded with data shared closely with each other. The timing distribution apparatus of the present invention is preferably used in steps P2 to P3 or steps P2 to P5 and is preferably used for distributed design. The timing distribution apparatus has a significant influence upon implementing of the PCB or the LSI. It is to be noted that, while the timing specifications in steps P3 and P5 are designed independently of each other, data during the design can be referred to with each other.

Figure 18:
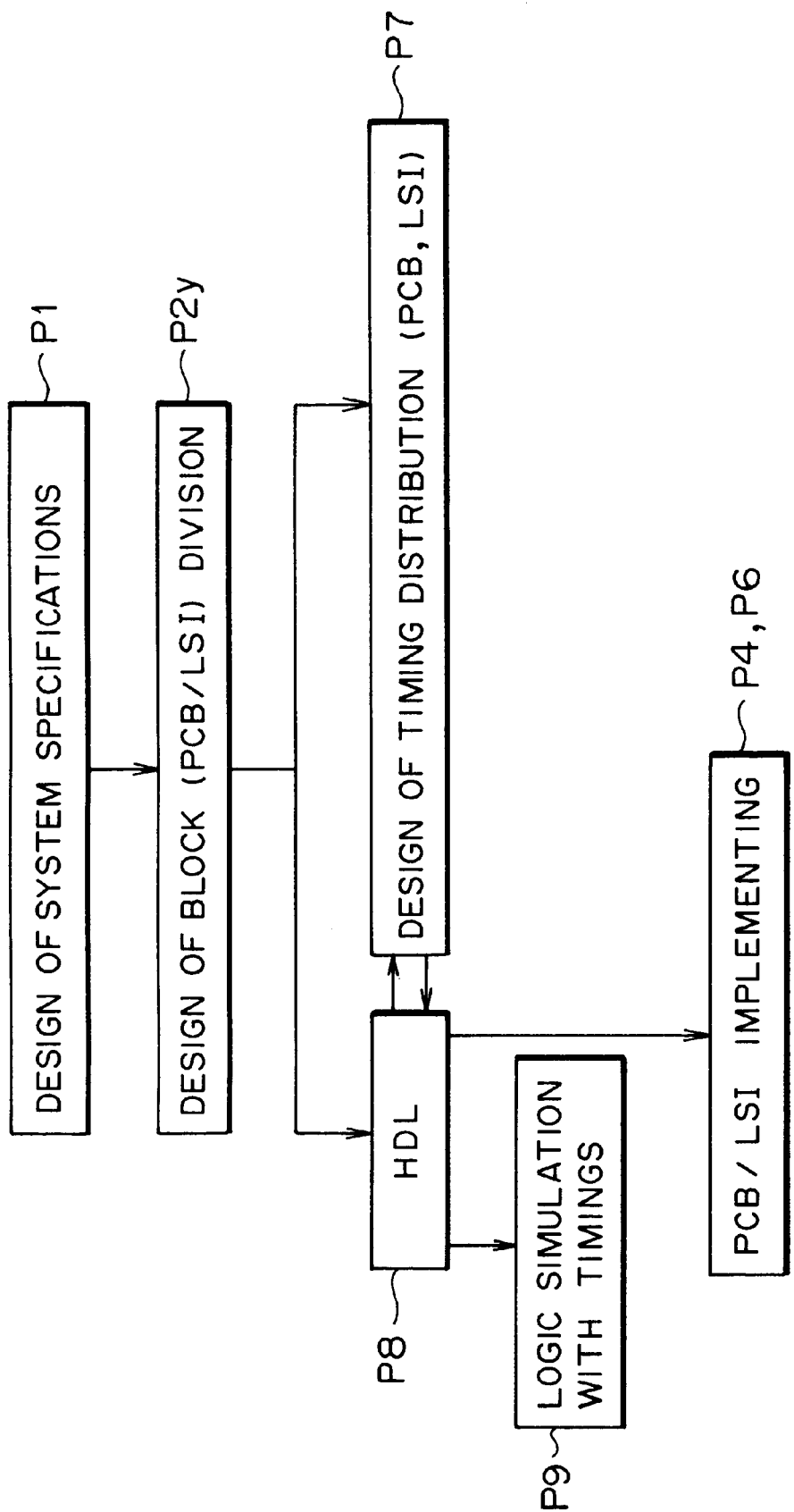
FIG. 18 is a flow diagram illustrating a process of block division design according to the second embodiment of the present invention.

FIG. 18 is a flowchart illustrating different steps of block division design according to the second embodiment of the present invention. In FIG. 18, each step having the same reference character as that in FIG. 17 denotes a similar step. Referring to FIG. 18, after system specifications are designed in step P1, a system architecture is divided into blocks of a PCB and an LSI and block information is produced in step P2y. Then timing distribution (PCB, LSI) is designed in step P7. More particularly, timing distribution is determined based on the block information, constraint definition information, an HDL source code (which may be hereinafter referred to simply as source code) and library data which is hereinafter described. Meanwhile, design contents are reflected on the source code in step P8, and a logic simulation with timings is enabled in step P9. Further, the PCB or the LSI is implemented in step P4 or P6.

Figure 19:
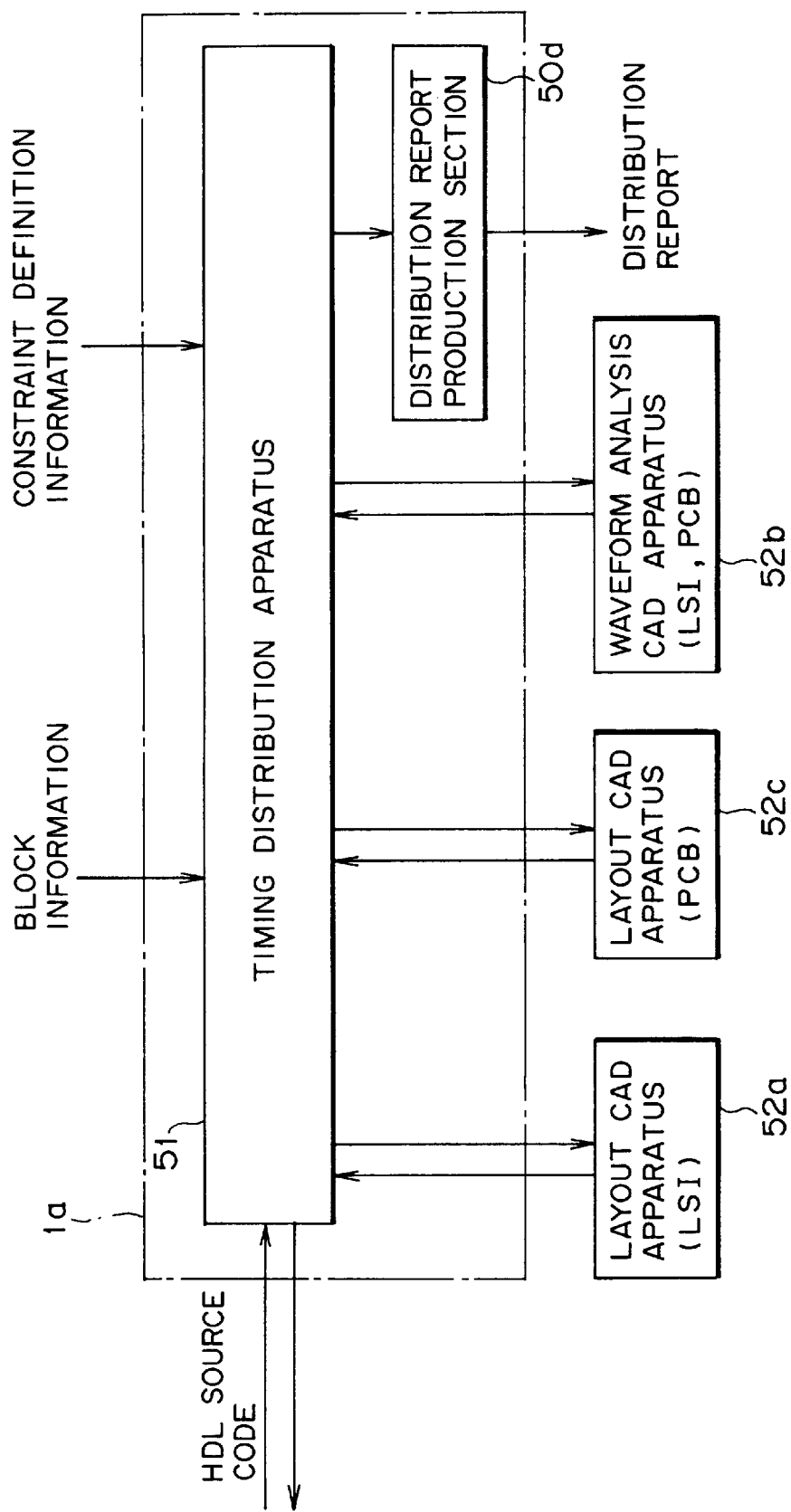
FIG. 19 is a block diagram of a circuit designing apparatus according to the second embodiment of the present invention.

FIG. 19 is a block diagram of a circuit designing apparatus according to the second embodiment of the present invention. Referring to FIG. 19, the circuit designing apparatus 1a (which may be hereinafter referred to simply as designing apparatus 1a) is used to design a circuit and includes a timing distribution apparatus 51 and a distribution report production section 50d. The designing apparatus 1a is connected to a pair of layout CAD apparatus 52a and 52c and a waveform analysis CAD apparatus 52b. The layout CAD apparatus 52a and 52c design layouts for an LSI and a PCB, respectively. The waveform analysis CAD apparatus 52b analyzes a waveform of a circuit and can be used for designing of both of an LSI and a PCB.

Figure 20:
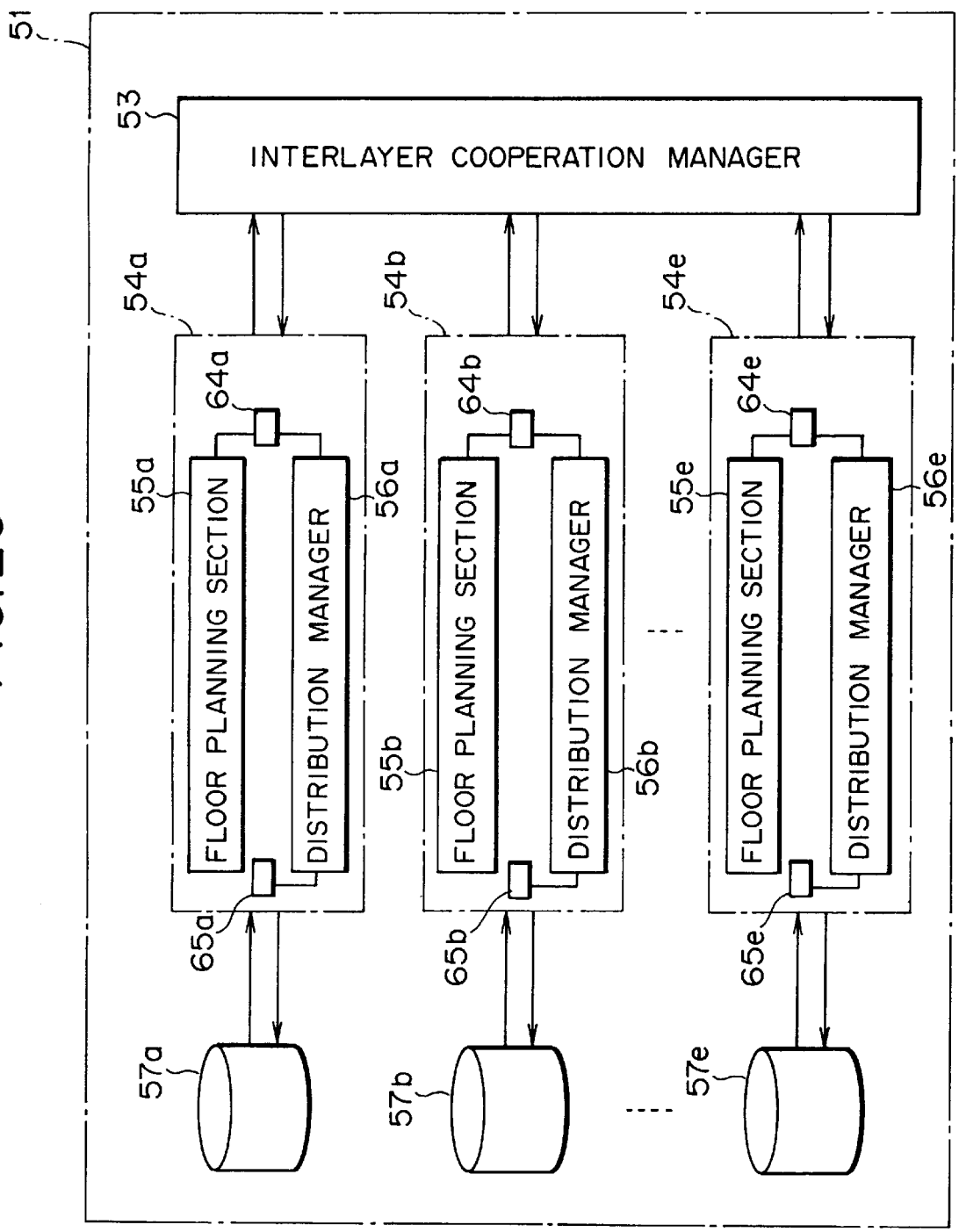
FIG. 20 is a block diagram of a timing distribution apparatus according to the second embodiment of the present invention.

FIG. 20 is a block diagram of the timing distribution apparatus 51 according to the second embodiment of the present invention. Referring to FIG. 20, the timing distribution apparatus 51 determines timing distribution values in hierarchical design and includes an interlayer association manager (which may be also hereinafter referred to as inter-hierarchical layer association manager) 53, timing distribution production sections 54a to 54e, and timing information databases 57a to 57e. It is to be noted that the term "timing information database" is represented briefly as TDB except for a timing information database itself.

The term "timing distribution values" (which may sometimes be referred to simply as distribution values) signifies first distribution values of wiring lines between circuit blocks and second distribution values in the inside of the circuit blocks. The first distribution values are distributed values regarding an inter-block wiring line delay value, a wiring line length and a wiring line load capacity, and the second distribution values are distributed values regarding a gate delay value determined taking a dispersion caused by a transistor manufacturing process and the temperature into consideration, a delay cycle number representative of the time until a process is completed and a delay value of a wiring line in the insider of a block.

The interlayer association manager 53 is connected to the timing distribution production sections 54a to 54e and transmits and receives modification information regarding the timing distribution values to and from the timing distribution production sections 54a to 54e. The timing distribution production sections 54a to 54e are provided corresponding individually to a plurality of design hierarchical layers. The timing distribution production sections 54a to 54e receive block information regarding a function of a circuit from the timing information databases 57a to 57e each having a netlist regarding a wiring scheme, respectively, and can output timing distribution values obtained by distributing delay values produced by delaying elements of the circuit.

The timing information databases 57a to 57e are databases by netlist representations and store constraint definition information of hierarchical layer entities and timing information after provisional layout and actual layout in a state wherein a wiring scheme is taken into consideration. It is to be noted that the storage contents with a wiring scheme taken into consideration are hereinafter described with reference to FIGS. 33(a) to 33(c).

The hierarchical layer entities manage information of the individual hierarchical layers and are hereinafter described with reference to FIGS. 21 and 22. Meanwhile, the netlist is an output in the form of a list of text files of parts, wiring line connection information, position information and so forth of a circuit. When the netlist is read in, all parts can be arranged on a circuit without the necessity for the designer to input parts one by one.

Further, the constraint definition information is constraint information regarding a timing and signifies information that there is a limitation that, for example, a signal must be transmitted from a terminal to another terminal in less than given nm (nanometer) and information of a location where arrangement of a part is inhibited, a height of a part and so forth in circuit design. The timing information signifies timing information after a floor plan (arrangement position information) is produced, and contents of the timing information are stored in a netlist representation with the wiring scheme taken into consideration. The netlist representation with the wiring scheme taken into consideration relates to application of a name to a netlist, and details of it are hereinafter described with reference to FIGS. 33(a) to 33(c).

Now, transmission/reception of distribution values between distribution managers 56a to 56e and the interlayer association manager 53 shown in FIG. 20 is described. A floor planning section 55a is connected to a logic/constraint information storage section 64a, and distributes timings based on a floor plan regarding arrangement of circuit elements and wiring lines between the circuit elements and provisionally locates the wiring lines. The distribution manager 56a is connected to the logic/constraint information storage section 64a and a timing information storage section 65a and outputs a delay value based on the netlist. The distribution managers 56b to 56e are connected to logic/constraint information storage sections 64b to 64e and timing information storage sections 65b to 65e, respectively, and output delay values based on the netlist. Details of the logic/constraint information storage section 64a and the timing information storage section 65a are hereinafter described with reference to FIG. 24.

Figure 21:
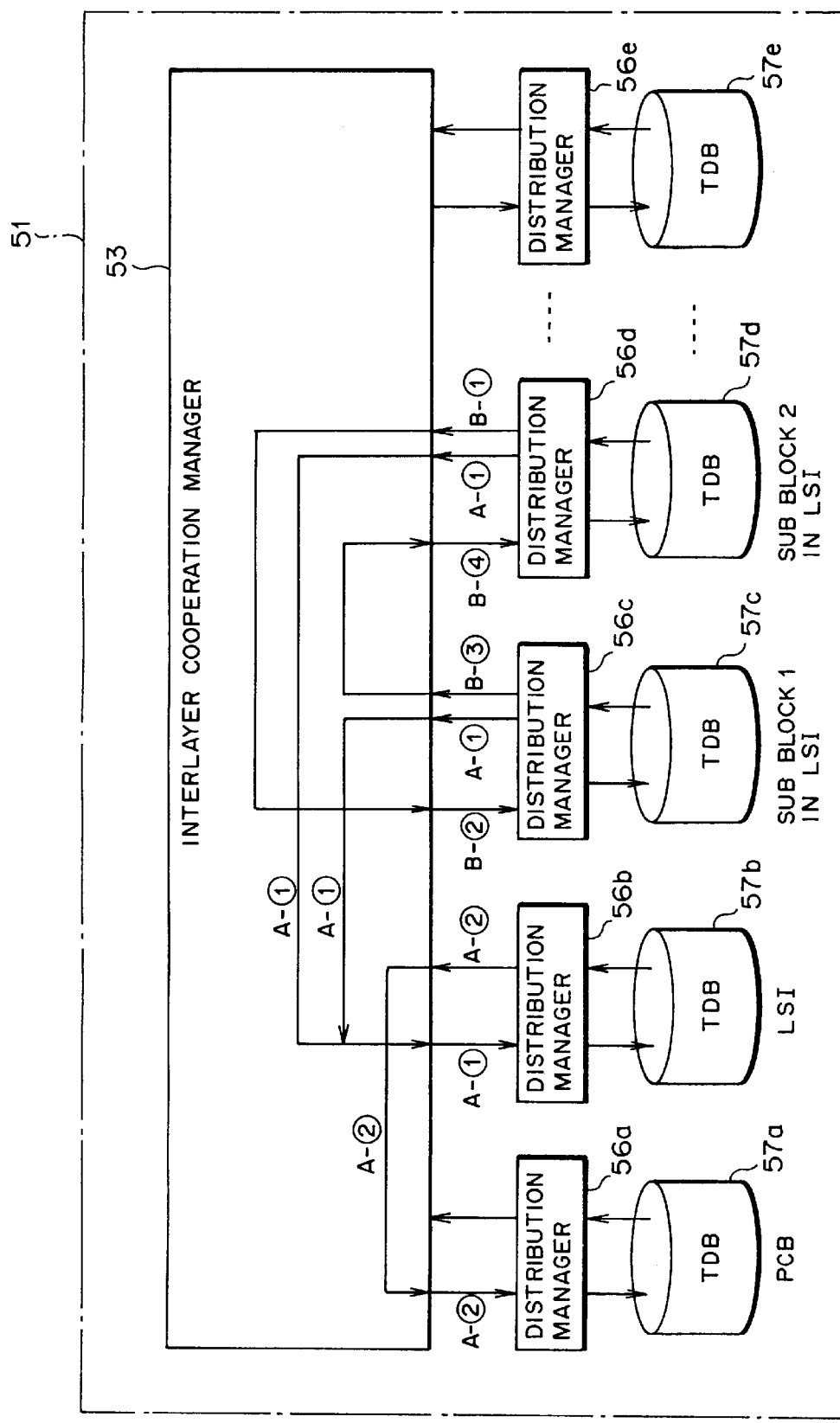
FIG. 21 is a diagrammatic view illustrating transmission and reception of distribution values between different hierarchical layers according to the second embodiment of the present invention.

FIG. 21 is a diagrammatic view illustrating transmission/reception of distribution values between hierarchical layers according to the second embodiment of the present invention. Referring to FIG. 21, the interlayer association manager 53 transmits and receives data to and from the distribution managers 56a to 56e, each of which takes charge of the individual hierarchical layer entities, to obtain necessary information.

Further, the interlayer association manager 53 receives a timing distribution specification changing request transmitted from one of the timing information databases 57a to 57e, extracts the other ones of the timing information databases 57a to 57e upon which a change of the timing distribution specifications may possibly an influence, and issues to the other ones of the timing information databases 57a to 57e an inquiry whether or not the timing distribution values can be changed. If a reply representing that the timing distribution values can be changed is received from all of the other ones of the timing information databases 57a to 57e, then the interlayer association manager 53 outputs to the one of the timing information databases 57a to 57e a signal representing that the timing distribution value can be changed. Further, if the timing distribution values are changed, then the entity or entities of the higher hierarchical layer or layers than the hierarchical layer for which the timing distribution values have been changed are updated.

In particular, any other hierarchical layer which is influenced by the change of the timing specifications by the designer is automatically extracted, and an inquiry of whether or not the change is allowable is issued to the timing information databases 57a to 57e of the hierarchical layer through the interlayer association manager 53 and the distribution managers 56a to 56e. Further, if responses to the inquiry all indicate that the change of the timing distribution values is permissible, then a change notification is issued to the designer. Consequently, the designer is notified of the change of the timing specifications rapidly.

Then, if the timing distribution values are changed, then only necessary portions are automatically fetched as timing distribution values from the timing information databases 57a to 57e of the hierarchical layer entity, whose timing has been changed, into the higher hierarchical layer entity than the hierarchical layer entity by the interlayer association manager 53.

It is to be noted that the distribution manager 56d shown in FIG. 21 is similar to the distribution manager 56a, and also the timing information database 57d is similar to the timing information database 57a. Thus, further overlapping description of the distribution manager 56d and the timing information database 57d are omitted herein to avoid redundancy.

Figure 22:
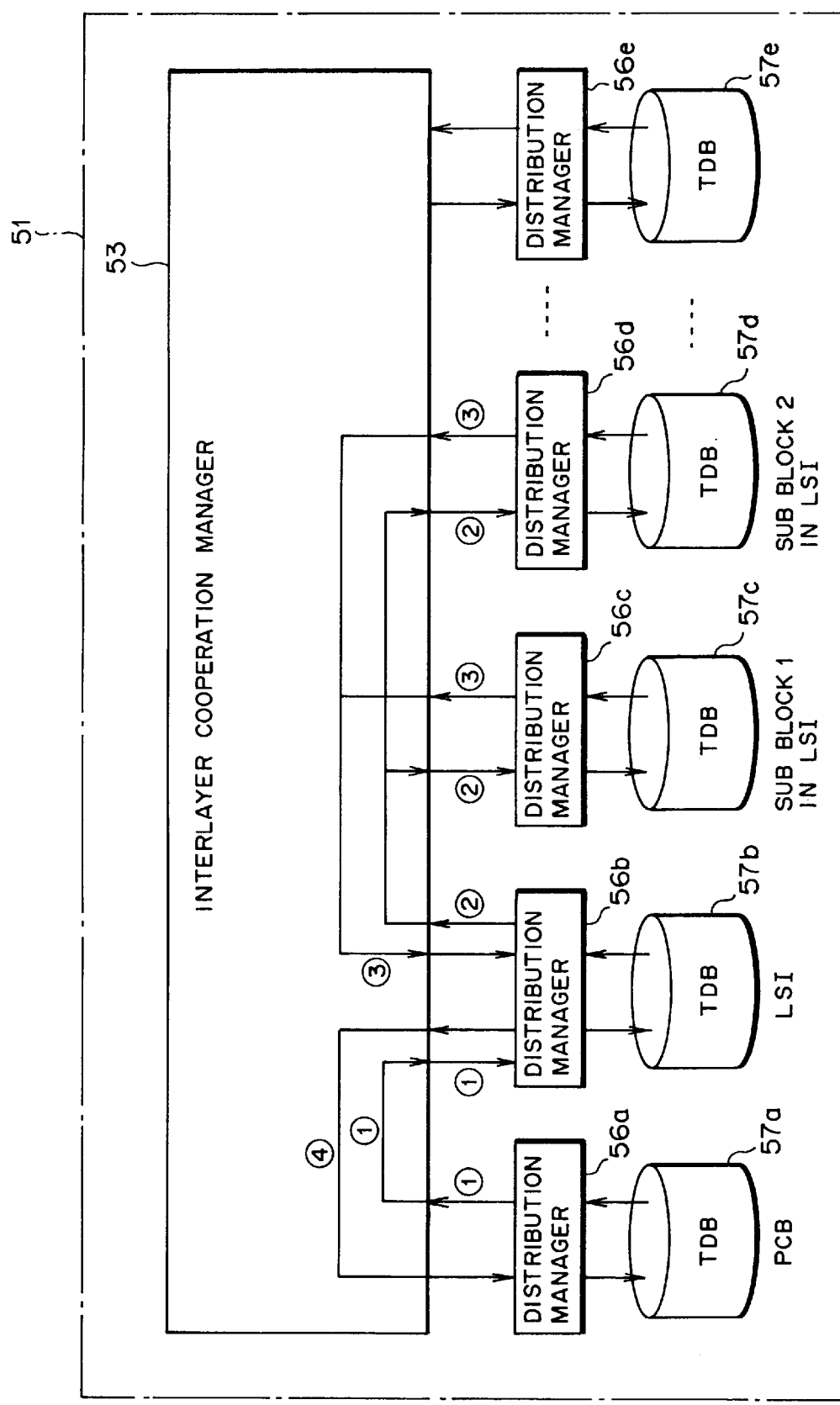
FIG. 22 is a similar view but illustrating transmission and reception of distribution values between a higher hierarchical layer and a lower hierarchical layer according to the second embodiment of the present invention.

FIG. 22 is a block diagram illustrating transmission/reception of distribution values between a higher hierarchical layer and a lower hierarchical layer according to the second embodiment of the present invention.

Thus, the highest hierarchical layer can obtain distribution values from the lower hierarchical layers, and consequently, static timing analysis (STA) for the entire system can be performed. The STA signifies that timing verification is performed without performing a test bench.

The interlayer association manager 53 extracts circuit blocks whose timing information data is insufficient and inputs them to the timing information databases 57a to 57e and notifies the designer of the circuit blocks. This augments the working efficiency of the designer.

Figure 23:
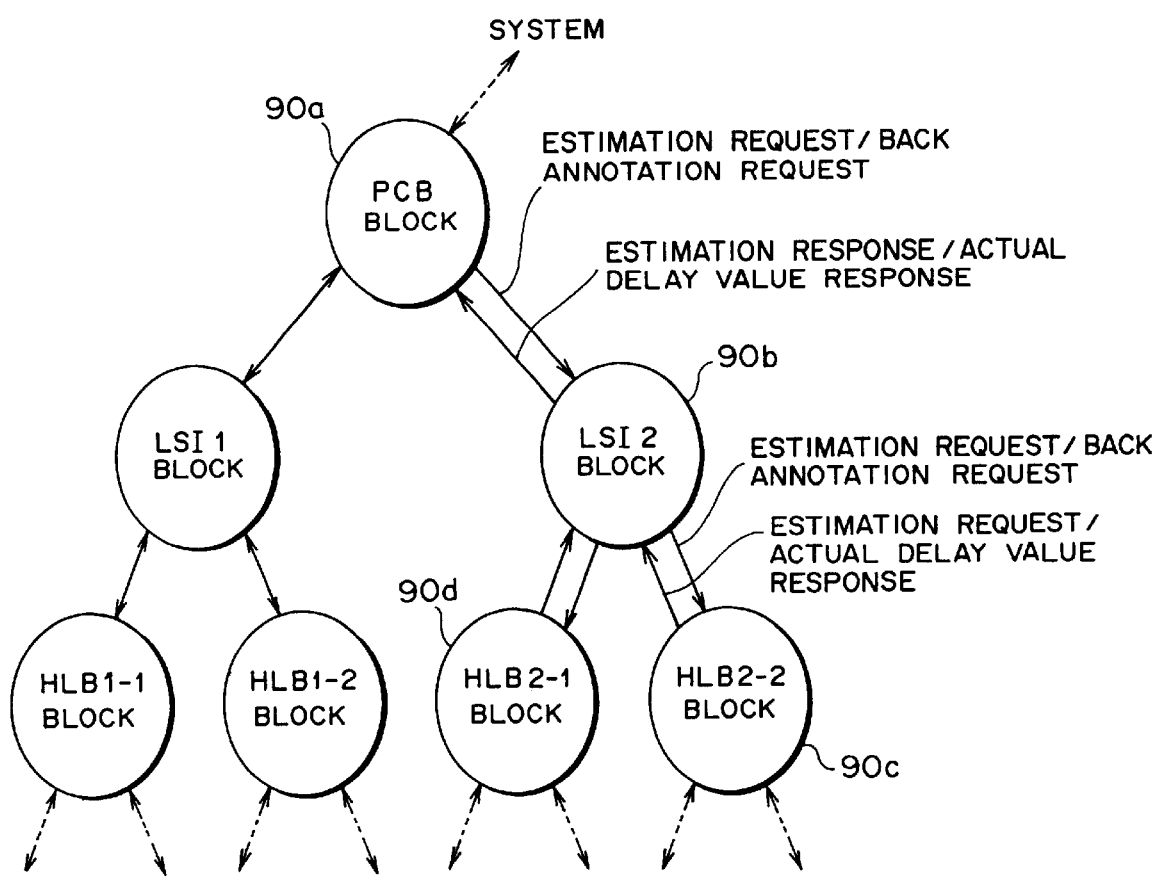
FIG. 23 is a diagrammatic view illustrating hierarchical entities according to the second embodiment of the present invention.

A schematic view of the distribution managers 56a to 56e shown in FIG. 21 is shown in FIG. 23.

FIG. 23 illustrates hierarchical layer entities according to the present invention. Circles shown in FIG. 23 individually represent hierarchical layer entities provided for the individual design hierarchical layers and form a tree structure. Each of the hierarchical layer entities is a set of pieces of necessary design information for each design hierarchical layer. Here, the design information includes the timing information databases, netlist, block information, constraint definition information, layout information, post provisional/actual layout, timing information and so forth.

Accordingly, in hierarchical design, hierarchical layer entities and a program for processing data of the hierarchical layer entities for each hierarchical layer are divided as one design hierarchical layer. In other words, timings of the entire system are distributed using object-orientation (agent-orientation).

Consequently, a plurality of design hierarchical layers can communicate with each other through the interlayer association manager 53.

A hierarchical layer entity 90a (PCB block) shown in FIG. 23 transmits an estimation request or a back annotation request to another hierarchical layer entity 90b (LSI 2 block) and receives an estimation reply or an actual delay value reply from the hierarchical layer entity 90b. The hierarchical layer entity 90b transmits a similar request to or receives a similar reply from each of a hierarchical layer entity 90c (HLB 2-2 block) and another hierarchical layer entity 90d (HLB 2-1 block). This similarly applies to any other hierarchical layer entity. Such an estimation request/back annotation request and an estimation reply/actual delay value reply are executed by a program of the interlayer association manager 53 and the distribution manager 56a. It is to be noted that the HLB (Hierarchy Layout Block) represents a sub-block in an LSI.

Accordingly, the timing distribution apparatus 51 is constructed as an agent which includes hierarchical layer entities provided individually corresponding to a plurality of design hierarchical layers and having design information and program data for processing the design information. Further, the interlayer association manager 53 is constructed as a manager connected to the timing distribution production sections 54a to 54e serving as agents and transmitting and receiving information regarding timing distribution values to and from each of the plurality of design hierarchical layers.

The interlayer association manager 53 (refer to FIGS. 21 and 22) can change the combination of the distribution managers 56a to 56e. Accordingly, the hierarchical layer entities corresponding to the interlayer association manager 53 and the distribution managers 56a to 56e can be changed freely and dynamically in response to a design object. Therefore, a plurality of circles which depend from (are connected to) a particular one of the circuits of the tree structure shown in FIG. 23 can be replaced collectively with another plurality of circuits.

Accordingly, the hierarchical entities can operate in a closely associated relationship with each other between different hierarchical layers in order from the entirety to a portion and from a portion to another portion. This facilitates discrimination of the designer of whether or not timing specifications divided by trial examination upon division of a circuit block of a design object into lower order blocks are allowable. In addition, since such division is performed from the higher order to the lower order, the designer can obtain timing distribution values first as rough values and then as detailed values. This allows, upon architecture design, estimation or examination of a portion which is critical in terms of the timing.

Further, advance validation can be performed for a portion which is critical in terms of the timing since actual layout is executed only for the object portion. Furthermore, since the designer can proceed with design referring to the distribution values of the other circuit blocks, wrong distribution can be prevented. The difference between a requested time (constraint) and an arriving time (delay value) is called slack margin, and the sign (positive/negative) of the value of the slack margin is used for examination. In particular, if the slack is in the negative, this indicates that the distribution is wrong in terms of the delay (delay violation), but if the slack is in the positive, this indicates that the distribution remains within the range of the requested timing. In case the request designated by the timing specifications cannot be satisfied upon implementing (delay violation), the negative slack can be improved by consuming a positive slack or slacks distributed to some other portion or portions.

It is to be noted that also the timing distribution production sections 54b to 54e have the same construction as that of the timing distribution production section 54a, and therefore, overlapping description of the same is omitted herein to avoid redundancy. Now, the timing distribution production section 54a shown in FIG. 20 is described with reference to FIG. 24.

Figure 24:
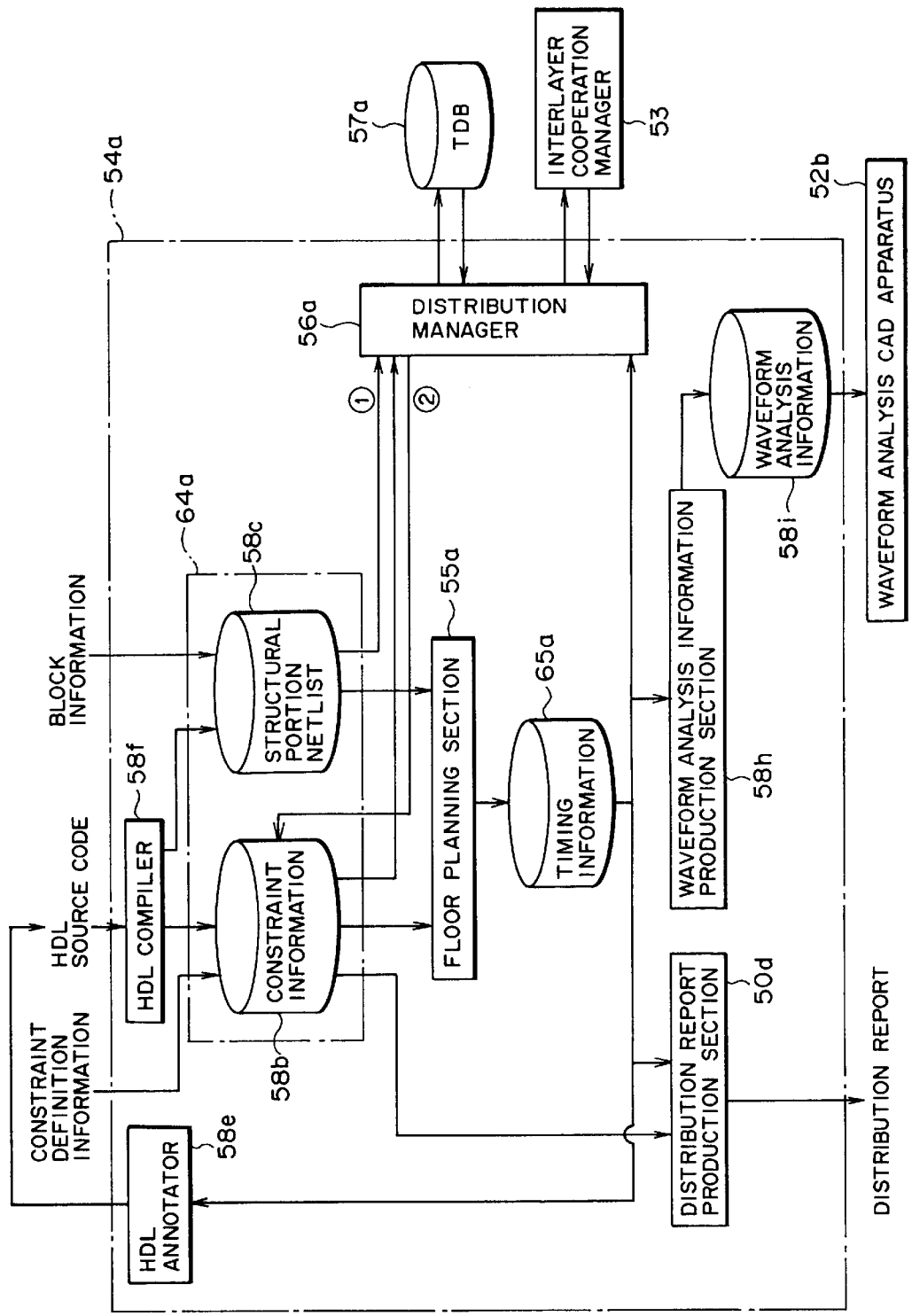
FIG. 24 is a block diagram of a timing distribution production section according to the second embodiment of the present invention.

FIG. 24 is a block diagram of the timing distribution production section 54a according to the second embodiment of the present invention. Referring to FIG. 24, the timing distribution production section 54a shown includes a floor planning section 55a, a distribution manager 56a, a logic/constraint information storage section 64a, a timing information storage section 65a, an HDL annotator 58e, an HDL compiler 58f, a distribution report production section 50d, a waveform analysis information production section 58h, and a waveform analysis information storage section 58i. In the following description, the logic/constraint information storage section 64a, timing information storage section 65a and waveform analysis information storage section 58i may each be referred to as storage section 64a, 65a or 58i. It is to be noted that signals denoted by ① and ② are hereinafter described with reference to FIG. 36.

The storage section 64a stores the netlist regarding the source code of the design language, block information and logic/constraint information having constraint information regarding wiring lines. The storage section 64a includes a constraint condition storage section 58b and a structural portion netlist storage section 58c (the constraint condition storage section 58b and structural portion netlist storage section 58c may each be hereinafter referred to simply as storage section 58b or 58c). The storage section 58b receives constraint definition information as an input thereto and stores areas occupied by parts and so forth and timing specifications as constraint conditions based on the received information. The storage section 58c receives block information as an input thereto and stores the netlist.

The floor planning section 55a is connected to the storage section 64a and distributes timings based on a floor plan regarding arrangement of circuit elements and wiring lines between the circuit elements to perform provisional wiring. The timing information storage section (timing information) 65a is connected to the floor planning section 55a and stores the block information, netlist and timing information described above.

Here, in calculation wherein two or more distribution values are used, a minimum value and a maximum value for the distribution values are produced automatically, and a delay value is calculated. A difference in accuracy in this instance is obtained by reverse rounding arithmetic operation to a value within a range within which an original value is obtained by rounding (counting fractions of 5 and over as a unit and disregarding the rest). Here, as an example, a method of converting a delay value from 1.2 ns (nanoseconds) having two effective figures into another value (1.145 to 1.244 ns) of a range of four figures in order to adjust the number of effective figures of the delay value to that of 2.227 ns (nanoseconds) of an object of calculation is described.

Accordingly, another hierarchical layer is extracted automatically, and an inquiry of whether or not a change of the hierarchical layer is permissible is issued to the timing information databases 57a to 57e of each hierarchical layer. Then, if the replies indicate that the timing distribution value can be changed, then a change notification is issued to the designer. This allows flexible design change.

It is assumed that, in the timing library, the delay value is stored as 1.2 ns. Therefore, the designer sets the error range to 0.09 ns (0.099999 . . . ns) for rounding. Then, if a range which has the error range of 0.09 ns and within which the delay value of 1.2 ns is obtained by rounding at the second decimal is determined, then the range of a minimum value 1.15 ns to a maximum value 1.24 ns is obtained. In other words, if a delay value within the range is rounded at the second decimal, then 1.2 ns is obtained.

Then, the designer calculates a maximum value and a minimum value for each of the minimum value of 1.15 ns and the maximum value of 1.24 ns. Consequently, a range from the minimum value of 1.145 ns to the maximum value of 1.154 ns is obtained for the minimum value of 1.15 ns, and another range from the minimum value of 1.235 ns to the maximum value of 1.244 ns is obtained for the maximum value of 1.24 ns. Then, based on the thus obtained ranges, a range from the minimum value of 1.145 ns to the maximum value of 1.244 ns is obtained.

Accordingly, the number of effective figures is expanded from 2 to 4, and a delay value of four figures (1.145 to 1.244 ns) is obtained from the delay value of two figures (1.2 ns). Consequently, a delay value of the number of effective figures equal to that of the other values can be produced.

Meanwhile, in the other timing library, where the delay value has four effective figures (2.237 ns of the calculation object), both of the minimum value and the maximum value are 2.237 ns.

In this manner, the accuracy of distribution values is automatically determined between data having different degrees of accuracy based on the data stored in the timing libraries. Therefore, even where a high speed part and a low speed part are connected to each other, delay values of them can be calculated without depending upon the difference in accuracy appearing between the parts.

Further, a plurality of timing libraries having different degrees of accuracy can be used. Furthermore, a slack can be grasped readily from minimum/maximum value representations including errors.

The distribution manager 56a has yes/no information regarding whether or not a distribution value can be changed in a direction in which the margin decreases and can thus extract a critical path in terms of the distribution value and besides can extract a portion which can be augmented in terms of the distribution value. This allows distribution modification of the circuit and allows the designer to recognize the modified portion readily.

The HDL annotator 58e writes information originating from a timing distribution value into the source code. In particular, the HDL annotator 58e reads in desired data from the timing information storage section 65a and writes necessary data into the source code. Further, the HDL annotator 58e writes a netlist regarding the wiring scheme into the source code. In particular, a value distributed by the HDL annotator 58e regarding description of a time necessary for signal substitution is back annotated into the source code so that a delay value is set or changed. Further, when the back annotation is performed, also a netlist representation with the wiring scheme taken into consideration is written as a comment statement into the source code.

This makes the user interface between the designer and the timing distribution apparatus 51 more close.

The HDL compiler 58f receives the source code and a parameter as inputs thereto and outputs the inputted data to the structural portion netlist storage section 58c.

The waveform analysis information production section 58h produces information for waveform analysis of the PCB from I/O buffer information (input/output buffer information) of the hierarchical layer of the LSI. Accordingly, the designer can analyze the waveform simply and easily.

The waveform analysis information storage section 58i is connected to the waveform analysis information production section 58h and the waveform analysis CAD apparatus 52b and stores timing distribution values written thereto from the waveform analysis information production section 58h and data of the LSI blocks. Further, each of the PCB blocks stores data of a netlist necessary for waveform analysis and accordingly functions as a library for waveform analysis. Further, the waveform analysis information storage section 58i is connected to the waveform analysis CAD apparatus 52b so that it can refer to data of the waveform analysis CAD apparatus 52b.

Figure 25:
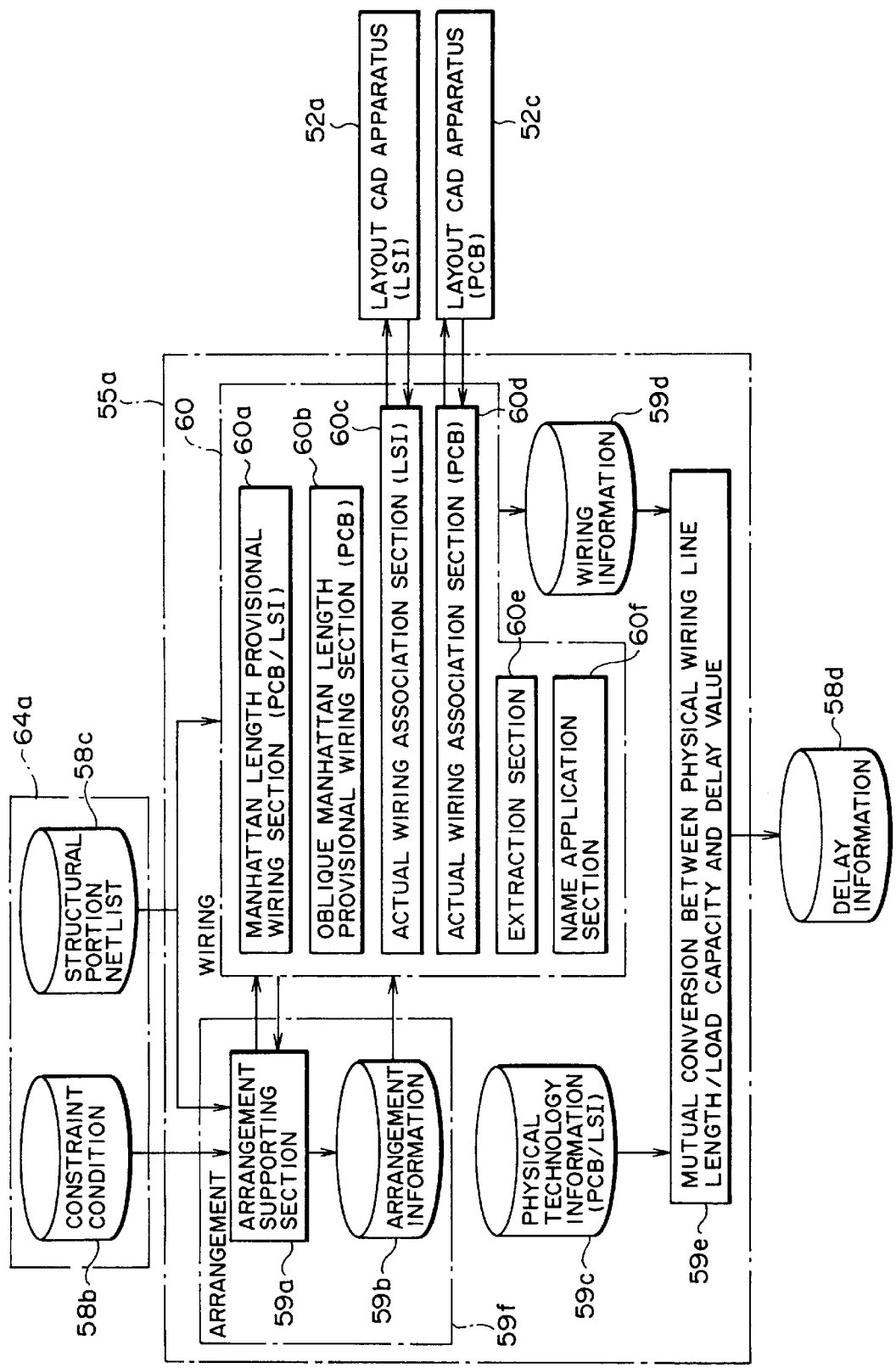
FIG. 25 is a block diagram of a floor planning section according to the second embodiment of the present invention.

FIG. 25 is a block diagram of the floor planning section 55a according to the second embodiment of the present invention. Referring to FIG. 25, the floor planning section 55a shown includes an arrangement processing section 59f, a physical technology information storage section 59c, an actual wiring and provisional wiring execution section 60, a wiring information storage section (wiring line information) 59d, and a conversion section 59e.

The arrangement processing section 59f is connected to the storage section 64a and presents portions whose distribution values as attribute information can be augmented and modified based on slacks from constraint information. Further, the arrangement processing section 59f stores arrangement information originating from delay element information. The arrangement processing section 59f thus includes an arrangement supporting section 59a for presenting portions whose distribution values as attribute information can be augmented and modified based on slacks from constraint information, and an arrangement information storage section 59b for storing arrangement information originating from delay element information.

The actual wiring and provisional wiring execution section 60 is connected to the arrangement processing section 59f, and performs association to actual wiring and provisional wiring and outputs wiring information. The actual wiring and provisional wiring execution section 60 includes a Manhattan length provisional wiring section 60a, an oblique Manhattan length provisional wiring section 60b, a pair of actual wiring association sections 60c and 60d, an extraction section 60e, and a name application section 60f. Here, the actual wiring is a wiring technique wherein a wiring line is located three-dimensionally taking a wiring line layer into consideration and collision of the wiring line with any other wiring line and a wiring line width are taken into consideration. The actual wiring line requires a long processing time. The provisional wiring is a wiring technique wherein a wiring line is located two-dimensionally and short-circuiting with another wiring line is not taken into consideration.

The actual wiring and provisional wiring execution section 60 performs provisional wiring based on Manhattan length provisional wiring, oblique Manhattan length provisional wiring and actual wiring. This augments the accuracy also at a place where wiring lines are located densely.

The actual wiring and provisional wiring execution section 60 reads out delay values and load capacities of a selected hierarchical layer from the physical technology information storage section 59c and distributes the delay times varying the delay time per unit wiring line length. Accordingly, re-calculation can be performed immediately upon changing of the timing specifications.

The Manhattan length provisional wiring section 60a performs Manhattan length provisional wiring for both of the PCB and the LSI based on a result of arrangement of the arrangement supporting section 59a. Consequently, the efficiency of the wiring operation is augmented.

The oblique Manhattan length provisional wiring section 60b (which may be hereinafter referred to simply as provisional wiring section 60b) performs provisional wiring using oblique wiring of laying a wiring line with respect to an edge of the PCB based on a result of arrangement of the arrangement supporting section 59a. The oblique wiring is a wiring technique used for the PCB. Accordingly, the efficiency of the wiring operation is augmented similarly.

Figure 26:
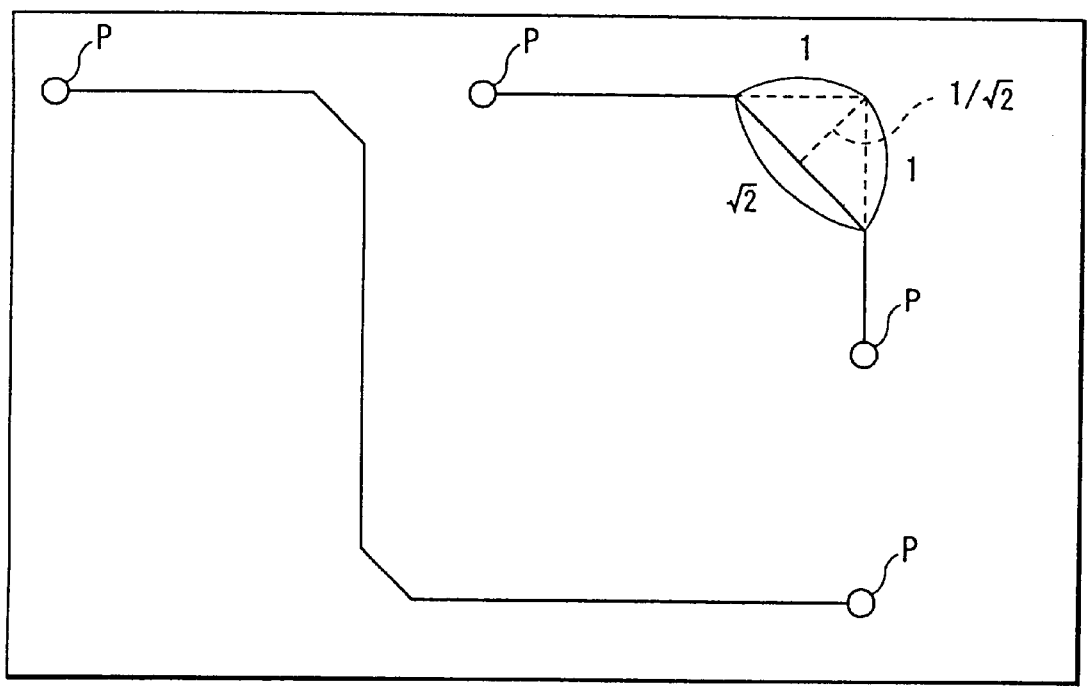
FIG. 26 is a diagrammatic view illustrating oblique Manhattan length provisional wiring according to the second embodiment of the present invention.

FIG. 26 is a schematic view illustrating the oblique Manhattan length provisional wiring according to the second embodiment of the present invention. Referring to FIG. 26, reference character P denotes a pin, and a wiring line is located between two pins P. The wiring algorithm in this instance is such as described in the following paragraphs (3-1) to (3-3).

(3-1) The provisional wiring section 60b produces an oblique wiring line component based on an oblique wiring line rate set in advance.

(3-2) The provisional wiring section 60b locates a portion of the wiring line having a wiring line length corresponding to the oblique wiring line rate from the total wiring line length at an angle portion of the Manhattan wiring line at the angle of 45 degrees.

(3-3) If the path has a negative slack (surplus time), then the provisional wiring section 60b re-lays the wiring line with the oblique wiring line rate raised. Here, the total wiring line length of the oblique wiring line portion is (1/square root of 2) of the wiring line length at the corresponding portion of the perpendicularly located wiring line portions.

Further, the actual wiring and provisional wiring execution section 60 performs actual wiring based on margins calculated for timing distribution values obtained by provisional wiring and a wiring line congestion degree representative of a wiring line density. Consequently, provisional wiring or actual wiring is automatically performed selectively in response to the wiring line congestion degree, and therefore, the trade-off can be utilized effectively and the labor of the designer can be reduced.

The extraction section 60e extracts a wiring line congestion degree. Accordingly, the actual wiring and provisional wiring execution section 60 performs provisional wiring and actual wiring based on a region in which wiring is inhibited and the wiring line congestion degree. The wiring line congestion degree is extracted automatically using two different algorithms.

Figure 27:
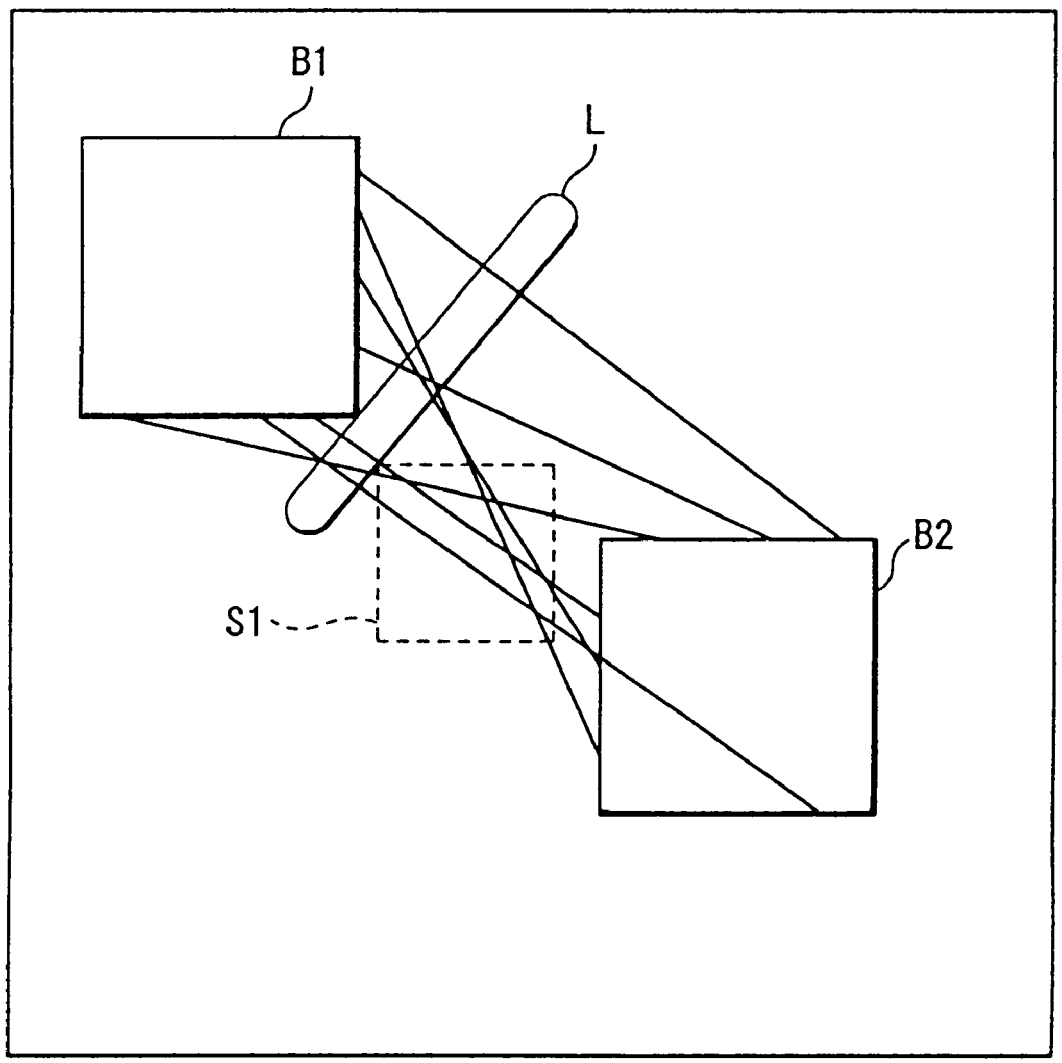
FIGS. 27 and 28 are diagrammatic views illustrating an algorithm for extracting a wiring line congestion degree according to the second embodiment of the present invention.
Figure 28:
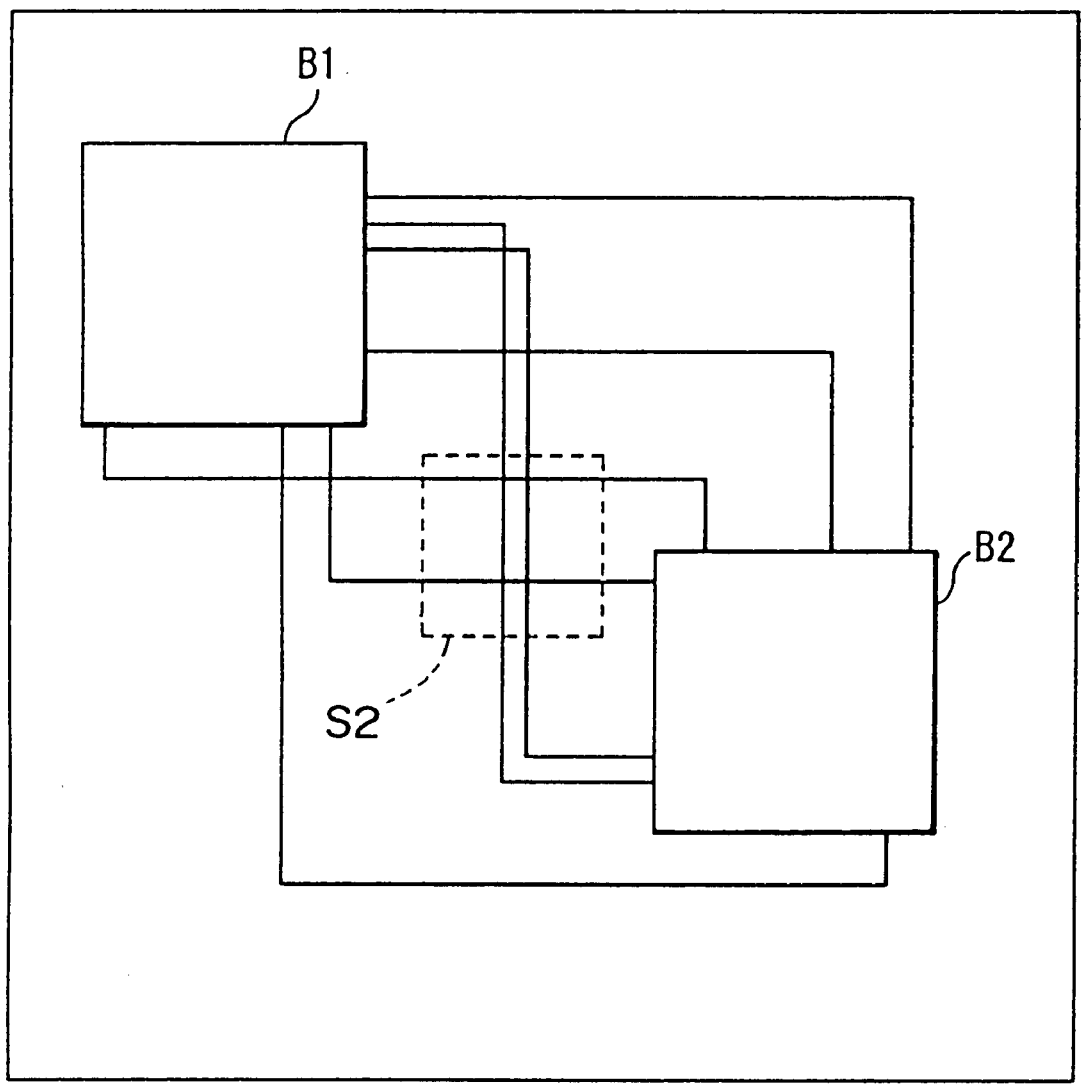

FIGS. 27 and 28 are diagrammatic views illustrating the algorithms for extracting a wiring line congestion degree according to the second embodiment of the present invention. Referring to FIGS. 27 and 28, a pair of circuit blocks B1 and B2 are arranged and connected to each other by a large number of lines (line segments surrounded by an ellipse denoted by L).

The first algorithm is called simple algorithm and includes the following steps (4-1) and (4-2).

(4-1) Lines are drawn between terminals of the two circuit blocks.

(4-2) The number of lines per unit area denoted by S1 in FIG. 27 is counted, and the count value is determined as a wiring line congestion degree.

The second algorithm uses the Manhattan length and includes the following steps (5-1) and (5-2).

(5-1) Wiring lines are located along grid lines bypassing macro circuit blocks B1 and B2, a wiring inhibition region and so forth like right-angled wiring lines shown in FIG. 28.

(5-2) The number of wiring lines per unit area denoted by S2 in FIG. 28 is counted, and the count value is determined as a wiring line congestion degree.

Referring back to FIG. 25, the actual wiring association sections 60c and 60d locate wiring lines on the LSI and the PCB, respectively. The actual wiring association section 60c is connected to the layout CAD apparatus 52a and can transmit and receive data to and from the layout CAD apparatus 52a. The actual wiring association section 60d is connected to the layout CAD apparatus 52c and can transmit and receive data to and from the layout CAD apparatus 52c.

Accordingly, provisional wiring lines and detailed actual wiring lines which rely upon circuit blocks of an object of design can be located in a mixed state, and distribution values of timings can be extracted.

In addition, the actual wiring and provisional wiring execution section 60 outputs information for analysis regarding information which may be short in actual wiring in order to allow cooperation with another designing apparatus which uses another computer and can perform only actual wiring.

Consequently, information which is short when the timing distribution apparatus 51 performs actual wiring is conveyed to the designer so that the designer can produce information necessary for analysis based on the information and transmit the produced information to the layout CAD apparatus 52a and 52c for exclusive use for actual wiring to perform actual wiring.

Further, the actual wiring and provisional wiring execution section 60 lays wiring lines using both of actual wiring for which long calculation time is required and provisional wiring for which the calculation time is short and extracts timing distribution values.

Thus, the designer first can examine timing specifications by provisional wiring and change the timing distribution based on a result of the examination to perform actual wiring.

In FIG. 25, the floor planning section 55a can change the scale (magnitude) or the shape of a circuit block while actual wiring or provisional wiring is proceeding.

Figure 29:
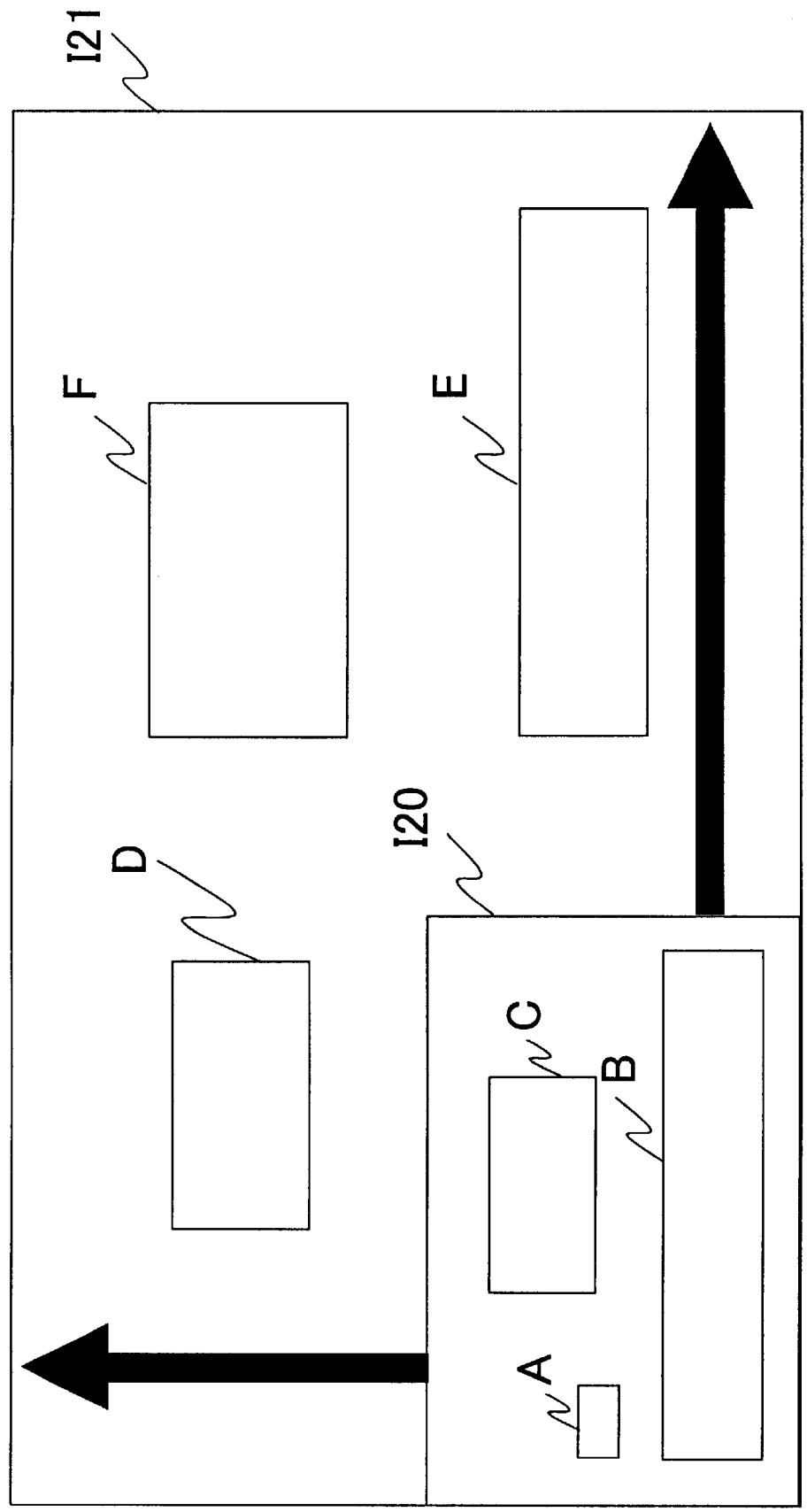
FIG. 29 is a diagrammatic view schematically illustrating enlargement of an arrangement region according to the second embodiment of the present invention.

FIG. 29 is a diagrammatic view schematically illustrating expansion of an arrangement region according to the second embodiment of the present invention. Referring to FIG. 29, an arrangement region of a circuit block I20 shown is expanded to obtain another circuit block I21. Consequently, circuit blocks D, E and F which are not included in the circuit block I20 are arranged in the expanded circuit block I21. Though not shown, also it is possible to conversely reduce an excessively large arrangement region. This allows flexible arrangement design.

Referring back to FIG. 25, the floor planning section 55a further can change the width of a wiring line in a circuit block while actual wiring or provisional wiring is proceeding. Decrease of the wiring line width decreases the wiring line capacity, but increase of the wiring line width increases the wiring line capacity. Accordingly, change of the wiring line width allows flexible design of a circuit.

The wiring information storage section 59*d* is connected to the actual wiring and provisional wiring execution section 60 and stores wiring line information. The conversion section 59*e* is connected to the wiring information storage section 59*d* and the physical technology information storage section 59*c*, and converts wiring line information into a delay value based on a wiring line length and a load capacity and outputs the delay value. The physical technology information storage section 59*c* stores a delay value per unit length and a load capacity per unit length in a mutually mapped relationship. The values (library) are prepared for each wiring line width and each wiring line layer, and a set of such values is prepared and stored for each of the technologies for a PCB (PCB technologies) and the technologies for an LSI (LSI technologies). The physical technology information is used to calculate a delay value from a wiring line length.

The conversion section 59*e* reads out a delay value per unit length from the physical technology information storage section 59*c* based on a physical wiring line length so that the wiring line length is converted into the delay value. Further, the conversion section 59*e* reads out a delay value per unit capacity based on a load capacity so that the load capacity is converted into the delay value. In this manner, a delay value can be calculated readily from a wiring line length.

The actual wiring and provisional wiring execution section 60 (refer to FIG. 25) can change a physical technology of a selected hierarchical layer. In particular, the actual wiring and provisional wiring execution section 60 reads out a delay value and a load capacity from the physical technology information storage section 59*c* and automatically sets and distributes a delay time per unit wiring line length in accordance with a selected physical technology. Since the physical technology for a circuit block can be changed, a physical technology for satisfying a timing constraint can be searched for.

Further, the actual wiring and provisional wiring execution section 60 discriminates based on a clock frequency used as a constraint condition whether or not a signal can arrive within a time (for one period) within which it must arrive, and issues, if it is discriminated that a signal cannot arrive within the time, an instruction to insert a buffer and a flip-flop into a netlist between a plurality of circuit blocks. Consequently, a buffer and so forth are inserted only when a signal cannot arrive at a virtual pin in time, and therefore, the constraint condition can be satisfied effectively.

Figure 30:
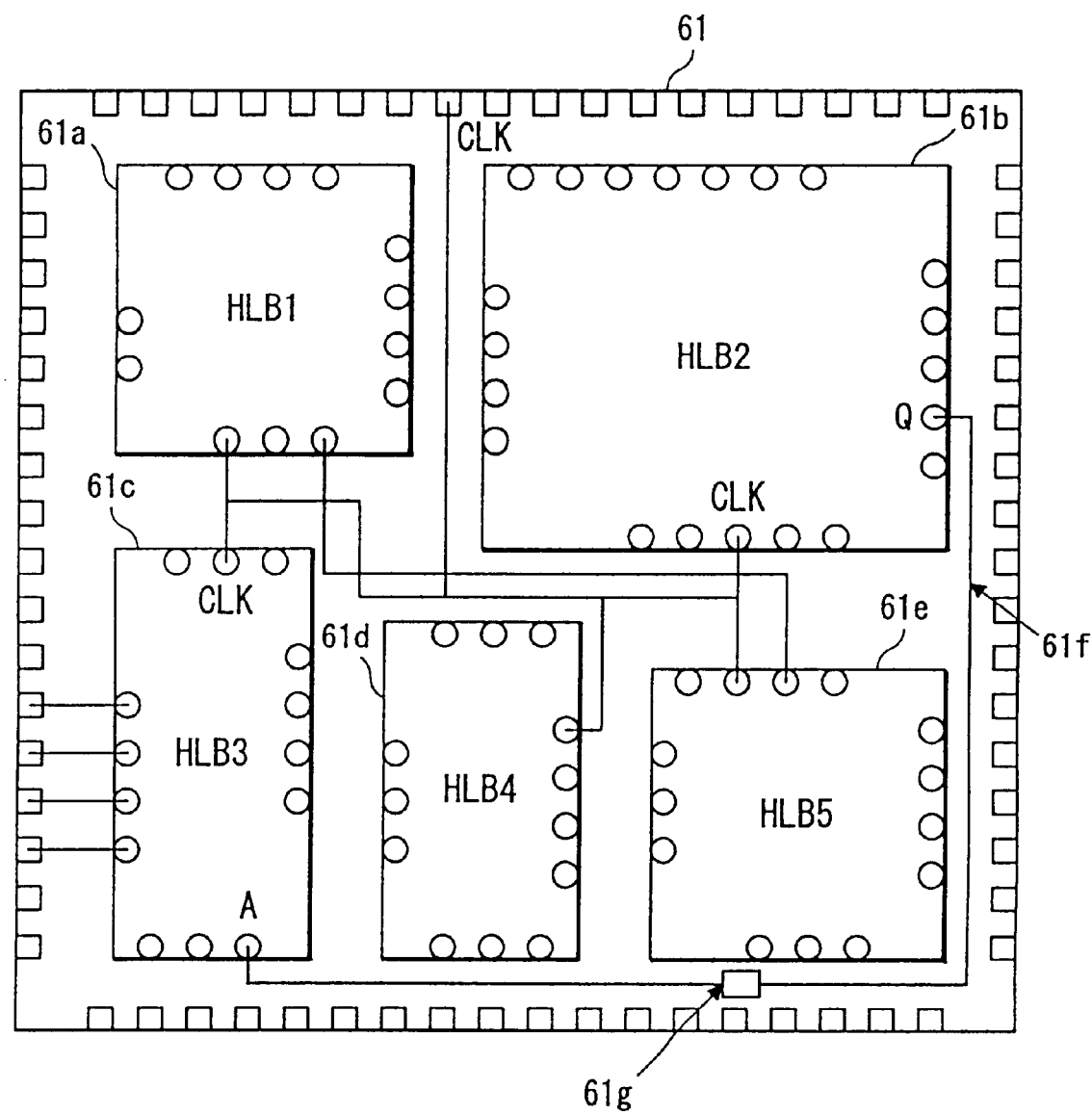
FIG. 30 is a schematic view illustrating timing distribution in the inside of an LSI according to the second embodiment of the present invention.

FIG. 30 is a schematic view illustrating timing distribution in the inside of an LSI according to the second embodiment of the present invention. Referring to FIG. 30, a chip 61 shown includes circuit modules (modules) 61*a* to 61*e* and has terminals along outer peripheral portions and in the inside thereof. The terminals on the outer peripheral portions are represented by squares in FIG. 30. The modules 61*a* to 61*e* individually have virtual pins (represented by circles) provided at end portions thereof. The virtual pins are connected to the virtual pins provided on the other modules so that, for example, a clock (CLK) may be used commonly by the circuit modules 61*a* to 61*e*.

The actual wiring and provisional wiring execution section 60 arranges terminals (virtual pins) included in the circuit blocks in accordance with constraint information. In particular, a virtual pin is positioned at a predetermined position at an end portion of a module preferentially beginning with a position at which it exhibits a negative slack. Then, a slack when a wiring line is located with a Manhattan length at the position is calculated, and if the slack does not have the negative sign, then the position is determined as the position of the virtual pin. This applies not only to the module 61*a* but also to the other modules 61*b* to 61*e* shown in FIG. 30. It is to be noted that design of the PCB includes an oblique Manhattan length as well. This facilitates and simplifies arrangement.

A virtual pin Q of the module 61*b* is connected to a critical net 61*f*, and a flip-flop 61*g* is connected to the critical net 61*f*. Thus, if the critical net 61*f* has a negative slack and cannot satisfy the timing condition, then a flip-flop, a buffer or an invertor is inserted so that the timing condition may be satisfied.

Where a flip-flop is inserted in this manner, a signal outputted from the virtual pin Q is delayed by one cycle by the flip-flop. However, the setup condition is satisfied between the virtual pin Q and the flip-flop 61*g* and between the flip-flop 61*g* and the terminal A of the module 61*c*.

Accordingly, it is calculated based on distribution values and a given clock frequency whether or not a signal can arrive from a pin or virtual pin of a circuit block at a pin or virtual pin of another circuit block in one clock, and if a signal cannot arrive, then a flip-flop or the like is inserted into a netlist between the circuit blocks. In the chip 61 shown in FIG. 30, a wiring line of 9 mm (millimeter) provides a delay value of 6 ns, and therefore, the chip 61 operates with an operating frequency of 166 MHz (megahertz) or less.

In this manner, the timings can be adjusted prior to RTL (Register Transfer Level) design. Now, setting of timing distribution values is described.

Referring to FIG. 24, the timing distribution production section 54*a* outputs timing distribution values based on the other timing specifications set in advance and timings distributed by the floor planning section 55*a*. The distribution report production section 50*d* refers to the timing specifications and timing conditions distributed by the floor planning section 55*a* and outputs the validity of the floor planning and the timing specifications as a distribution report. The distribution report is a text file in which the distribution values are described, and is used for reference by the designer and so forth.

Further, a function between the source code and the timing distribution production section 54*a* is described.

The timing distribution production section 54*a* reads in timing distribution values back annotated upon logical design or from layout examination using the source code by the HDL compiler 58*f*. More particularly, the timing distribution production section 54*a* reads out the source code in which timing delay values necessary for simulation are included in addition to the netlist. Accordingly, the designer can perform simulation readily.

The distribution manager 56*a* shown in FIG. 24 is connected to the storage section 64*a*, timing information storage section 65*a*, timing information database 57*a* and inter-hierarchical layer association manger 53 and outputs a delay value based on the netlist.

Figure 31:
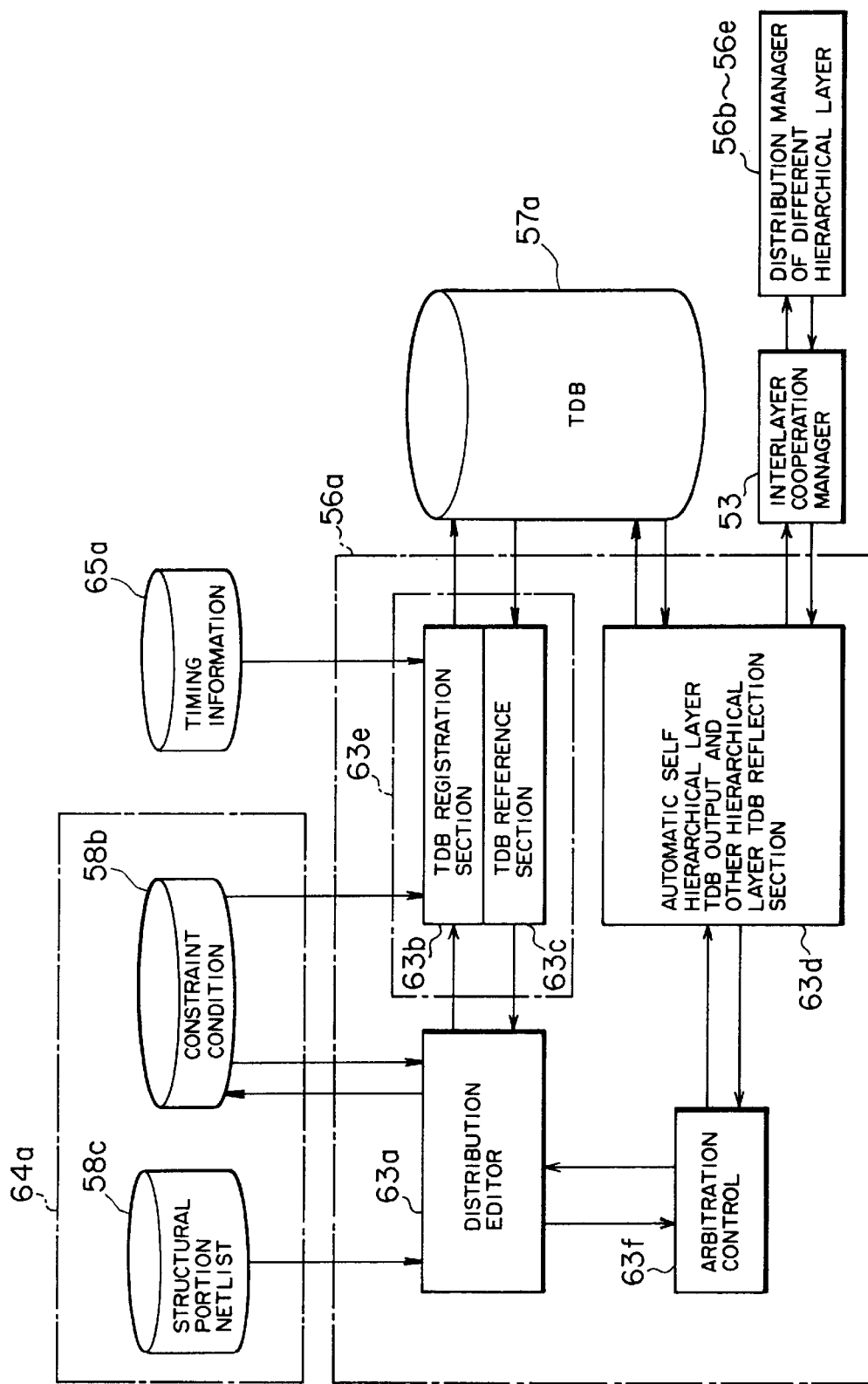
FIG. 31 is a block diagram of a distribution manager according to the second embodiment of the present invention.

FIG. 31 is a block diagram of the distribution manager 56*a* according to the second embodiment of the present invention. Also the distribution managers 56*b* to 56*e* shown in FIG. 21 have the same structure as that of the distribution manager 56*a* shown in FIG. 31, and overlapping description of them is omitted herein to avoid redundancy while only the distribution manager 56*a* is described below. Referring to FIG. 31, the distribution manager 56*a* shown includes a distribution editor 63a, a database reference registration section 63e, an automatic self hierarchical layer TDB output and other hierarchical layer TDB reflection section (self hierarchical layer TDB output and other hierarchical layer TDB reflection section; which may be hereinafter referred to as TDB output reflecting section) 63d and an arbitration control section 63f. The distribution editor 63a is connected to the storage section 64a and distributes a timing. The database reference registration section 63e is connected to the distribution editor 63a, storage section 64a and timing information storage section 65a and receives and outputs a netlist and distribution values. The database reference registration section 63e includes a TDB registration section 63b and a TDB reference section 63c. The TDB registration section 63b writes data into the timing information database 57a. The TDB reference section 63c reads out data from the timing information database 57a.

The TDB output reflection section 63d receives and outputs timing distribution information of the hierarchical layer of itself and timing distribution information of the other hierarchical layers. Thus, the TDB output reflection section 63d causes the interlayer association manager 53 to reflect data regarding the other hierarchical layers (other hierarchical layers, lower hierarchical layers) on the timing information database 57a and causes the interlayer association manager 53 to reflect data regarding the hierarchical layer of itself (self hierarchical layer) on one of the other timing information databases 57b to 57e which is immediately higher than the self hierarchical layer. Whether or not such data should be reflected is controlled by the arbitration control section 63f. The arbitration control section 63f is connected to the TDB output reflection section 63d and the distribution editor 63a and arbitrates distributed values of which one of the self hierarchical layer and another self hierarchical layer should be selected. Further, the arbitration control section 63f determines whether or not such distribution values should be reflected.

In particular, the arbitration control section 63f uses data of the self hierarchical layer and data of the other hierarchical layer to discriminate whether or not the timing constraint is satisfied. If the timing constraint is satisfied, then the arbitration control section 63f determines that the distribution values should be reflected, but otherwise if the timing constraint is not satisfied, then the arbitration control section 63f determines that the distribution values should not be reflected, and issues are-setting request. Upon re-setting, the data of the self hierarchical layer are read out from the timing information database 57a by the TDB output reflection section 63d, and a message that re-setting is required is inputted to the distribution editor 63a through the arbitration control section 63f and is outputted through the interlayer association manager 53 in response to a data transmission request from any of the distribution managers 56a to 56e of the other hierarchical layers. Meanwhile, as regard data of the other hierarchical layers, data of another desired hierarchical layer transmitted thereto in response to a request issued to the interlayer association manager 53 are inputted to the distribution editor 63a. This is repeated until the constraint information is satisfied. Then, when the constraint is satisfied, the data are written into the timing information database 57a.

Figure 32:
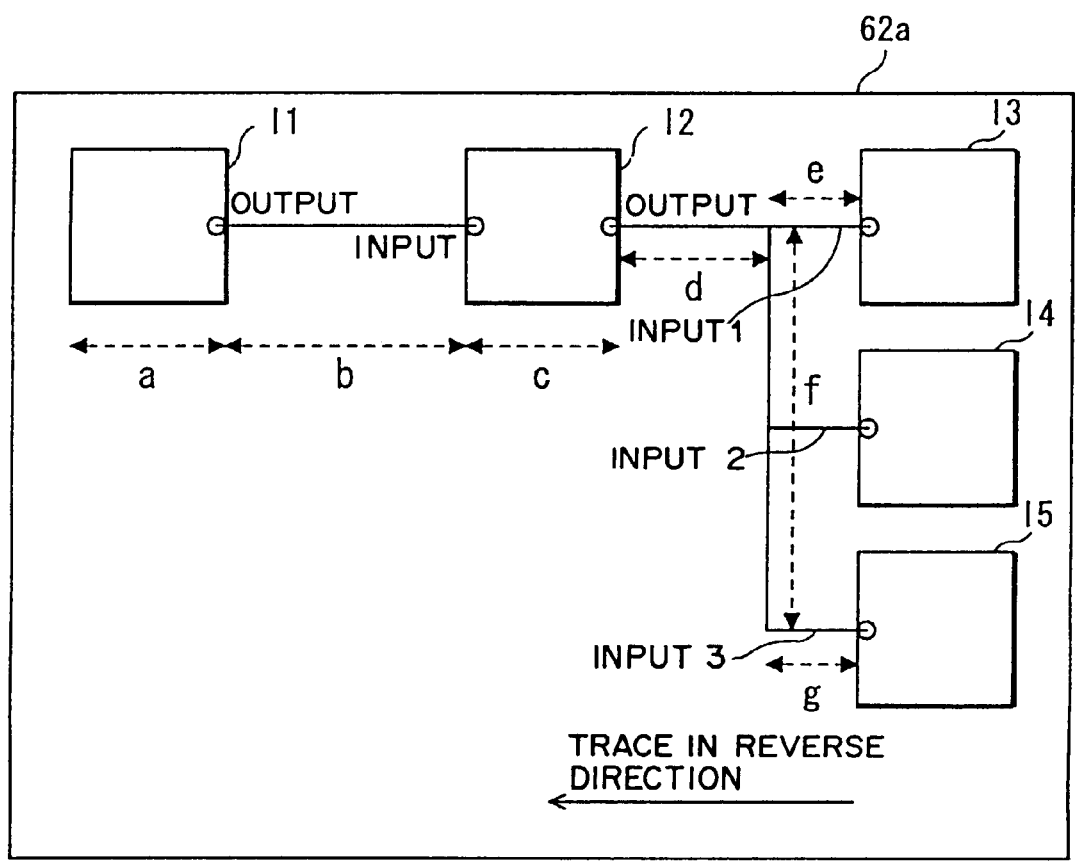
FIG. 32 is a diagrammatic view illustrating skew calculation according to the second embodiment of the present invention.

FIG. 32 is a diagrammatic view illustrating skew calculation according to the second embodiment of the present invention. Referring to FIG. 32, a netlist 62a shown includes circuit modules I1, I2, I3, I4 and I5 (individually represented by squares). The phase of a signal outputted, for example, from the circuit module I1 is delayed when it propagates along a PCB, and is further delayed, when the signal is inputted to the circuit module I2, by an influence of the input pin capacity of the circuit module I2.

Taking the above into consideration, the designer calculates a delay value between the circuit modules I1 and I3, a delay value between the circuit modules I1 and I4, and a delay value of the circuit modules I1 and I5. The delays are caused by factors including internal delays (denoted by a and c) of the circuit modules I1 and I2, a delay (denoted by b) between the circuit modules I1 and I2, and delays (denoted by d, e, f and f) between the circuit module I2 and the circuit modules I3, I4 and I5.

In the calculation of a phase difference, for example, between the delay time between the circuit modules I1 and I3 and the delay time between the circuit modules I1 and I5, a difference in delay value from a normal reference point (which corresponds to the delay value a of the circuit module I1) is calculated. Since the delay values a, b, c and d originate from paths common to both of the route from the circuit module I1 to the circuit module I3 and the route from the circuit module I1 to the circuit module I5, a dispersion between circuit modules or a dispersion of wiring lines is not taken into consideration. Accordingly, the phase difference can be calculated as a difference between the (delay value e+input pin capacity of the circuit module I3) and the (delay value f+delay value g+input pin capacity of the circuit module I5). The two input pin capacities involve a manufacture dispersion and so forth even where a same logic circuit is implemented in the circuit modules I3 and I5.

Therefore, the distribution manager 56a calculates a skew representative of a phase difference between arriving times of a signal based on those of wiring line paths of a netlist regarding a wiring scheme other than a common wiring line path or paths.

In particular, the paths are traced in the direction opposite to the signal propagation direction based on the netlist, and when a common portion is found, those portions which are not common are extracted. Consequently, calculation with a dispersion of the common portion removed is executed automatically.

FIGS. 33(a) to 33(c) are diagrammatic views illustrating netlist representations according to the second embodiment of the present invention. A netlist 62 shown in FIG. 33(a) is a logic circuit having circuit modules I1, circuit module I2, I3 and I4 (which are hereinafter referred to simply as modules I1 and so forth). A port A of the module I1 outputs a signal, and ports B, C and D of the modules I2 to I4 receive signals as inputs thereto. FIGS. 33(b) and 33(c) show wired physical layouts. A chip 63 shown in FIG. 33(b) is an implemented chip.

Here, the sub signal name can be represented as "I1.A-I2.B-I3.C-I4.D". It is to be noted that the netlist representation is such that the delimiting character is "-" and the delimiting character from an instance name is ".". Here, the fan-out number of the port A is 3, and the port A drives the ports B, C and D. Thus, the sub signal name above signifies that wiring lines are located past the ports A, B, C and D in this order like a line drawn with a single stroke.

FIG. 33(c) shows a netlist representation where a netlist includes segments equal in length from each other (the segments AB and AC are equal to each other). In this instance, the portions of an equal length are placed in parenthesis, and therefore, the sub signal name is represented as "I1.A-(I2.B-I3.C)-I4.D". If a constraint to a delay is applied, then a delay value is described using, for example, "#", and thus, the sub signal name is represented as "I1.A-(1.4 ns#I2.B-I3.C)-1.2 ns#I4.D".

Also constraints to a load capacity, a wiring line length, a wiring line length, a wiring line layer designation and so forth can be described in such sub signal names as given (6-1) to (6-3) below. Here, pf represents picofarad, μm (micrometer) represents the length of a wiring line, and w represents a wiring line width (μm). Further, LA and LB individually represent wiring line layers.

| | |
|---|---|
| I1.A-(0.3pf#I2.B-I3.C)-1.2ns#I4.D | (6-1) |
| I1.A-(1.4ns#I2.B-I3.C)-31.2μm#I4.D | (6-2) |
| 0.6w#LA,LB#I1.A-I2.B-I3.C-I4.D | (6-3) |

In particular, it is constrained that the LA layer should be wired with the width of 0.6 μm, and the wiring lines between the circuit modules I1 and I2, between the circuit modules I1 and I3 and between the circuit modules I1 and I4 should all be located in a single stroke in the LB layer.

Where a wiring line is located obliquely in PCB design, "/" is used in place of "-" for the representation of the oblique wiring line. For example, the sub signal name is represented as "I1.A/I2.B-I3.C-I4.D".

Accordingly, the distribution manager 56a is constructed so as to apply a name representative of a wiring line form as a sub signal name to a wiring line path and therefore to apply a name in association with a sub signal name and a fan-out number.

Though not shown, the distribution manager 56a displays a gradation corresponding to a value of constraint information for a wired portion in a color on the operation screen. Further, the distribution manager 56a displays, in a figure showing a circuit block, a timing distribution value and a range of the value within which timing distribution is possible.

Since a dispersion of a common portion can be eliminated in this manner, a circuit having a high degree of reliability can be designed.

A program of the present invention causes a computer to function, upon hierarchical design, as a plurality of timing distribution production sections 54a to 54e provided individually corresponding to a plurality of design hierarchical layers for receiving block information regarding functions of a circuit from timing information databases 57a to 57e each having a netlist regarding a wiring line scheme and outputting timing distribution values obtained by distributing delay values caused by delay elements of the circuit, and an interlayer association manager 53 connected to the timing distribution production sections 54a to 54e for transmitting and receiving modification information regarding the timing distribution values to and from the timing distribution production sections 54a to 54e.

Thus, the functions of the timing distribution production section 54a and the interlayer association manager 53 are realized by a CPU of the computer, which is used as the timing distribution apparatus 51, reading the program stored on a recording medium (not shown) such as a hard disk of the computer and operating in accordance with the program.

Further, a method of installing the program of the present invention into the recording medium such as the hard disk uses a recording medium such as a CD-ROM, a CD-R, a CD-RW or a floppy disk in conformity with a reading apparatus of the computer.

Operation of the timing distribution apparatus 51 of the present invention having the construction described above is described in detail with reference to 34 to 42.

Figure 34:
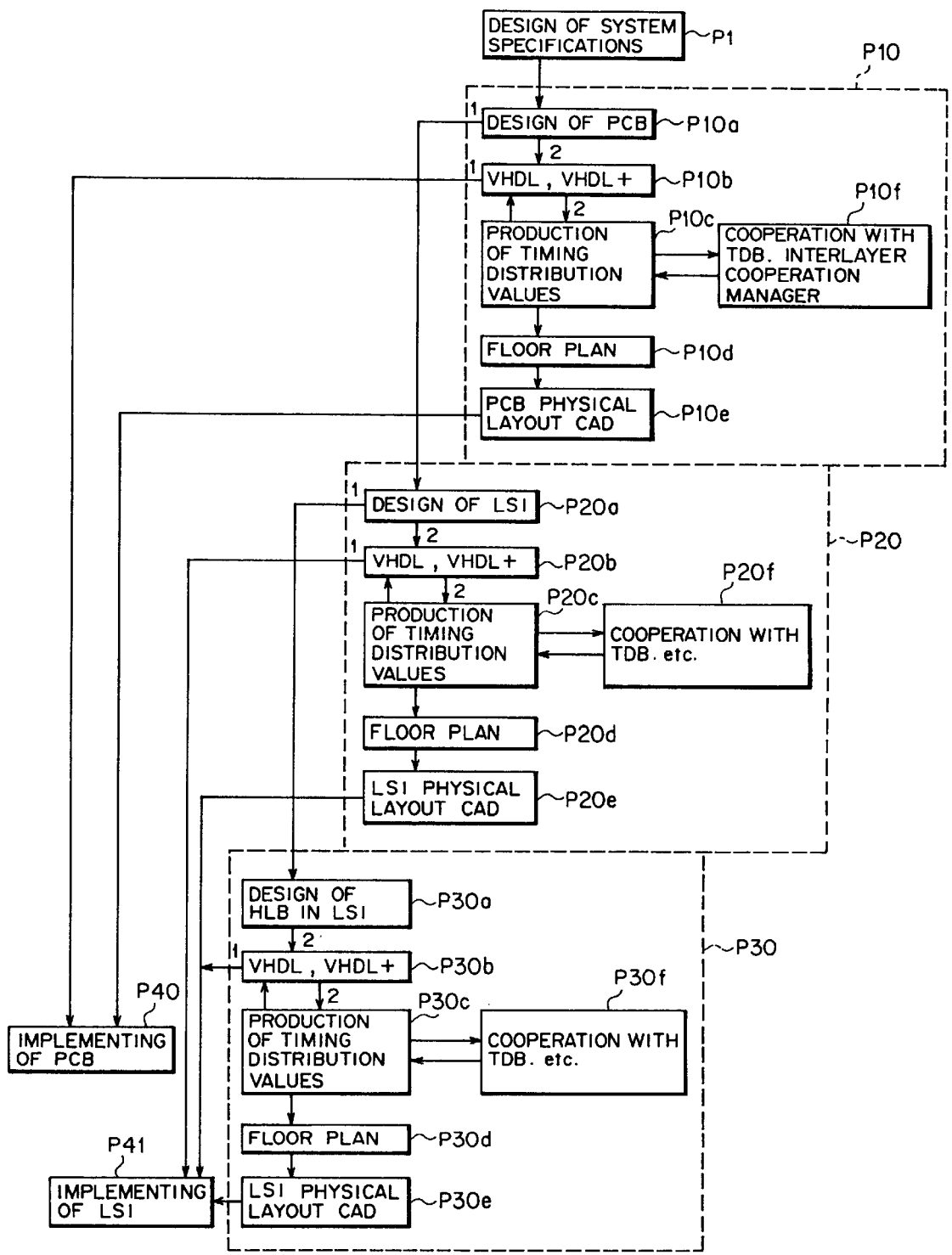
FIG. 34 is a flow diagram illustrating a process of block design according to the second embodiment of the present invention.

FIG. 34 is a diagrammatic view illustrating different steps of block design according to the second embodiment of the present invention. The steps illustrated in FIG. 34 indicate that timing design for three hierarchical layers of a PCB, an LSI and a sub block in the LSI proceeds simultaneously.

After system specifications are designed first in step P1, PCB design in step P10 is started. More particularly, first when design of an LSI is to be performed in step P10a of step P10, the processing advances along a route denoted by 1 and processing in steps P20 et seq. is performed. On the other hand, however, when a PCB is to be designed, coding is performed using the VHDL, VHDL+ or the like in step P10b. When a source code is obtained in step P10b, the processing advances along a route denoted by 1, and consequently, implementing of a PCB is started in step P40. Further, when a source code is obtained in step P10b, the processing advances along a route denoted by 2 and timing distribution is performed in step P10c. Such timing distribution is executed by the timing distribution apparatus 51 which cooperates with the timing information databases 57a to 57e and the interlayer association manager 53 in step P10f. Thereafter, a floor plan is produced in step P10d, and the floor plan is read out by the layout CAD apparatus (PCB physical layout CAD apparatus) 52c in step P10e. The floor plan is used for implementing of the PCB in step P40.

The foregoing similarly applies to the LSI and the sub block in the LSI. In particular, when the LSI is to be designed in step P10a, the processing follows the route denoted by 1, and design of the LSI is started in step P20a. When the sub block in the LSI is to be designed in step P20a, the processing follows the route denoted by 1, and processing in steps P30 et seq. is performed. But, when the LSI is to be designed, the processing follows the route denoted by 2, and the VHDL, VHDL+ and so forth are used to perform coding in step P20b.

Then, when a source code is obtained in step P20b, the processing follows the route denoted by 1, and the LSI is implemented in step P41. Further, when a source code is obtained in step P20b, the processing follows the route denoted by 2, and timing distribution is performed in step P20c. Such timing distribution is executed by the timing distribution apparatus 51 which cooperates with the timing information databases 57a to 57e and the interlayer association manager 53 in step P20f. Thereafter, a floor plan is produced in step P20d, and the floor plan is read out by the layout CAD apparatus (LSI physical layout CAD apparatus) 52a in step P20e. The floor plan is used for implementing of the LSI in step P41.

Also with regard to sub block in the LSI, design is started in step P30a, and the VHDL, VHDL+ and so forth are used to perform coding in step P30b. Then, when a source code is obtained in step P30b, the processing follows the route denoted by 1, and implementing of the sub block of the LSI is started in step P41. Further, when a source code is obtained in step P30b, the processing follows the route denoted by 2, and timing distribution is performed in step P30c. Such timing distribution is executed by the timing distribution apparatus 51 which cooperates with the timing information databases 57a to 57e and the interlayer association manager 53 in step P30f. Thereafter, a floor plan is produced in step P30d, and the floor plan is read out by the layout CAD apparatus 52a in step P30e. The floor plan is used for implementing of the LSI in step P41.

Accordingly, re-calculation of each circuit block when timing specifications are changed can be performed immediately because timing information of the other circuit blocks can be grasped on the real time basis. This augments the design efficiency.

Further, by timing distribution based on a distributed design environment, the designer designs taking an influence upon the other circuit blocks into consideration. If such influence is present, then the designer proceeds with the design while checking it from the distribution report whether or not the influence remains within an allowable range.

Figure 35:
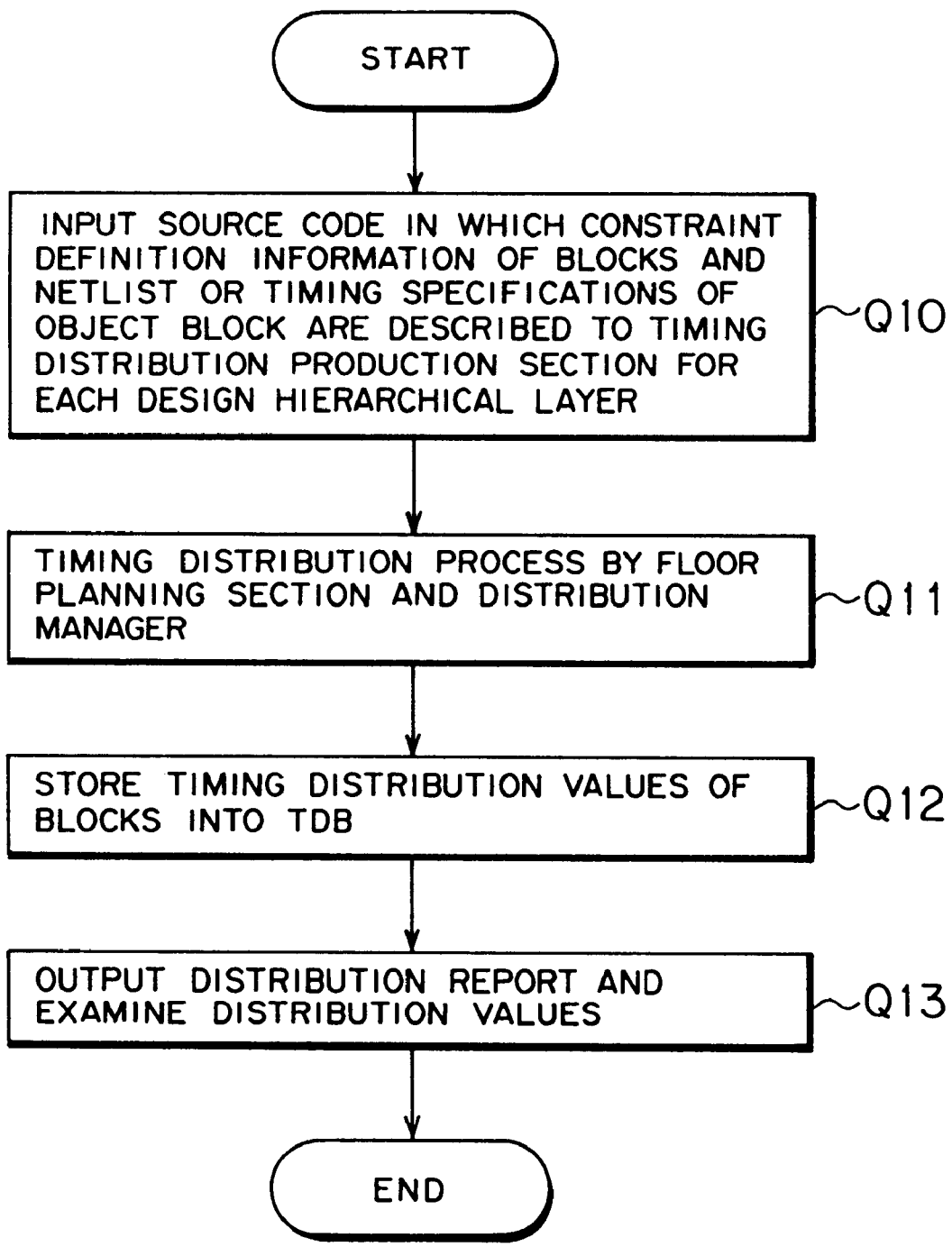
FIG. 35 is a flow chart illustrating timing distribution according to the second embodiment of the present invention.

FIG. 35 is a flow chart illustrating timing distribution according to the second embodiment of the present invention. Constraint definition information for blocks and a netlist or a source code in which timing specifications of an object block are described are inputted to the timing distribution production section 54a to 54e of the individual design hierarchical layers in step Q10. Then, a timing distribution process is performed by the floor planning section 55a and the distribution manager 56a in step Q11. Timing distribution values of the individual blocks are written into the timing information databases 57a to 57e in step Q12, and a distribution report is outputted and the distribution values are examined in step Q13.

Accordingly, a plurality of designers can refer to timing specifications and implementing conditions from each other, and consequently, miscommunication between the designers can be prevented.

The timing specifications stored in the timing information databases 57a to 57e are, where they are for portions determined already, handled as constants because it is set that attribute information is inhibited from change, but any changed portion is written immediately into a corresponding one of the timing information databases 57a to 57e. A change of a portion which spans between a plurality of hierarchical layers is reflected immediately upon the timing information databases 57a to 57e in an immediately higher hierarchical layer.

Now, data transmission/communication between the interlayer association manager 53 and the distribution managers 56a to 56e shown in FIGS. 21 and 22 is described with reference to FIGS. 36 to 38.

Figure 36:
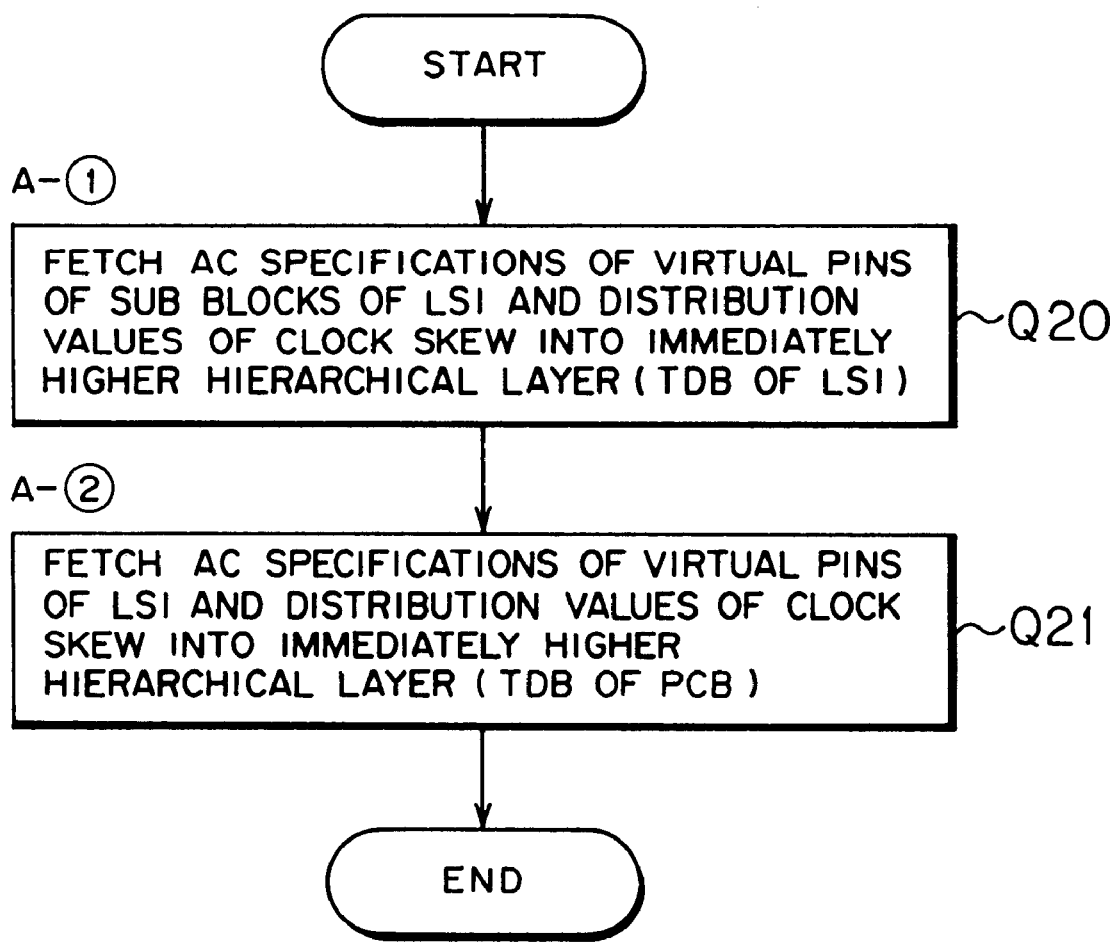
FIGS. 36 to 38 are flow charts illustrating timing distribution according to the second embodiment of the present invention, respectively.
Figure 37:
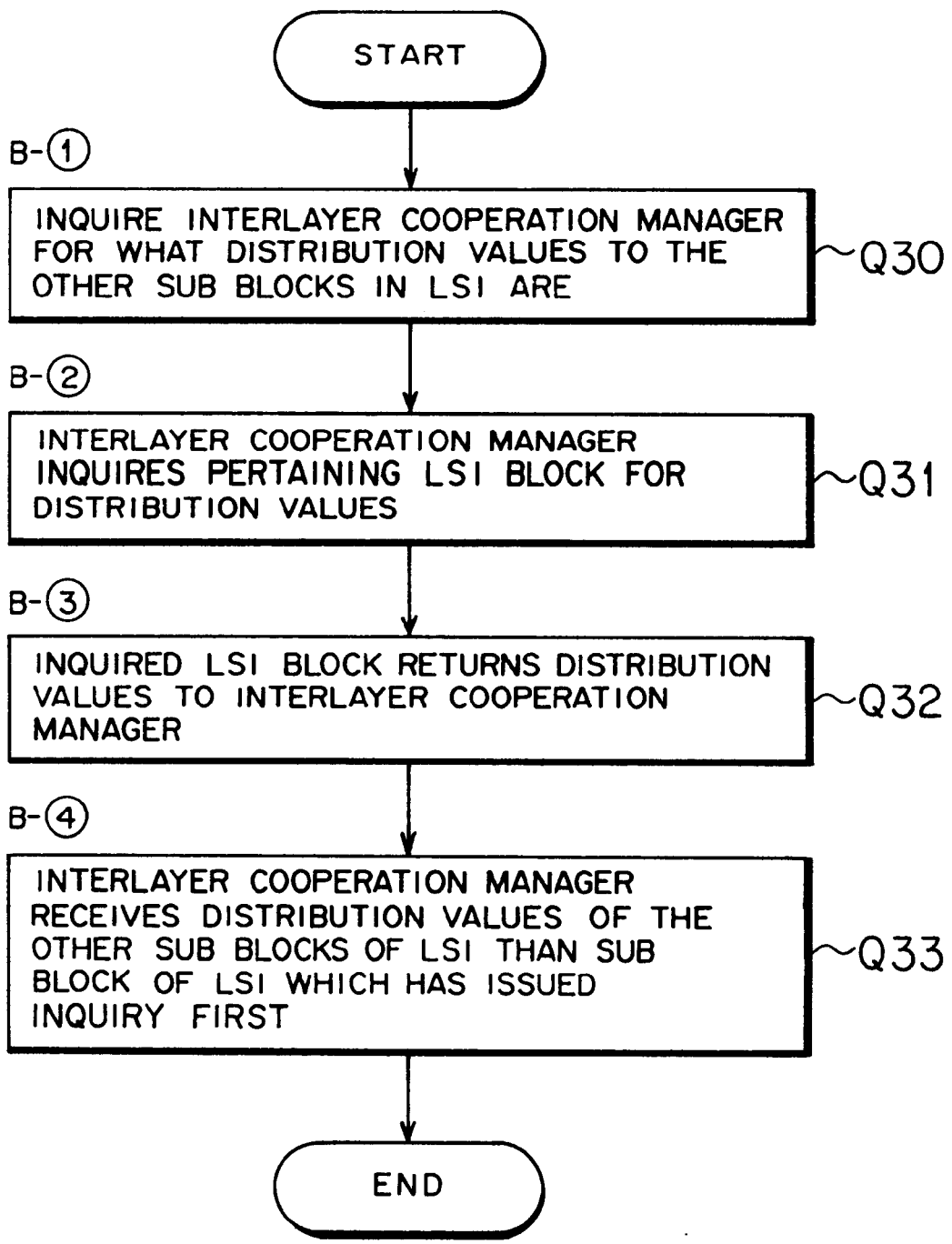
Figure 38:
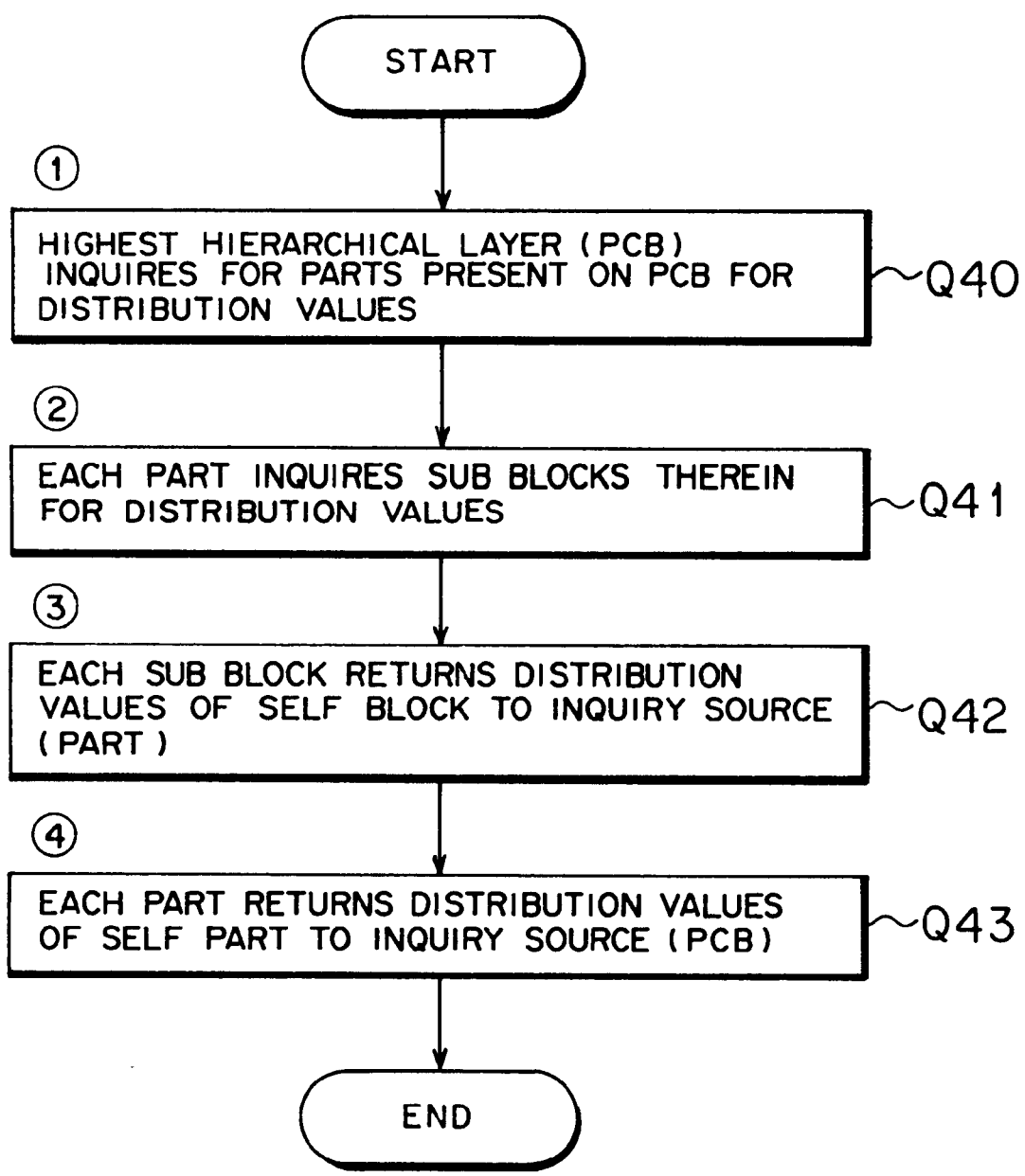

FIGS. 36 to 38 are flow charts each illustrating part of timing distribution according to the second embodiment of the present invention. Particularly, FIG. 36 is a flow chart illustrating timing distribution when data are updated between intermediate hierarchical layers and corresponds to the locations denoted by A-① and A-② in FIG. 21.

FIG. 37 illustrates a process wherein an inquiry is sent between intermediate hierarchical layers, and corresponds to the locations denoted by B-① to B-④ in FIG. 21.

FIG. 38 illustrates a process wherein an inquiry for timings of the entire apparatus is sent between the highest hierarchical layer and an intermediate hierarchical layer. In the flow charts shown in FIGS. 36 to 38, message communication is performed between the interlayer association manager 53 and a distribution managers 56a to 56e.

In particular, the interlayer association manager 53 discriminates to which one of the distribution managers 56a to 56e a message from the distribution manager 56a should be transmitted, and transmits the received message data to the object one of the design information databases 5.

First, in step Q20 of FIG. 30, AC specifications of virtual pins of a sub block of an LSI and distribution values of the clock skew in a certain hierarchical layer are fetched into an immediately higher hierarchical layer (for example, a timing information database of the LSI). Then in step Q21, AC specifications of virtual pins of the LSI and clock skew distribution values are fetched into an immediately higher hierarchical layer (for example, a timing information database of a PCB).

In step Q30 of FIG. 37, each of the distribution managers 56a to 56e inquires the interlayer association manager 53 for what distribution values to the other sub blocks in the LSI are. Then, the interlayer association manager 53 inquires an LSI block, which takes charge of the distribution managers 56a to 56e and hence is an immediately higher order block, for distribution values in step Q31. Since the LSI block stores distribution values of the other LSI blocks which instance the LSI, the LSI block having received the inquiry returns the distribution values to the interlayer association manager 53 in step Q32. The interlayer association manager 53 thus receives the distribution values of the other sub blocks of the LSI than the sub block of the LSI which has issued the inquiry first in step Q33.

Referring now to FIG. 38, in step Q40, the highest hierarchical layer (PCB) issues an inquiry for distribution values to the parts present on the PCB. Then, each of the parts issues an inquiry for a distribution value to sub blocks present in the part in step Q41. Each of the sub blocks returns a distribution value of the block of itself to the part of the source of the inquiry in step Q42. Then, each of the parts returns distribution values of the part of itself to the PCB of the source of the inquiry in step Q43. It is to be noted that the reference characters ① to ④ shown in FIG. 38 correspond to those shown in FIG. 22.

Figure 39:
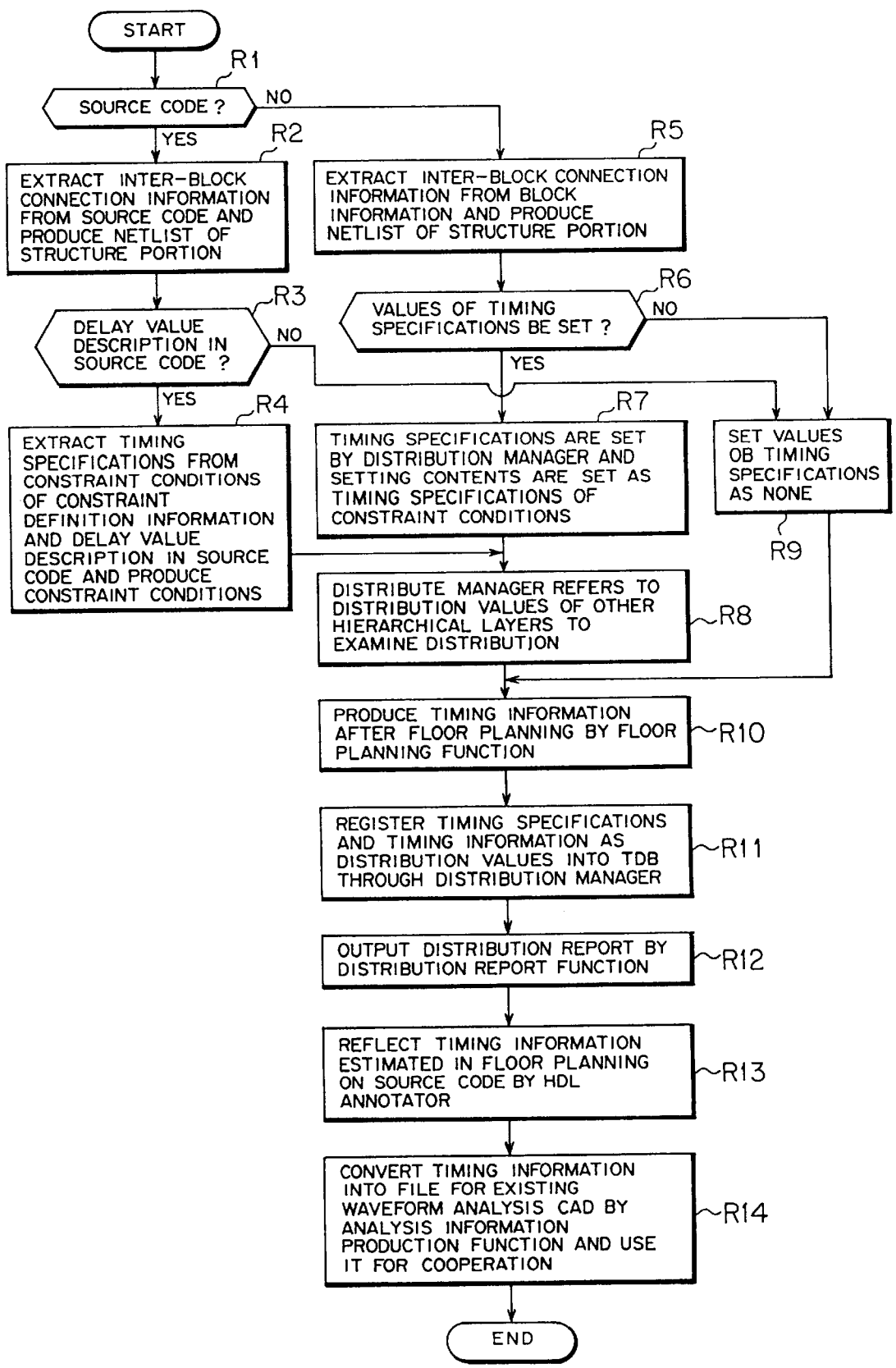
FIG. 39 is a flow chart illustrating operation of a timing distribution production section according to the second embodiment of the present invention.

FIG. 39 is a flow chart illustrating operation of the timing distribution production section 54a to 54e according to the second embodiment of the present invention. Referring to FIG. 39, it is first discriminated in step R1 whether or not there is a source code. If a source code is present, then the processing advances along the route denoted by Y, and inter-block connection information is extracted from the source code to produce a netlist of the structure portion in step R2. Then in step R3, it is discriminated whether or not there is description of delay values in the source code. If such description is present, then the processing advances along the Y route, and in step R4, timing specifications are extracted from constraint conditions (operation speeds, gate scales and so forth) of constraint definition information and the delay value description in the source code are extracted to produce constraint conditions. On the other hand, when there is no delay value description in step R3, the processing advances along the N route and processing in steps R9 et seq. is performed.

On the other hand, if no source code is present in step R1, then the processing advances along the route denoted by N, and inter-block connection information is extracted from the block information to produce a netlist of the structure portion in step R5. Then in step R6, it is discriminated whether or not values of timing specifications should be set. If such values should be set, the processing advances along the Y route, and in step R7, the timing distribution production section 54a read out the netlists from the structural portion netlist storage section 58c and the timing specifications are inputted manually by the distribution editor 63a (refer to FIG. 31) in the distribution manager 56a (refer to ① of FIG. 21). Further, the setting contents are written as timing specifications of the constraint conditions into the constraint condition storage section 58b (refer to ② of FIG. 21). Further, if values of timing specifications should not be set in step R6, then the processing advances along the N route, and in step R9, it is set that the values of the timing specifications are blank (none).

Then, the distribution manager 56a refers to the distribution values of the other hierarchical layers to examine the distribution in step R8, and the floor planning section 55a produces timing information after floor planning in step R10. Then, the timing specifications and the timing information are registered as distribution values into the timing information database 57a through the distribution manager 56a in step R11. Then, the distribution report production section 50d outputs a distribution report in step R12, and the timing information obtained by the floor planning section 55a is reflected on the source code by the HDL annotator 58e in step R13. Then, the timing information is converted into a file for waveform analysis CAD and used for association by the waveform analysis information production section 58h in step R14.

Then, by the rounding technique described hereinabove, for a value with which a part or circuit block having a low degree of accuracy is used, a minimum value and a maximum value are used to provide a range for the delay time, and the part or circuit block is connected to another part or circuit block of a high degree of accuracy or is designed in a mixed state with a different part or circuit block having a different degree of accuracy.

Further, in timing distribution of a PCB, not only an existing technique but also oblique wiring are used to produce timing information. First, wiring according to a Manhattan length or an oblique Manhattan length is used to calculate a wiring line congestion degree, and when the wiring line congestion degree is lower than a preset condition, distribution values are distributed by wiring according to a simple Manhattan length or a Manhattan length which takes oblique wiring into consideration.

On the other hand, where the wiring line congestion degree is higher than the preset condition, one of the following steps (7-1) and (7-2) is used to perform timing distribution.

(7-1) A delay value is increased in accordance with the wiring line congestion degree to obtain a higher delay value.

(7-2) The actual wiring association sections 60c and 60d individually perform data conversion and perform actual wiring using an existing technique, and convert the data into delay values based on wiring line information of the actual wiring and distribute the delay values.

Figure 40:
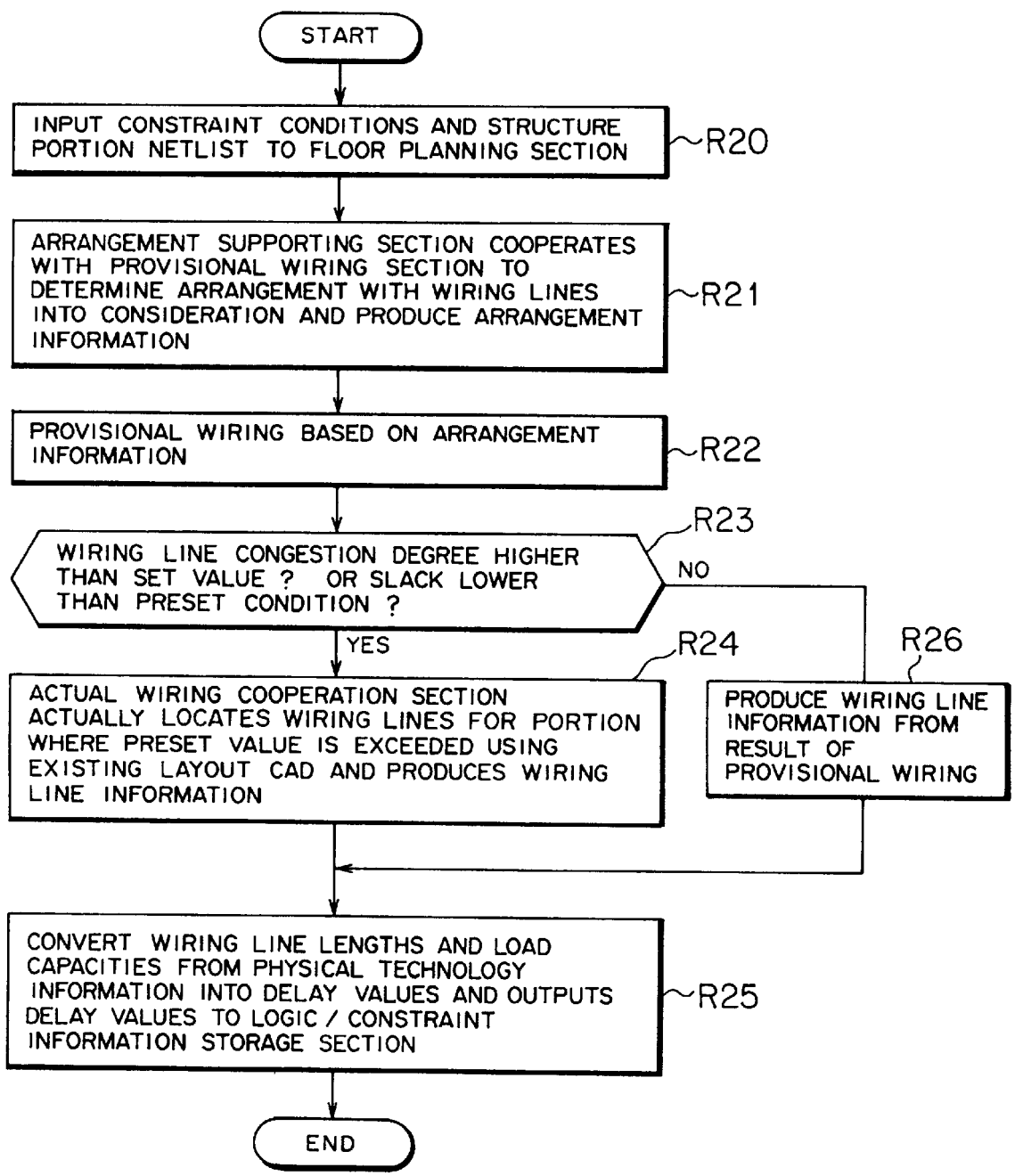
FIG. 40 is a flow chart illustrating operation of a floor planning section according to the second embodiment of the present invention.

FIG. 40 is a flow chart illustrating operation of the floor planning section 55a according to the second embodiment of the present invention. Also the floor planning sections 55b to 55e operate similarly to the floor planning section 55a. Referring to FIG. 40, the floor planning section 55a receives constraint conditions and a structure portion netlist as inputs thereto in step R20. The arrangement supporting section 59a cooperates with the provisional wiring sections (Manhattan length provisional wiring section 60a and oblique Manhattan length provisional wiring section 60b) to determine arrangement taking wiring lines into consideration in step R21 and executes provisional wiring based on the arrangement information in step R22.

Then, it is discriminated in step R23 whether or not the wiring line congestion degree is higher than a preset value or whether or not the slack is lower than a preset condition. If one of the conditions is satisfied, then the processing advances along the Y route, and in step R24, the actual wiring association sections 60c and 60d perform actual wiring for the portion with which the preset value is exceeded using the layout CAD apparatus 52a and 52c to produce wiring line information. Further, the floor planning section 55a uses physical technology information to convert wiring line lengths and load capacities into delay values and writes the delay values into the logic/constraint information storage section 64a in step R25. On the other hand, if it is discriminated in step R23 that none of the conditions is satisfied, then the processing advances along the N route, and at step R26, the floor planning section 55a produces wiring information using a result of the provisional wiring, whereafter the processing in step R25 is executed.

Figure 41:
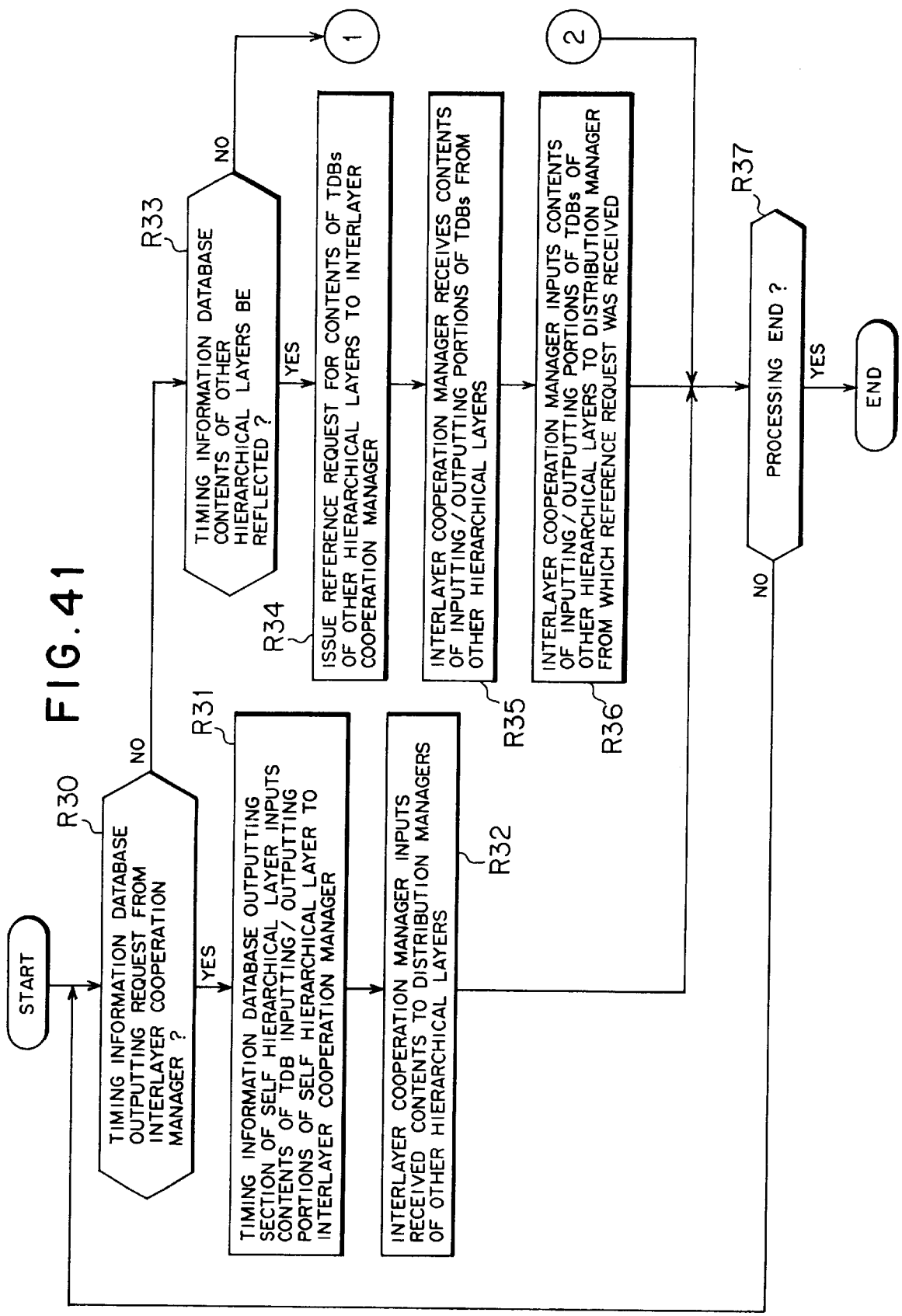
FIGS. 41 and 42 are flow charts both illustrating operation of a distribution manager according to the second embodiment of the present invention.
Figure 42:
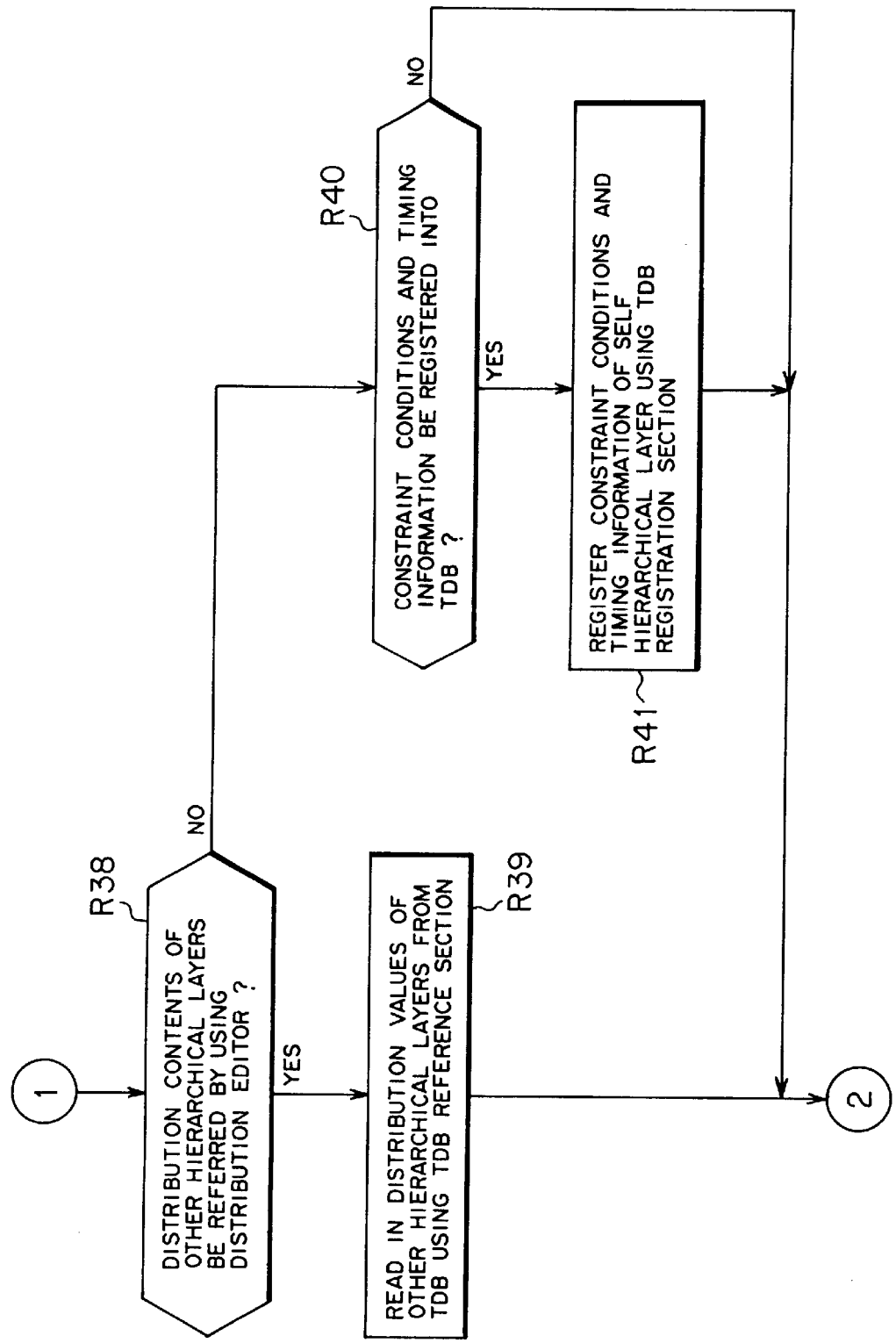
Figure 43:
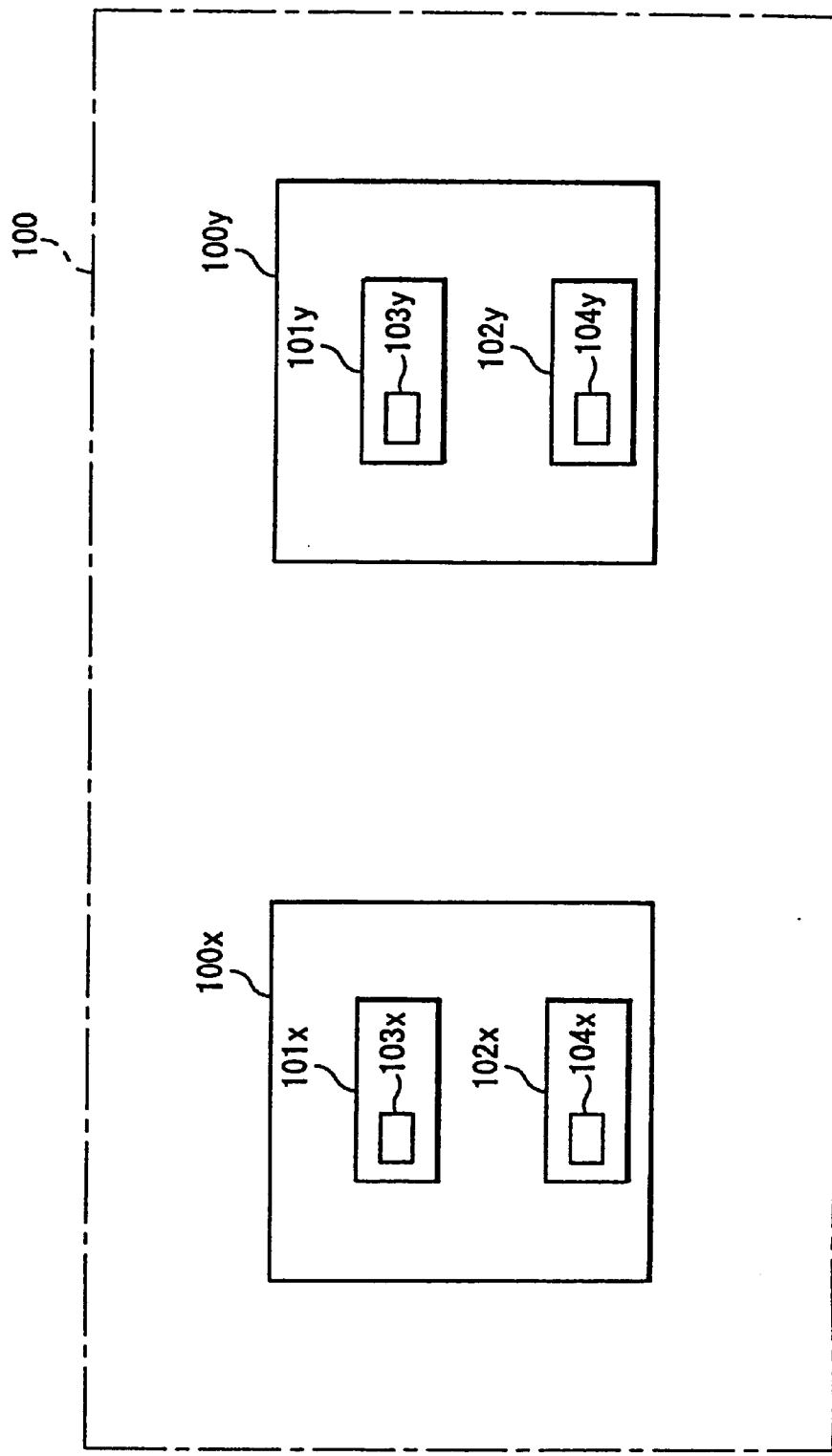
FIG. 43 is a diagrammatic view illustrating a concept of hierarchical design.
Figure 44:
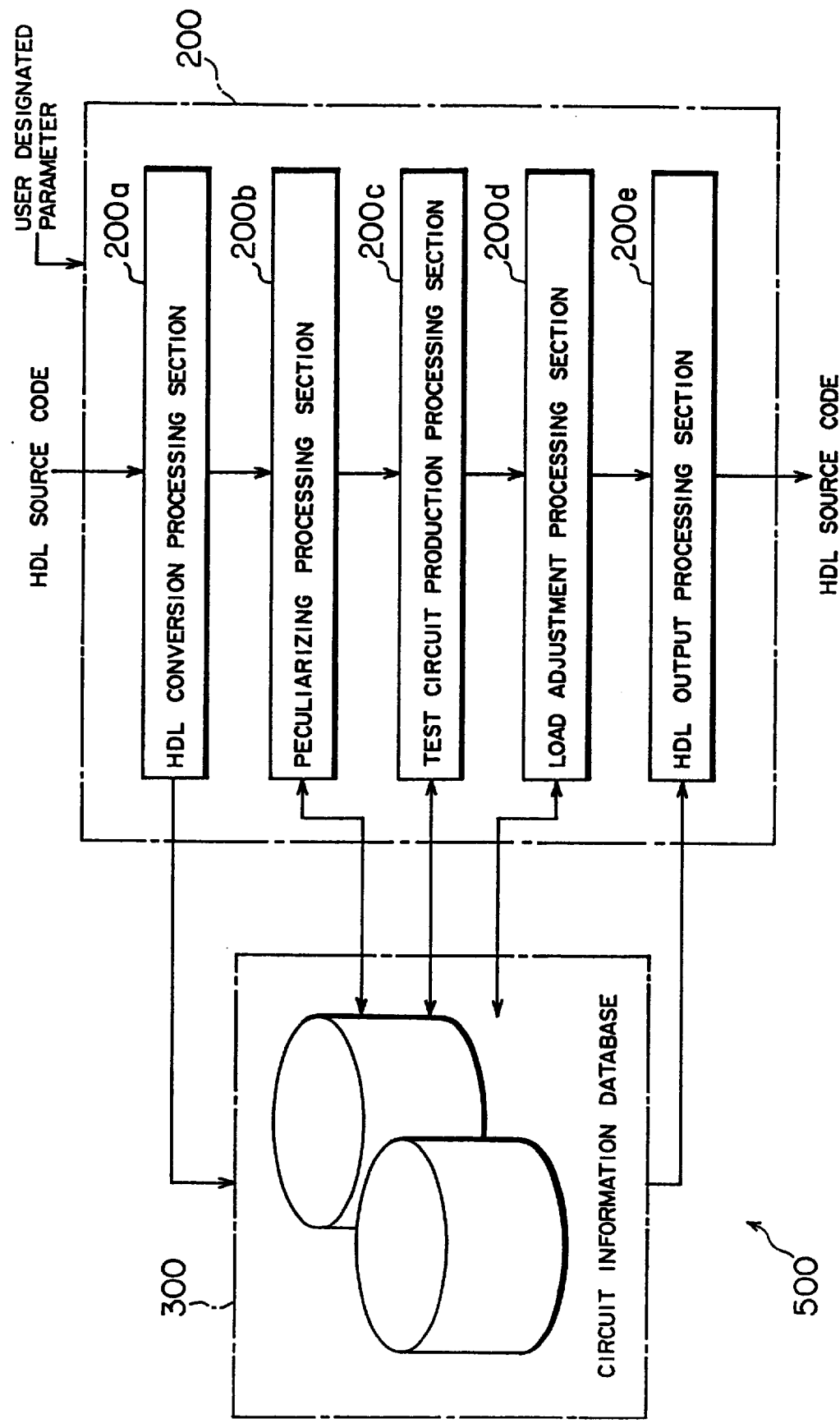
FIG. 44 is a block diagram of a semiconductor circuit designing apparatus.
Figure 47:
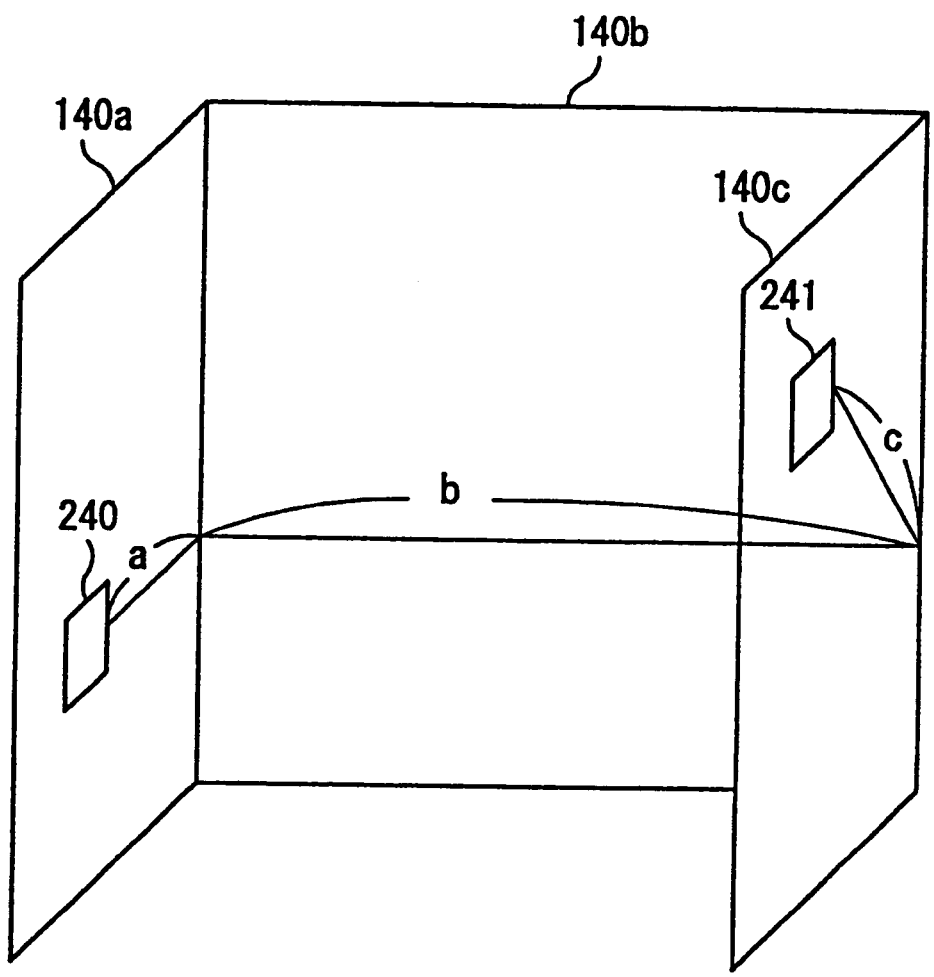
FIG. 47 is a diagrammatic view illustrating timing distribution.
Figure 48:
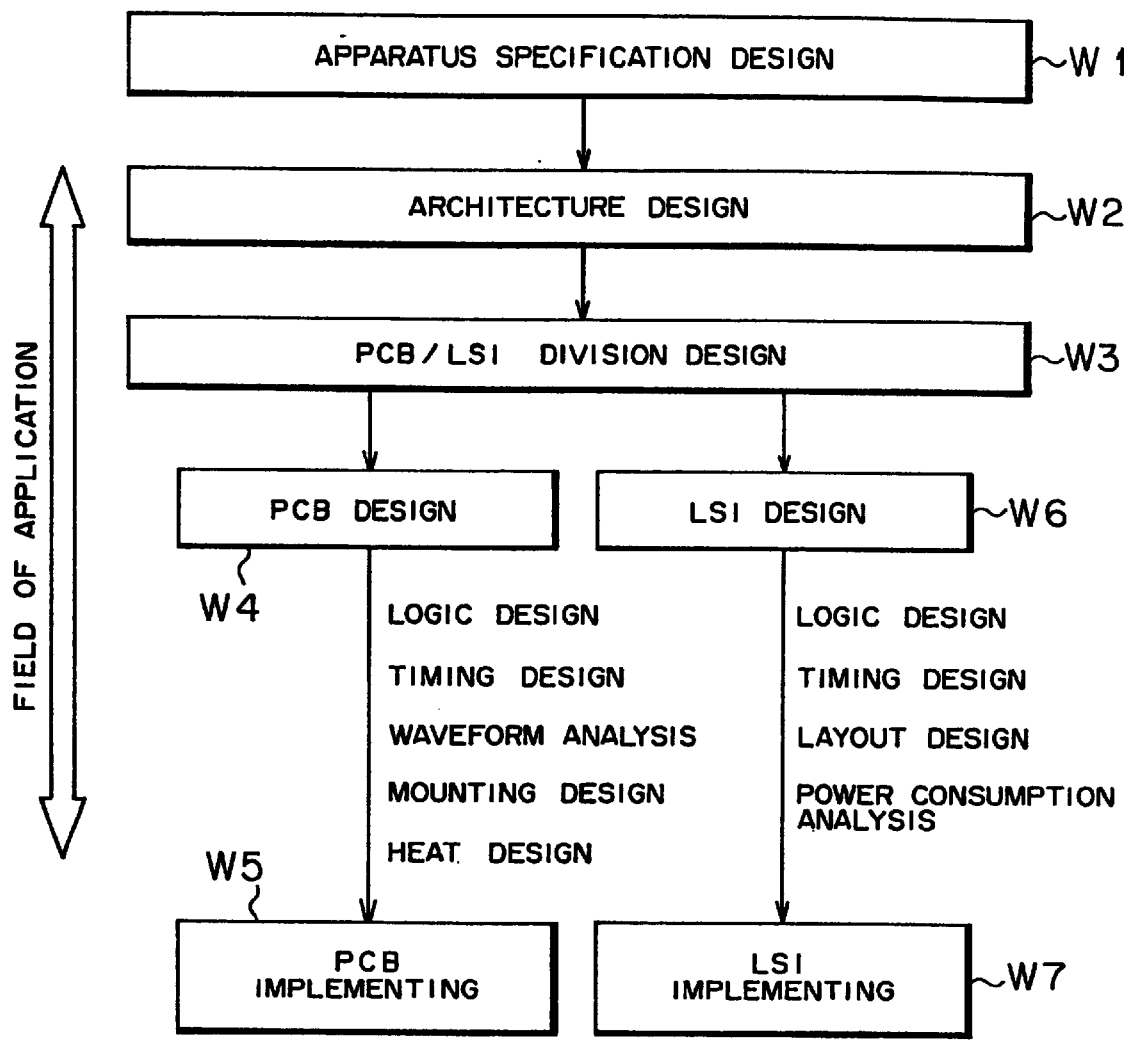
FIG. 48 is a flow chart illustrating an outline of apparatus design.
Figure 49:
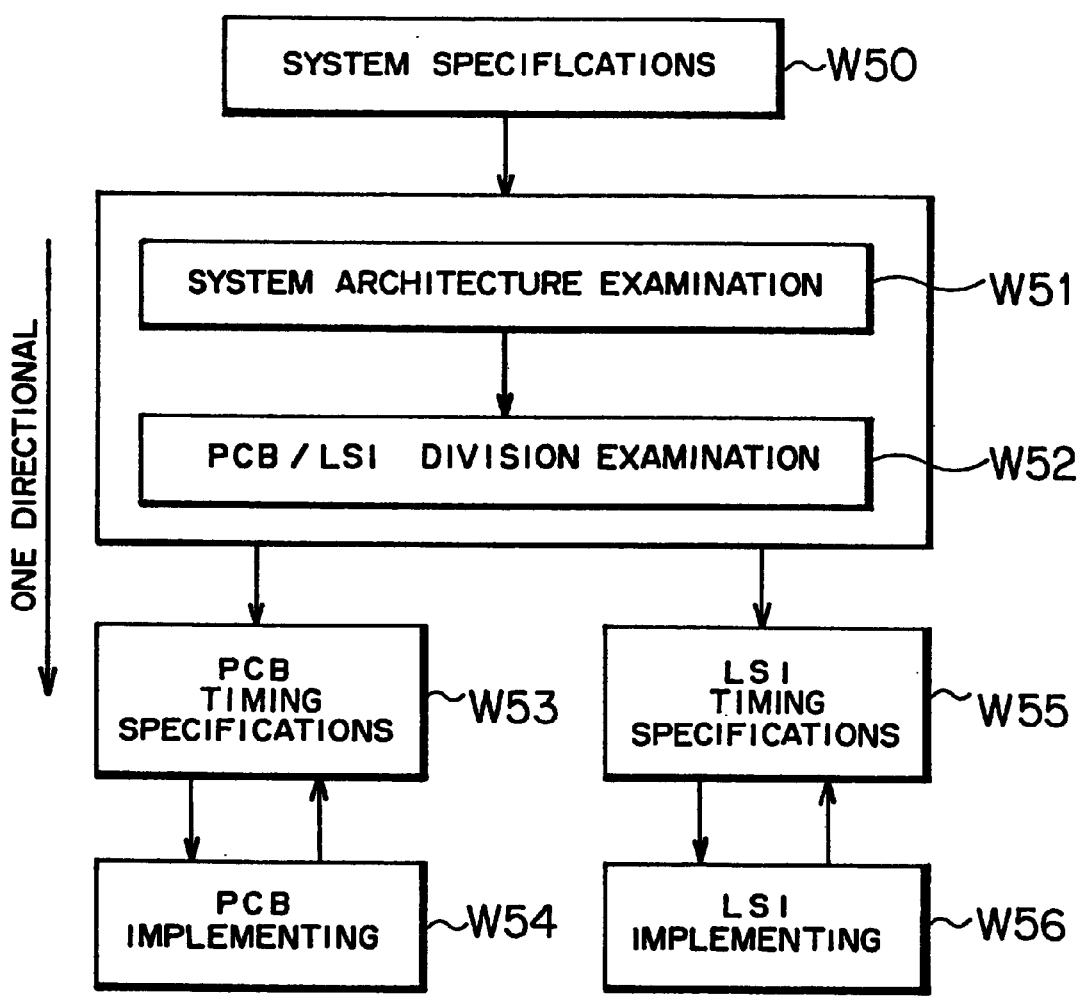
FIG. 49 is a flow chart illustrating timing design.
Figure 50:
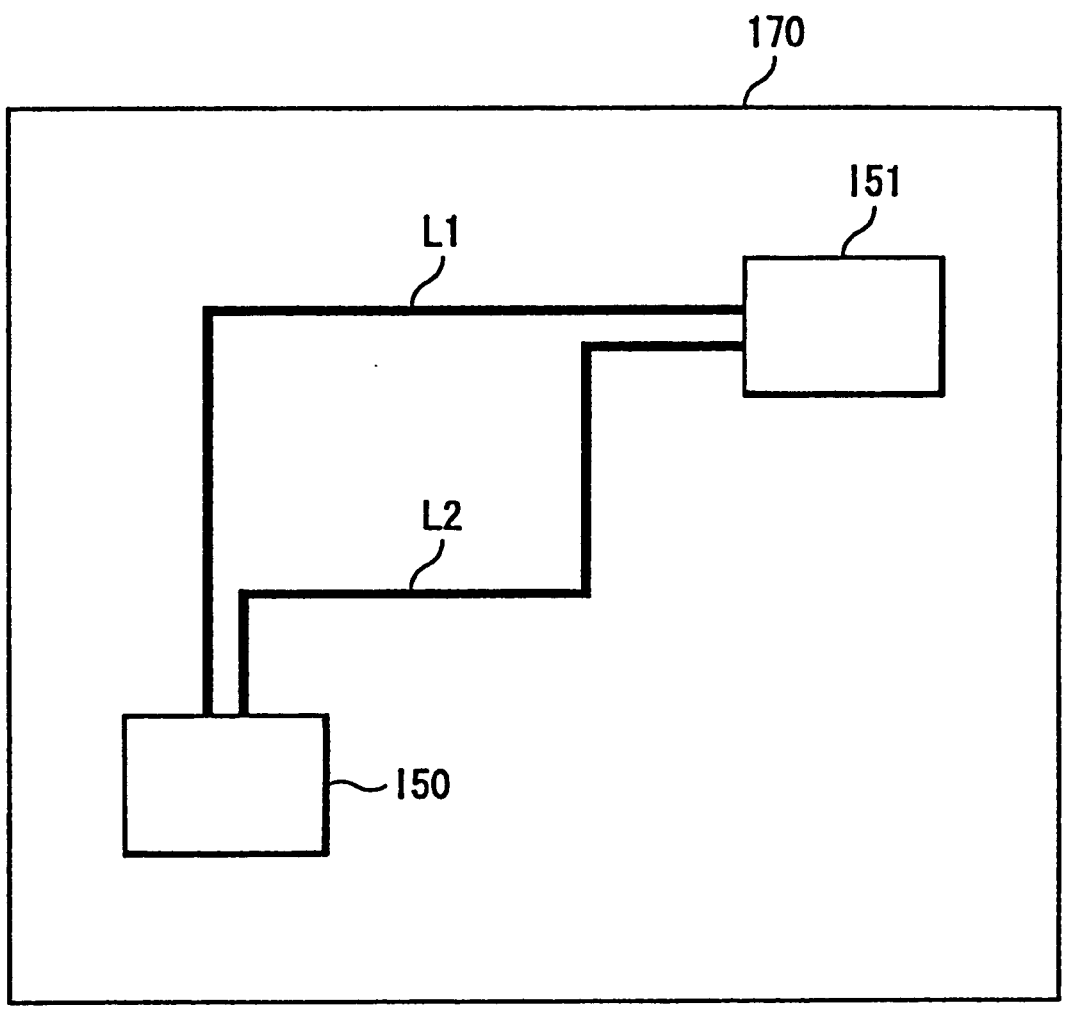
FIG. 50 is a diagrammatic view illustrating a Manhattan length.

FIGS. 41 and 42 are flow charts illustrating operation of the distribution manager 56a according to the second embodiment of the present invention. Also the distribution managers 56b to 56e operate similarly to the distribution manager 56a.

Referring first to FIG. 41, the distribution manager 56a discriminates in step R30 whether or not a TDB outputting request from the interlayer association manager 53 is received. If a TDB outputting request is received, then the processing advances along the Y route, and in step R31, the TDB output reflection section 63d inputs contents of TDB input and output portions of the self hierarchical layer to the interlayer association manager 53. Then in step R32, the interlayer association manager 53 inputs the received contents to the distribution managers 56b to 56e of the other hierarchical layers.

On the other hand, if it is discriminated in step R30 that no TDB outputting request is received, then the processing advances along the N route, and in step R33, it is determined whether or not contents of the timing information databases 57a to 57e of the other hierarchical layers should be reflected. If such contents should be reflected, then the processing advances along the Y route, and in step R34, the distribution manager 56a issues a referring request to the contents of the timing information databases 57a to 57e of the other hierarchical layers to the interlayer association manager 53. Then, when the interlayer association manager 53 receives the contents of the input and output portions of the timing information databases 57a to 57e from the other hierarchical layers in step R35, the distribution manager 56a inputs, in step R36, the contents of the input and output portions of the timing information databases 57a to 57e of the other hierarchical layers to that one of the distribution manager 56a to 56e from which the referring request has been received. Then in step R37, it is discriminated whether or not the process comes to an end. If the process comes to an end, then the processing advances along the Y route, and the processing is ended. But if the process does not come to an end, then the processing advances along the N route, and the processing beginning with step R30 is executed.

If the contents of the timing information databases 57a to 57e of the other hierarchical layers should not be reflected in step R33, then the processing advances along the N route (denoted by 1 in FIG. 41) and thus advances to step R38 shown in FIG. 42. It is to be noted that reference numeral 2 in FIG. 41 denotes a route along which the processing should advance after step R39 or step R41 shown in FIG. 42 is executed.

Referring now to FIG. 42, the distribution manager 56a discriminates, in step R38, whether or not distribution contents of the other hierarchical layers should be referred to using the distribution editor 63a. If such distribution contents should be referred to, then the processing advances along the Y route, and in step R39, the distribution manager 56a reads in the distribution values of the other hierarchical layers from the timing information database 57a using the TDB reference section 63c. Thereafter, the processing advances to step R37 of FIG. 41. On the other hand, if such distribution contents as described above should not be referred to, then the processing advances along the N route, and in step R40, the distribution manager 56a discriminates whether or not the constraint conditions and timing information should be registered into the timing information databases 57a to 57e. If the constraint conditions and timing information should be registered, then the processing advances along the Y route, and in step R41, the distribution manager 56a registers the constraint conditions and timing information of the self hierarchical layer into the timing information databases 57a to 57e using the TDB registration section 63b. On the other hand, if the constraint conditions and timing information should not be registered in step R40, the processing advances along the N route and thus advances to step R37 of FIG. 41.

In this manner, the timing conditions of the entire system can be satisfied through the association with the other hierarchical layers. Further, the designer can distribute timings with a high degree of accuracy by means of the floor planning section 55a without taking care of the tradeoff between the processing speed and the estimated degree of accuracy.

This is because it is automatically selected whether wiring lines should be located by provisional wiring or actual wiring through the steps (7-1) and (7-2) given hereinabove (refer to FIG. 40) and this is determined for each of the circuit blocks (logic blocks) and consequently provisionally wired lines and actually wired lines can be located in a mixed state on one PCB or on one chip.

Since provisional wiring or actual wiring is automatically and selectively performed in response to the wiring line congestion degree in this manner, the tradeoff can be utilized effectively and the labor of the designer can be reduced. Further, if the threshold value for a wiring line congestion degree is exceeded during wiring, then each time the threshold value is exceeded, the number of wiring line layers is incremented and calculated as final wiring line layers.

In this manner, a necessary number of wiring line layers can be recognized without performing layout again. Further, an attribute is provided to each pin or each wiring line, and a plurality of pins or a plurality of wiring lines are distributed collectively thereby to decrease the number of man-hours for the distribution.

Then, the designer applies a netlist representation with a wiring scheme taken into consideration to write a sub signal name after the layout into the HDL source code through the HDL annotator 58e. Information regarding the sub signal name is fetched using such manners as given in (8-1) to (8-3) below.

(8-1) The information regarding the sub signal name is fetched into the HDL annotator 58e and reflected on a delay value description of a signal substitute statement of the source code. Consequently, a timing distribution value can be designated.

(8-2) A netlist representation with a wiring form taken into consideration is taken in the form of a comment statement into the source code. Consequently, the designer can proceed with HDL design while grasping a relationship in distance or order between a source pin and a sink pin after floor planning together with a fan-out number and distribution values. Further, before layout, a wiring form can be designated also from logic design. Accordingly, before RTL design for describing inputs to registers, a floor plan can be produced and the length of a wiring line path can be estimated in advance. Therefore, the designer can examine whether or not the signal propagation time is within one cycle, and if the signal propagation time is not within one cycle, then the user can give an instruction to insert a flip-flop or a buffer and can thus take a countermeasure in an early stage.

(8-3) The information regarding the sub signal name is fetched into the waveform analysis information production section 58h, from which information necessary for waveform analysis is outputted.

Further, the physical technology information includes, for each technology, a delay value for each unit wiring line length and a load capacity. The designer uses the information to try and examine sub system division from architecture design to PCB design and sub system division from architecture design to LSI design. Further, for any portion for which particular examination is required, the designer performs examination using the existing layout CAD apparatus 52a and 52c.

In addition, since the physical technology information is used, the designer can change the technology (PCB or LSI) to be used for a circuit block upon production of a floor plan. Then, if the technology is changed, then the delay value per unit wiring line length and the load capacity used for production of a floor plan are automatically changed by referring to the physical technology information.

Furthermore, a library for waveform analysis of the PCB is produced using the information stored in the timing information databases 57a to 57e of the LSI hierarchical layer. In addition, the wiring form can be taken in as information necessary for waveform analysis from the PCB hierarchical layer through the forms (8-1) to (8-3) described above. Consequently, waveform analysis of the PCB can be performed before the LSI is completed.

Further, the wiring line delay value can be calculated in accordance with an expression (9) given below. Here, the crosstalk signifies noise produced from wiring lines which are positioned closely to each other, and in order to eliminate the noise, the distance between the wiring lines is increased, or the lengths of the portions of the wiring lines along which the crosstalk occurs are changed.

wiring line delay value=(delay value per unit wiring line length× wiring line length)+(delay amount per unit wiring line length of crosstalk portion×wiring line length of crosstalk portion) (9)

For example, if it is assumed that, with regard to the PCB technology or the LSI technology, the delay value per unit wiring line length is 7 ps/mm (picosecond/millimeter); the total wiring line length is 157 mm; the delay value of a crosstalk portion per unit wiring line length is 1 ps/mm; and the wiring line length of the crosstalk portion is 50 mm, the delay value is 7 ps×157+1 ps×50=1.149 ns.

Further, data regarding a floor plan are automatically converted into layout data for implementing by the actual wiring association sections 60c and 60d, and the layout information is taken over. A notification of insufficient data is issued to the designer.

Since, upon shrinking (reduction of the chip area as a result of refinement of semiconductor devices which raises the density and makes it possible to integrate a greater number of circuits in the same area), information of a higher order circuit block (for example, a floor plan of a PCB) is taken over by a lower order circuit block (LSI), the designer can effectively utilize design resources regarding the layout information (layout information of the PCB).

Further, if the static timing analysis is performed based on a result of floor planning but does not remain within one cycle, then an instruction to insert a flip-flop or a buffer is outputted as a distribution report. The RTL can be designed after transmission delays are distributed in advance, and a problem upon implementing can be estimated and consequently otherwise possible iterations can be reduced.

Accordingly, since a flip-flop with a timing taken into consideration is inserted upon architecture design, iterations for re-designing of the RTL can be reduced. In addition, where a flip-flop is to be inserted, when compared with an alternative case wherein a buffer is inserted, even if the delay time which should satisfy a control condition (setup time) exceeds the control condition, the delay time can be suppressed so as to be within the constraint condition by dividing the path.

C. Others

The present invention is not limited to the embodiments specifically described above, and variations and modifications can be made without departing from the scope of the present invention.

For example, the names described hereinabove can be changed in various manners. It is to be noted that the data images in the foregoing description are not limited to those of the format described hereinabove. In the first embodiment, the representation of a name may use the underscore mark in place of the hyphen mark.

The peculiarizing process, test circuit production process and load adjustment process need not be executed in this order but may naturally be executed in various orders or with some other process or processes inserted therein. Also where the processes are executed in a thus changed order, the superiority of the present invention still remains.

What is claimed is:

1. A circuit designing apparatus, comprising:
   a circuit information database to store information regarding a circuit;
   a designing processing section to read out the information regarding the circuit from said circuit information database and to design the circuit for each predetermined unit to be processed; and
   a design information database to store design information, obtained by said designing processing section, including at least peculiarizing information of circuit elements, change history information representative of a history of changes of the circuit and terminal load and driving capacity information of the circuit,
   a design information reading-in section to read in design information written in said design information database; and
   a processing object discrimination section to discriminate based on the design information written in said design information database, through said design information reading-in section, whether the unit to be processed is an object of the processing, and to discriminate a location of an object to be processed readily based on a parameter inputted by a designer and the peculiarizing information obtained from said design information reading-in section, wherein said processing object discrimination section discriminates whether the design information regarding a unit being currently processed is written in said design information database.

2. The circuit designing apparatus as claimed in claim 1, wherein said designing processing section includes:
   a peculiarizing processing section to read out the peculiarizing information from said design information database and to apply different names with each other to the individual units to be processed;
   a test circuit production processing section to read out the change history information from said design information database and to produce a test circuit of a higher hierarchical layer; and
   a load adjustment processing section to read out the terminal load and driving capacity information from said design information database, to apply the design information to terminals included in a circuit of the higher hierarchical layer and to adjust the load based on the design information.

3. The circuit designing apparatus as claimed in claim 2, wherein at least one of said peculiarizing processing section, test circuit production processing section and load adjustment processing section performs hierarchical design wherein the circuit is designed in a state wherein one of the units to be processed hierarchically contains another unit designed independently.

4. The circuit designing apparatus as claimed in claim 2, wherein said processing object discrimination section discriminates, based on first unit information regarding a processing result of a first unit obtained by processing the first unit of the design information, whether a unit included in a second unit to be processed next has been processed already.

5. The circuit designing apparatus as claimed in claim 2, wherein at least one of said peculiarizing processing section, test circuit production processing section and load adjustment processing section performs engineering change order design wherein some of the units to be processed are changed while the other units of the circuit are not changed to proceed with re-designing.

6. The circuit designing apparatus as claimed in claim 5 wherein at least one of said peculiarizing processing section, test circuit production processing section and load adjustment processing section includes a design information read-in section to read in predetermined design information produced upon predetermined design, and a processing object discrimination section to discriminate circuit data to be processed using the predetermined design information and engineering change order design object unit information given in the form of a parameter, and to design a circuit which corresponds to a circuit designed using the predetermined design information except a changed portion.

7. The circuit designing apparatus as claimed in claim 5, wherein said design information database includes a plurality of storage sections for individually storing the circuit elements into individual files.

8. The circuit designing apparatus as claimed in claim 1, wherein said circuit information database includes:
   a circuit information writing section for writing circuit information for each processed unit into said circuit information database in at least one of hierarchical design and engineering change order design; and
   a reference section connected to said circuit information writing section for referring to the circuit information written for each unit to be processed.

9. A circuit designing apparatus, comprising:
   a circuit information database to store information regarding a circuit;
   a designing processing section to read out the information regarding the circuit from said circuit information database and to design the circuit for each predetermined unit to be processed; and
   a design information database to store design information, obtained by said designing processing section, including at least peculiarizing information of circuit elements, change history information representative of a history of changes of the circuit and terminal load and driving capacity information of the circuit;
   said designing processing section including:
      a peculiarizing processing section to read out the peculiarizing information from said design information database and to apply different names with each other to the individual units to be processed;
      a test circuit production processing section to read out the change history information from said design information database and to produce a test circuit of a higher hierarchical layer; and a load adjustment processing section to read out the terminal load and driving capacity information from said design information database, to apply the design information to terminals including in a circuit of the higher hierarchical layer and to adjust the load based on the design information; and at least one of said peculiarizing processing section, test circuit production processing section and load adjustment processing section performs hierarchical design wherein the circuit is designed in a state wherein one of the units to be processed hierarchically contains another unit designed independently, wherein said peculiarizing processing section includes:

a peculiar name application rule setting section to set a peculiar name application rule in accordance with which a peculiar name should be applied to each of the units to be processed based on a parameter regarding the names of the circuit elements based on said design information database; and a peculiar name production section to produce a peculiar name different from the peculiar names applied to the units which is processed already for any of the units to be processed based on the peculiar name application rule set by said peculiar name application rule setting section.

10. A circuit designing apparatus, comprising:

a circuit information database to store information regarding a circuit;

a designing processing section to read out the information regarding the circuit from said circuit information database and to design the circuit for each predetermined unit to be processed; and a design information database to store design information, obtained by said designing processing section, including the at least peculiarizing information of circuit elements, change history information representative of a history of changes of the circuit and terminal load and driving capacity information of the circuit;

said designing processing section including:

a peculiarizing processing section to read out the peculiarizing information from said design information database and apply different names with each other to the individual units to be processed;

a test circuit production processing section to read out the change history information from said design information database and to produce a test circuit of a higher hierarchical layer; and a load adjustment processing section to read out the terminal load and driving capacity information from said design information database, to apply the design information to terminals including in a circuit of the higher hierarchical layer and to adjust the load based on the design information; and at least one of said peculiarizing processing section, test circuit production processing section and load adjustment processing section performs hierarchical design wherein the circuit is designed in a state wherein one of the units to be processed hierarchically contains another unit designed independently, wherein said peculiarizing processing section further includes a plural-reference analysis section to search for a location at which a plurality of same circuit units is used and to discriminate a hierarchical layer, a cell and a black box regarding a type of the circuit units at the location, and said peculiar name production section produces a peculiar name for each of plural-reference units and single-reference units discriminated by said plural-reference analysis section.

11. A circuit designing apparatus, comprising:

a circuit information database to store information regarding a circuit;

a designing processing section to read out the information regarding the circuit from said circuit information database and to design the circuit for each predetermined unit to be processed; and a design information database to store design information, obtained by said designing processing section, including the at least peculiarizing information of circuit elements, change history information representative of a history of changes of the circuit and terminal load and driving capacity information of the circuit;

said designing processing section including:

a peculiarizing processing section to read out the peculiarizing information from said design information database and apply different names with each other to the individual units to be processed;

a test circuit production processing section to read out the change history information from said design information database and to produce a test circuit of a higher hierarchical layer; and a load adjustment processing section to read out the terminal load and driving capacity information from said design information database, to apply the design information to terminals including in a circuit of the higher hierarchical layer and to adjust the load based on the design information; and at least one of said peculiarizing processing section, test circuit production processing section and load adjustment processing section performs hierarchical design wherein the circuit is designed in a state wherein one of the units to be processed hierarchically contains another unit designed independently, wherein said peculiarizing processing section further includes a plural-reference analysis section to search for a location at which a plurality of same circuit units is used and to discriminate a hierarchical layer, a cell and a black box regarding a type of the circuit units at the location, and said peculiar name production section produces a peculiar name for each of the plural reference units and single reference units discriminated by said plural-reference analysis section, wherein said peculiarizing processing section further includes a plural-reference analysis section to search for a location at which a plurality of same circuit units is used and to discriminate a hierarchical layer, a cell and a black box regarding a type of the circuit units at the location, and said peculiar name production section produces a peculiar name for each of plural-reference units sand single-reference units discriminated by said plurality reference analysis section, wherein said peculiarizing processing section further includes a circuit data duplication section to allocate peculiar names produced by said peculiar name production section to the plural-reference units and the single-reference units to duplicate circuit data.

12. A circuit designing apparatus, comprising:

a circuit information database to store information regarding a circuit;

a designing processing section to read out the information regarding the circuit from said circuit information database and to design the circuit for each predetermined unit to be processed; and a design information database to store design information, obtained by said designing processing section, including the at least peculiarizing information of circuit elements, change history information representative of a history of changes of the circuit and terminal load and driving capacity information of the circuit;

said designing processing section including:

a peculiarizing processing section to read out the peculiarizing information from said design information database and apply different names with each other to the individual units to be processed;

a test circuit production processing section to read out the change history information from said design information database and to produce a test circuit of a higher hierarchical layer; and a load adjustment processing section to read out the terminal load and driving capacity information from said design information database, to apply the design information to terminals including in a circuit of the higher hierarchical layer and to adjust the load based on the design information; and at least one of said peculiarizing processing section, test circuit production processing section and load adjustment processing section performs hierarchical design wherein the circuit is designed in a state wherein one of the units to be processed hierarchically contains another unit designed independently, and includes:

a processing object discrimination section to discriminate, when the higher hierarchical layer is to be processed, whether the unit to be processed is an object of processing based on the design information written in said design information database; and a processing data acquisition section to acquire circuit data of the unit to be processed from said circuit information database based on a discrimination by said processing object discrimination section of whether the unit to be processed is an object processed.

13. A circuit designing apparatus, comprising:

a circuit information database to store information regarding a circuit;

a designing processing section to read out the information regarding the circuit from said circuit information database and to design the circuit for each predetermined unit to be processed; and a design information database to store design information, obtained by said designing processing section, including at least peculiarizing information of circuit elements, change history information representative of a history of changes of the circuit and terminal load and driving capacity information of the circuit;

said designing processing section including:

a peculiarizing processing section to read out the peculiarizing information from said design information database and apply different names with each other to the individual units to be processed;

a test circuit production processing section to read out the change history information from said design information database and to produce a test circuit of a higher hierarchical layer; and a load adjustment processing section to read out the terminal load and driving capacity information from said design information database, to apply the design information to terminals including in a circuit of the higher hierarchical layer and to adjust the load based on the design information; and at least one of said peculiarizing processing section, test circuit production processing section and load adjustment processing section performs hierarchical design wherein the circuit is designed in a state wherein one of the units to be processed hierarchically contains another unit designed independently, wherein said test circuit production processing section includes a hierarchical layer matching restoration section to eliminate terminal mismatching between a terminal added to receive a test signal input in a lower hierarchical layer and a terminal in the layer referred to by a higher hierarchical layer.

14. A circuit designing apparatus, comprising:

a circuit information database to store information regarding a circuit;

a designing processing section to read out the information regarding the circuit from said circuit information database and to design the circuit for each predetermined unit to be processed; and a design information database to store design information, obtained by said designing processing section, including at least peculiarizing information of circuit elements, change history information representative of a history of changes of the circuit and terminal load and driving capacity information of the circuit;

said designing processing section including:

a peculiarizing processing section to read out the peculiarizing information from said design information database and apply different names with each other to the individual units to be processed;

a test circuit production processing section to read out the change history information from said design information database and to produce a test circuit of a higher hierarchical layer; and a load adjustment processing section to read out the terminal load and driving capacity information from said design information database, to apply the design information to terminals including in a circuit of the higher hierarchical layer and to adjust the load based on the design information; and at least one of said peculiarizing processing section, test circuit production processing section and load adjustment processing section performs hierarchical design wherein the circuit is designed in a state wherein one of the units to be processed hierarchically contains another unit designed independently, wherein at least one of said peculiarizing processing section, test circuit perduction processing section and load adjustment processing section performs engineering changes order design wherein some of the units to be processed are changed while the other units of the circuit are not changed to proceed with re-designing, wherein said peculiarizing processing section includes, in order to duplicate, when the higher hierarchical layer refers to the design information, the unit to be processed by a number of times equal to the number of times by which the design information is referred to and apply a peculiar name to each of the units to be processed obtained by the duplication, a processing object discrimination section to discriminate based on the design information written in said design information database whether the unit to be processed is an object of processing, and a peculiar name production section to produce, when said processing object discrimination section discriminates that the unit to be processed is an object of processing, a peculiar name to establish a reference relationship same as the reference relationship stored in said design information database, but producing, when said processing object discrimination section discriminates that the unit to be processed is not an object of processing, a peculiar name different from the peculiar names allocated already.

15. A circuit designing apparatus, comprising:

a circuit information database to store information regarding a circuit;

a designing processing section to read out the information regarding the circuit from said circuit information database and to design the circuit for each predetermined unit to be processed; and a design information database to store design information, obtained by said designing processing section, including the at least peculiarizing information of circuit elements, change history information representative of a history of changes of the circuit and terminal load and driving capacity information of the circuit;

said designing processing section including:

a peculiarizing processing section to read out the peculiarizing information from said design information database and apply different names with each other to the individual units to be processed;

a test circuit production processing section to read out the change history information from said design information database and to produce a test circuit of a higher hierarchical layer; and a load adjustment processing section to read out the terminal load and driving capacity information from said design information database, to apply the design information to terminals including in a circuit of the higher hierarchical layer and to adjust the load based on the design information; and wherein at least one of said peculiarizing processing section, test circuit production processing section and load adjustment processing section performs engineering change order design wherein some of the units to be processed are changed while the other units of the circuit are not changed to proceed with re-designing, wherein said test circuit production processing section includes a circuit a analysis section to use the predetermined design information produced upon predetermined design with regard to an engineering change order design object unit and the test circuit rule based on said design information database to extract identification data for identification of a portion with regard to which a test circuit that corresponds to a predetermined design to be produced and another portion with regard to which a new test circuit should be produced.

16. A circuit designing apparatus, comprising:

a circuit information database to store information regarding a circuit;

a designing processing section to read out the information regarding the circuit from said circuit information database and to design the circuit for each predetermined unit to be processed; and a design information database to store design information, obtained by said designing processing section, including the at least peculiarizing information of circuit elements, change history information representative of a history of changes of the circuit and terminal load and driving capacity information of the circuit;

said designing processing section including:

a peculiarizing processing section to read out the peculiarizing information from said design information database and apply different names with each other to the individual units to be processed;

a test circuit production processing section to read out the change history information from said design information database and to produce a test circuit of a higher hierarchical layer; and a load adjustment processing section to read out the terminal load and driving capacity information from said design information database, to apply the design information to terminals including in a circuit of the higher hierarchical layer and to adjust the load based on the design information; and wherein at least one of said peculiarizing processing section, test circuit production processing section and load adjustment processing section performs engineering change order design wherein some of the units to be processed are changed while the other units of the circuit are not changed to proceed with re-designing, wherein said test circuit production processing section includes a hierarchical layer matching restoration section to eliminate terminal mismatching between a terminal added to receive a test signal input in a lower hierarchical layer and a terminal in the layer referred to by a higher hierarchical layer, and said hierarchical layer matching restoration section uses the predetermined design information regarding predetermined design and the terminal information of the engineering chain order design object unit and the higher hierarchical layer from within the design information to restore the hierarchical layer matching.

17. A circuit designing apparatus, comprising:

a circuit information database to store information regarding a circuit;

a designing processing section to read out the information regarding the circuit from said circuit information database and to design the circuit for each predetermined unit to be processed; and a design information database to store design information, obtained by said designing processing section, including the at least peculiarizing information of circuit elements, change history information representative of a history of changes of the circuit and terminal load and driving capacity information of the circuit;

said designing processing section including:

a peculiarizing processing section to read out the peculiarizing information from said design information database and apply different names with each other to the individual units to be processed;

a test circuit production processing section to read out the change history information from said design information database and to produce a test circuit of a higher hierarchical layer; and a load adjustment processing section to read out the terminal load and driving capacity information from said design information database, to apply the design information to terminals including in a circuit of the higher hierarchical layer and to adjust the load based on the design information; and wherein at least one of said peculiarizing processing section, test circuit production processing section and load adjustment processing section performs engineering change order design wherein some of the units to be processed are changed while the other units of the circuit are not changed to proceed with re-designing, wherein said test circuit production processing section includes a circuit analysis section to use predetermined design information produced upon a predetermined design with reagard to an engineering change order design object unit and the test circuit rule based on said design information database to extract identification data for identification of a portion with regard to which a test circuit that corresponds to a predetermined design can be produced and another portion with regard to which a new test circuit should be produced, wherein said test circuit production processing section further includes a test circuit production section to produce a test circuit which is the same in regard to a portion of the engineering change order design object unit with regard to which a test circuit that corresponds to the predetermined design to be produced based on the identification data extracted by said circuit analysis section, but producing a test circuit conforming to the test circuit rule with regard to another portion of the engineering change order design object unit with regard to which a new test circuit should be produced.

18. A circuit designing apparatus, comprising:

a circuit information database to store information regarding a circuit;

a designing processing section to read out the information regarding the circuit from said circuit information database and to design the circuit for each predetermined unit to be processed; and a design information database to store design information, obtained by said designing processing section, including the at least peculiarizing information of circuit elements, change history information representative of a history of changes of the circuit and terminal load and driving capacity information of the circuit;

said designing processing section including:
 a peculiarizing processing section to read out the peculiarizing information from said design information database and apply different names with each other to the individual units to be processed;
 a test circuit production processing section to read out the change history information from said design information database and to produce a test circuit of a higher hierarchical layer; and
 a load adjustment processing section to read out the terminal load and driving capacity information from said design information database, to apply the design information to terminals including in a circuit of the higher hierarchical layer and to adjust the load based on the design information;

wherein said peculiarizing processing section further includes a design information read-in section to read out the design information from said design information database, and said design information read-in section makes the hierarchical layer names before the peculiarizing and the hierarchical layer names after the peculiarizing correspond to each other so as to allow the circuit data after the peculiarizing to be referred to with the hierarchical layer names before the peculiarizing.

19. A circuit designing apparatus, comprising:

a circuit information database to store information regarding a circuit;

a designing processing section to read out the information regarding the circuit from said circuit information database and to design the circuit for each predetermined unit to be processed; and a design information database to store design information, obtained by said designing processing section, including the at least peculiarizing information of circuit elements, change history information representative of a history of changes of the circuit and terminal load and driving capacity information of the circuit;

said designing processing section including:
 a peculiarizing processing section to read out the peculiarizing information from said design information database and apply different names with each other to the individual units to be processed;
 a test circuit production processing section to read out the change history information from said design information database and to produce a test circuit of a higher hierarchical layer; and
 a load adjustment processing section to read out the terminal load and driving capacity information from said design information database, to apply the design information to terminals including in a circuit of the higher hierarchical layer and to adjust the load based on the design information;

wherein said load adjustment processing section includes:

a load analysis section to analyze a terminal capacity to be driven by a logic element to extract an undrivable terminal or terminals; and a circuit adjustment section to adjust the driving capacity of the undrivable terminal or terminals extracted by said load analysis section.

20. A circuit designing method, comprising:

a processing production operation of producing, by means of a designing processing section to read out information regarding a circuit from a circuit information database which stores information regarding the circuit and designing the circuit for each predetermined unit to be processed, first unit information obtained by processing the first unit, wherein the first unit information relates to a processing result of a first unit a design information collection operation of collecting design information including at least peculiarizing information of circuit elements, the design information being produced in the processing production operation, change history information representative of a history of changes of the circuit and terminal load and driving capacity information of the circuit with a processing object discrimination section to discriminate based on the design information written in said design information database, through a design information reading-in section to read in design information written in said design information database, whether the unit to be processed is an object of the processing, and discriminates a location of an object to be processed readily based on a parameter input by a designer and the peculiarizing information obtained form said design information reading-in section, wherein said processing object discrimination section discriminates whether the design information regarding a unit being currently processed is written is said design information database;

a design information writing operation of writing the design information collected in the design information collection operation for each unit to be processed into a design information database connected to said design processing section to store the design information;

a reference operation of referring to the design information regarding the first unit in order to process a second unit based on the design information written in the design information writing operation;

a recognition operation of recognizing a reference relationship regarding the design information relating to the first unit referred to in the reference operation;

a circuit information database reference operation of referring to selected unit information regarding a position and a result of the processing stored in said circuit information database based on the reference relationship obtained in the reference operation; and a circuit information database writing operation of updating the circuit data obtained in the circuit designing operations.

21. A circuit designing method, comprising:

a first processing operation of processing a first unit which contains a second unit by means of a designing processing section to read out information regarding a circuit from a circuit information database which stores information regarding the circuit and designing the circuit for each predetermined unit to be processed;

a second unit information collection operation of collecting second unit information regarding a processing result of the second unit being produced in the first processing operation;

a design information writing operation of writing the second unit information collected in the second unit information collection operation into a design information database connected to said design processing section to store the design information; and a discrimination operation of discriminating, based on the second unit information written in the design information writing operation, whether a second processed unit obtained by changing the second unit contains a first processed unit obtained by changing the first unit and discriminating whether the second processed unit is equivalent to the second unit.

22. A computer-readable recording medium on which a program is recorded, the program causing a computer to function to read out information regarding a circuit from a circuit information database in which the information regarding the circuit is stored and design the circuit for each predetermined unit to be processed and then store design information obtained by the design and including at least peculiarizing information of a circuit element, change history information representative of a history of changes of the circuit and terminal load and driving capacity information of the circuit; and includes:

a peculiarizing processing section to read out the peculiarizing information from said design information database and apply different names with each other to the individual units to be processed;

a test circuit production processing section to read out the change history information from said design information database and to produce a test circuit of a higher hierarchical layer; and a load adjustment processing section to read out the terminal load and driving capacity information from said design information database, to apply the design information to terminals including in a circuit of the higher hierarchical layer and to adjust the load based on the design information; and at least one of said peculiarizing processing section, test circuit production processing section and load adjustment processing section performs hierarchical design wherein the circuit is designed in a state wherein one of the units to be processed hierarchically contains another unit designed independently, and includes:

a processing object discrimination section to discriminate, when the higher hierarchical layer is to be processed, whether the unit to be processed is an object of processing based on the design information written in said design information database; and a processing data acquisition section to acquire circuit data of the unit to be processed from said circuit information database based on a discrimination by said processing object discrimination section of where the unit is to be processed is an object processed.

23. A computer-readable recording medium on which a program is recorded, the program causing a computer to function to execute:

a processing production operation of producing, by means of a designing processing section to read out information regarding a circuit from a circuit information database which stores information regarding the circuit and designing the circuit for each predetermined unit to be processed, first unit information obtained by processing the first unit, wherein the first unit information relates to a processing result of a first unit;

a design information collection operation of collecting design information including at least peculiarizing information of circuit elements being produced in the processing production operation, change history information representative of a history of changes of the circuit and terminal load and driving capacity information of the circuit with a processing object discrimination section to discriminate based on the design information written in said design information database, through a design information reading-in section to read in design information written in said design information database, where the unit to be processed is an object of the processing, and discriminates a location of an object of the to be processed readily based on a parameter inputted by a designer and the peculiarizing information obtained from said design information reading-in section, wherein said processing object discrimination section discriminates whether the design information regarding a unit being currently processed is written in said design information database;

a design information writing operation of writing the design information collected in the design information collection operation for each unit to be processed into a design information database connected to said design processing section to store the design information;

a reference operation of referring to the design information regarding the first unit in order to process a second unit based on the design information written in the design information writing operation;

a recognition operation of recognizing a reference relationship regarding the design information relating to the first unit referred to in the reference operation;

a circuit information database reference operation of referring to selected unit information regarding a position and a result of the processing stored in said circuit information database based on the reference relationship obtained in the reference operation; and a circuit information database writing operation of updating the circuit data obtained in the operations executed by the program.

24. A computer-readable recording medium on which a program is recorded, the program causing a computer to function so as to execute:

a first processing operation of reading out information regarding a circuit from a circuit information database which stores information regarding the circuit and processing a first unit which contains a second unit by means of a designing processing section to design the circuit for each predetermined unit to be processed;

a second unit information collection operation of collecting second unit information regarding a processing result of the second unit being produced in the first processing operation;

a design information writing operation of writing the second unit information collected in the third unit information collection operation into a design information database connected to said design processing section to store the design information; and a discrimination operation of discriminating, based on the second unit information written in the design information writing operation, whether a second processed unit obtained by changing the second unit contains a first processed unit obtained by changing the first unit and discriminating whether the second processed unit is equivalent to the second unit.

25. A method to design a circuit, comprising:

storing information regarding a circuit in a circuit information database;

reading out in a designing processing section, the information regarding the circuit from said circuit information database and designing the circuit for each predetermined unit to be processed; and storing, in a design information database, design information, obtained by said designing processing section, including at least peculiarizing information of circuit elements, change history information representative of a history of changes of the circuit and terminal load and driving capacity information of the circuit, including:

performing hierarchical design during one of: reading out peculiarizing information from said design information database and applying different names to the individual units to be processed, producing a test circuit of a higher hierarchical layer based on change history information, and adjusting a load based on terminal load and driving capacity information in the design information, wherein one of the units to be processed hierarchically contains another unit designed independently, and setting a peculiar name application rule in accordance with which a peculiar name should be applied to each of the units to be processed based on a parameter regarding the names of the circuit elements based on said design information database and producing a peculiar name different from the peculiar names applied to the units which are processed already.

* * * * *